(12) United States Patent
Shimizu

(10) Patent No.: US 8,739,109 B2
(45) Date of Patent: May 27, 2014

(54) DEVELOPMENT SUPPORT APPARATUS OF SEMICONDUCTOR DEVICE, DEVELOPMENT SUPPORT METHOD, AND DEVELOPMENT SUPPORT PROGRAM PRODUCT

(71) Applicant: Renesas Electronics Corporation, Kawasaki (JP)

(72) Inventor: Yuji Shimizu, Tokyo (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/665,617

(22) Filed: Oct. 31, 2012

(65) Prior Publication Data
US 2013/0125085 A1 May 16, 2013

(30) Foreign Application Priority Data
Nov. 15, 2011 (JP) .................................. 2011-250101

(51) Int. Cl.
*G06F 17/50* (2006.01)
(52) U.S. Cl.
USPC .......................................... 716/139; 716/101

(58) Field of Classification Search
USPC .......................................... 716/100–104, 139
See application file for complete search history.

(56) References Cited

U.S. PATENT DOCUMENTS 8,286,125 B2 * 10/2012 McDonald et al. ........... 716/138
2008/0158178 A1 * 7/2008 Hotelling et al. ............. 345/173

FOREIGN PATENT DOCUMENTS

JP          10-320684 A          12/1998

* cited by examiner

*Primary Examiner* — Binh Tat
(74) *Attorney, Agent, or Firm* — McGinn IP Law Group, PLLC

(57) ABSTRACT

Disclosed is a development support apparatus of a semiconductor device that makes it possible to easily develop the semiconductor device, a development support method, and a program product. A design evaluation apparatus is a design evaluation apparatus having an analog front-end unit for inputting a measurement signal of a sensor and an MCU unit, which has a GUI processing unit for displaying a GUI corresponding to a circuit configuration of the analog front-end unit and a register setting unit that generates setting information for setting up the circuit configuration and a circuit characteristic of the analog front-end unit based on an operation of the GUI by a user, and sets the generated setting information in the analog front-end unit through the MCU unit.

23 Claims, 54 Drawing Sheets

| Count | Ch2 | Ch3 | Ch4 | Ch5 | Ch6 | Ch7 | Ch16 | Ch17 | Ch19 |
|---|---|---|---|---|---|---|---|---|---|
| 1 |  | 511 |  |  |  |  |  |  |  |
| 2 |  | 510 |  |  |  |  |  |  |  |
| 3 |  | 511 |  |  |  |  |  |  |  |
| 4 |  | 511 |  |  |  |  |  |  |  |
| 5 |  | 511 |  |  |  |  |  |  |  |
| 6 |  | 511 |  |  |  |  |  |  |  |
| 7 |  | 510 |  |  |  |  |  |  |  |
| 8 |  | 511 |  |  |  |  |  |  |  |
| 9 |  | 510 |  |  |  |  |  |  |  |
| 10 |  | 510 |  |  |  |  |  |  |  |
| 11 |  | 511 |  |  |  |  |  |  |  |
| 12 |  | 511 |  |  |  |  |  |  |  |
| 13 |  | 510 |  |  |  |  |  |  |  |
| 14 |  | 510 |  |  |  |  |  |  |  |
| 15 |  | 510 |  |  |  |  |  |  |  |
| 16 |  | 510 |  |  |  |  |  |  |  |
| 17 |  | 511 |  |  |  |  |  |  |  |
| 18 |  | 511 |  |  |  |  |  |  |  |
| 19 |  | 510 |  |  |  |  |  |  |  |

Port_data

File　EDIT (E)　VIEW (V)

FIG. 41

| Count | Ch2 | Ch3 | Ch4 | V | DECIMAL | 6 | Ch17 | Ch19 |
|---|---|---|---|---|---|---|---|---|
| 1 | | 511 | | | HEXADECIMAL | | | |
| 2 | | 510 | | | AUTOMATIC SCROLL | | | |
| 3 | | 511 | | | | | | |
| 4 | | 511 | | | | | | |
| 5 | | 511 | | | | | | |
| 6 | | 511 | | | | | | |
| 7 | | 510 | | | | | | |
| 8 | | 511 | | | | | | |
| 9 | | 510 | | | | | | |
| 10 | | 510 | | | | | | |
| 11 | | 511 | | | | | | |
| 12 | | 511 | | | | | | |
| 13 | | 510 | | | | | | |
| 14 | | 510 | | | | | | |
| 15 | | 510 | | | | | | |
| 16 | | 510 | | | | | | |
| 17 | | 511 | | | | | | |
| 18 | | 511 | | | | | | |
| 19 | | 510 | | | | | | |

DEVELOPMENT SUPPORT APPARATUS OF SEMICONDUCTOR DEVICE, DEVELOPMENT SUPPORT METHOD, AND DEVELOPMENT SUPPORT PROGRAM PRODUCT

CROSS-REFERENCE TO RELATED APPLICATION

The disclosure of Japanese Patent Application No. 2011-250101 filed on Nov. 15, 2011 including the specification, drawings and abstract is incorporated herein by reference in its entirety.

BACKGROUND

The present invention relates to a development support apparatus, a development support method, and a development support program product of a semiconductor device, and more specifically, to a development support apparatus, a development support method, and a development support program product of a semiconductor device that has an analog front-end circuit.

In recent years, mounting a sensor is progressing on various apparatuses including these of public welfare, industry, and medical care because of improvement in user-friendliness, expansion of an ecosystem, penetration of health care, and strengthening of security. As its background, there can be enumerated that improvement in ease of use as a sensor device and a low voltage and low power operation inevitable to realize the sensor have been progressed, and therefore miniaturization of the system and reduction in cost have become possible. There are various kinds of sensors, such as a temperature sensor, an infrared sensor, an optical sensor, and an impact sensor, and it is commonly done to form a circuit for processing a sensor signal according to each of their operating principles and to set up its characteristic.

In such apparatuses, a control unit of a microcomputer is performing a control processing according to a measurement result of the sensor. Since a measurement signal outputted from the sensor, as it is, cannot be processed in the control unit of the microcomputer, it is amplified to a constant level by an analog front-end (AFE) circuit and is subjected to an analog front-end processing such as elimination of noises before being inputted into the microcomputer. Since this analog front-end processing needs a design that matches an operation principle and a characteristic of the sensor and requires a design know-how peculiar to analog circuitry, customarily, an exclusive AFE (Analog Front End) circuit and an exclusive IC for a specific sensor have been developed after narrowing down the operation principle and characteristic of a sensor that was set as an objective.

As a conventional AFE circuit, for example, a circuit of Japanese Unexamined Patent Publication No. Hei 10(1998)-320684 is known. FIG. 55 shows a conventional circuit configuration described in Japanese Unexamined Patent Publication No. Hei 10(1998)-320684. This conventional circuit includes a sensor 903, an analog input circuit 911 that is an analog front-end circuit, and a microcomputer 910.

The analog input circuit 911 has a transformer for inputting a signal from the sensor, a filter 921 for passing only a signal component of a specific frequency, an amplifier circuit 922 for amplifying an output of the filter 921, an A/D converter 923 for A/D converting an output of the amplifier circuit 922, and a comparator circuit 924 for comparing the output of the amplifier circuit 922 with a reference voltage.

The microcomputer 910 processes the digital signal outputted from the A/D converter 923, and performs a processing according to detection of the sensor 903. Moreover, the microcomputer 910 outputs a control signal to the filter 921 to change a frequency characteristic of the filter 921.

SUMMARY

Thus, the conventional technology makes it possible for a characteristic of a filter 921 of an analog input circuit 911 to be changed by a control from a microcomputer 910. On the other hand, as described above, sensor systems carrying sensors are increasing in number in recent years, and it is desired to develop a semiconductor device of an analog circuit in a short period of time for a timely projection into a market.

However, since there are various kinds of sensors, such as a temperature sensor, an infrared sensor, an optical sensor, and an impact sensor, and different circuit configuration and circuit characteristic need to be prepared according to a sensor, it is difficult to develop semiconductor devices corresponding to various sensors in a short period of time.

Therefore, the conventional technology had a problem that it was difficult to develop the semiconductor device easily.

A development support apparatus of a semiconductor device according to the present invention is a development support apparatus of a semiconductor device that has an analog front-end unit for inputting a measurement signal of the sensor and a control unit for performing a control processing according to the measurement signal through the analog front-end unit, including: a GUI display unit for displaying a GUI corresponding to a circuit configuration of the analog front-end unit; a setting information generation unit for generating the circuit configuration and a circuit characteristic of the analog front-end unit based on an operation of the GUI by a user; and a setting unit for setting up the generated setting information in the analog front-end unit through the control unit.

The development support method of a semiconductor device according to the present invention is a development support method of a semiconductor device that has an analog front-end unit for inputting a measurement signal of a sensor and a control unit for performing a control processing according to the measurement signal through the analog front-end unit, and has the steps of: displaying a GUI corresponding to the circuit configuration of the analog front-end unit; generating setting information for setting up the circuit configuration and the circuit characteristic of the analog front-end unit based on an operation of the GUI by the user; and setting up the generated setting information in the analog front-end unit through the control unit.

A computer readable medium storing a development support program of a semiconductor device according to the present invention is a development support program product of a semiconductor device that makes a computer perform a development support processing of the semiconductor device having an analog front-end unit for inputting the measurement signal of the sensor and a control unit for performing a control processing according to the measurement signal through the analog front-end unit, in which the development support processing of the semiconductor device has the steps of: displaying a GUI corresponding to the circuit configuration of the analog front-end unit; generating setting information for setting up the circuit configuration and the circuit characteristic of the analog front-end unit based on an operation of the GUI by the user; and setting up the generated setting information in the analog front-end unit through the control unit.

In the present invention, since the circuit configuration and the circuit characteristic of the analog front-end unit are set up through the GUI corresponding to the circuit configuration of the analog front-end unit of the semiconductor device, the user can change the circuit configuration and the circuit characteristic by an intuitive operation; therefore, the semiconductor device can be developed easily.

According to the present invention, it is possible to provide a development support apparatus of a semiconductor device with which the semiconductor device can be easily developed, a development support method, and a development support program product.

BRIEF DESCRIPTION OF THE DRAWINGS

FIG. 39 is a display image diagram of the GUI used in the setting evaluation of the semiconductor device according to the first embodiment of the present invention;

FIG. 40 is a display image diagram of the GUI used in the setting evaluation of the semiconductor device according to the first embodiment of the present invention;

FIG. 41 is a display image diagram of the GUI used in the setting evaluation of the semiconductor device according to the first embodiment of the present invention;

DETAILED DESCRIPTION

First Embodiment of Present Invention

Figure 1:
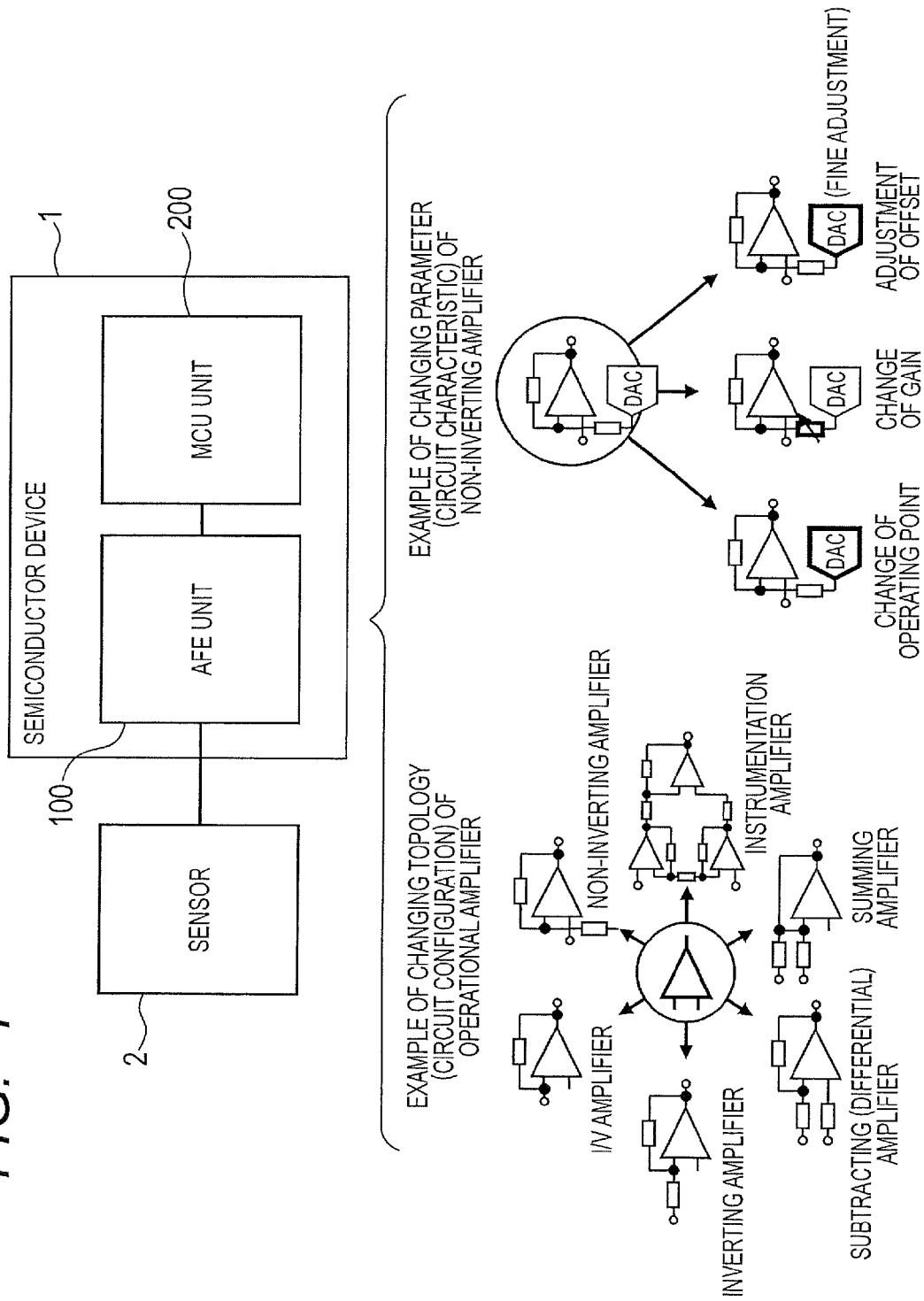
FIG. 1 is a block diagram of a sensor system according to a first embodiment of the present invention.

Hereinafter, a first embodiment of the present invention will be described with reference to drawings. FIG. 1 shows a configuration of a sensor system containing a semiconductor device according to this embodiment.

As shown in FIG. 1, this sensor system has a sensor 2 and a semiconductor device 1 coupled to the sensor 2.

As the sensor 2, various sensors is usable: a current output type sensor for outputting a current according to a detection result, a voltage output type sensor for outputting a voltage according to a detection result, a sensor for outputting a differential signal according to a detection result. Incidentally, application examples of sensors will be described later.

The semiconductor device 1 has an MCU unit 200 and an AFE unit 100. For example, the semiconductor device 1 is an SoC (System-on-a-chip) that carries a semiconductor chip of the MCU unit 200 and a semiconductor chip of the AFE unit 100 on a single semiconductor device. Incidentally, it is also all right to fabricate the MCU unit 200 and the AFE unit 100 to be a single-chip semiconductor device.

The MCU unit (control unit) 200 is a microcontroller that A/D converts a measurement signal (detection signal) of the sensor 2 inputted through the AFE unit 100 and performs a control processing according to the detection result. Moreover, the MCU unit 200 outputs a control signal for changing a configuration and a characteristic of the AFE unit 100 to the AFE unit 100.

The AFE unit (analog input unit) 100 is an analog circuit that performs an analog-front-end processing of amplification, filtering on the measurement signal outputted from the sensor 2 and converts it into a signal that the MCU unit 200 can process. Moreover, in the AFE unit 100, as shown in FIG. 1, its topology (circuit configuration) is changeable, and its parameter (circuit characteristic) is also changeable.

Like the example of the figure, a configuration of the operational amplifier circuit can be changed to a configuration of an I/V amplifier, a subtracting (differential) amplifier, a summing amplifier, an inverting amplifier, a non-inverting amplifier, or an instrumentation amplifier. Moreover, like an example of a parameter of the non-inverting amplifier, a change of its operating point, a change of its gain, and adjustment of its offset can be performed.

Figure 2:
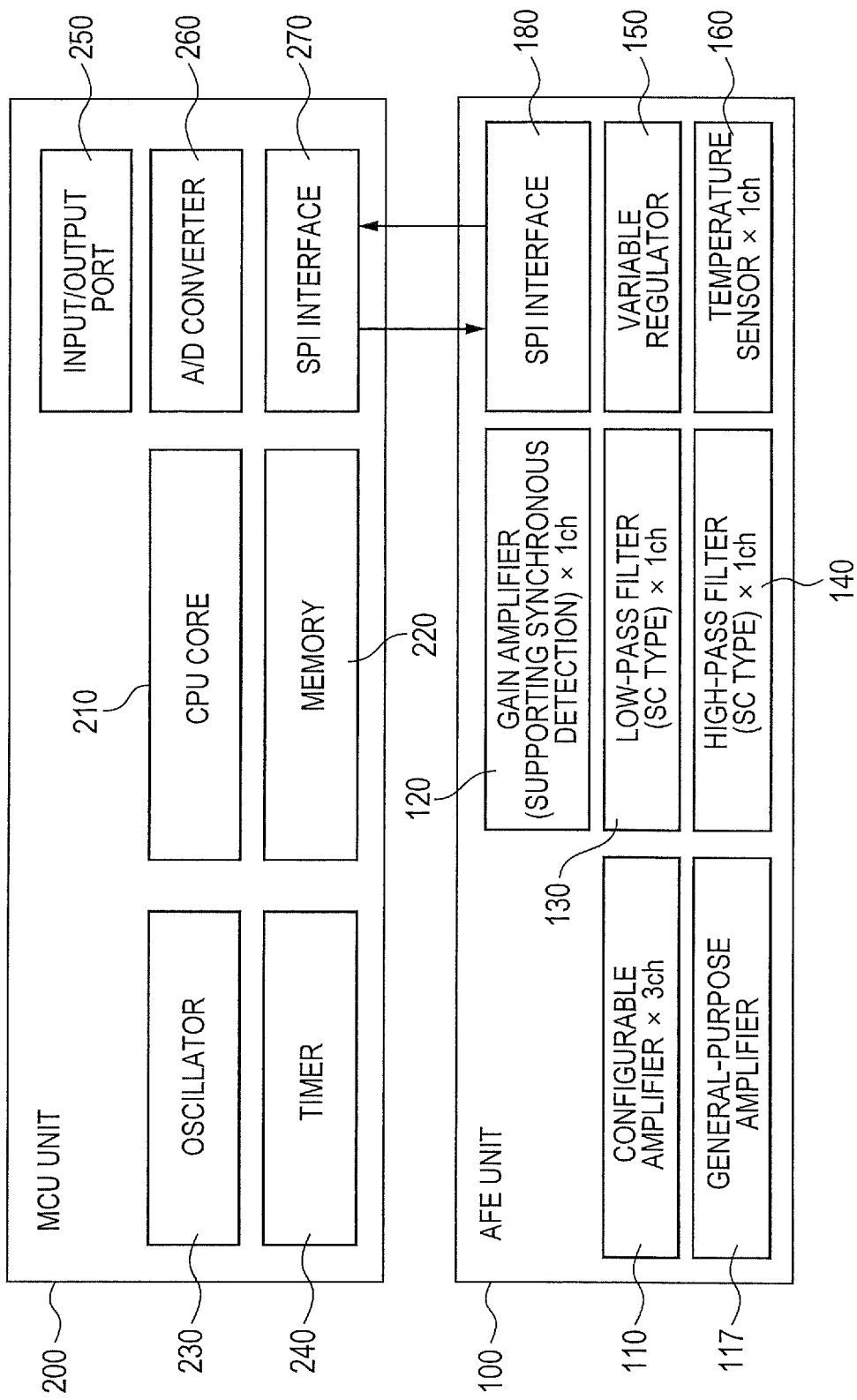
FIG. 2 is a circuit block diagram of a semiconductor device according to the first embodiment of the present invention.

FIG. 2 shows a circuit block of the semiconductor device 1. As shown in FIG. 2, the MCU unit 200 has a CPU core 210, memory 220, an oscillator 230, a timer 240, an input/output port 250, an A/D converter 260, and an SPI (Serial Peripheral Interface) interface 270. Incidentally, the MCU unit 200 has other circuits for realizing functions of the microcontroller, for example, a DMA, and various arithmetic circuits.

The CPU core 210 runs the program stored in the memory 220 and performs a control processing following the program. The memory 220 stores the program to be executed by the CPU core 210 and various pieces of data. The oscillator 230 generates an operating clock of the MCU unit 200, and supplies the clock to the AFE unit 100 as needed. The timer 240 is used for a control action of the MCU unit 200.

The input/output port 250 is an interface for outputting and inputting data to/from a device outside the semiconductor device 1 and, for example, can be coupled with an external computer apparatus as will be described later.

The A/D converter 260 A/D converts a measurement signal of the sensor 2 inputted through the AFE unit 100. Moreover, a power supply of the A/D converter 260 is supplied from the AFE unit 100.

The SPI (Serial Peripheral Interface) interface 270 is an interface for inputting and outputting data to/from the AFE unit 100. Incidentally, the SPI interface 270 is a general purpose serial interface, and coupling with the AFE unit 100 can be established even with an other microcontroller/microcomputer provided that it supports the SPI.

The semiconductor device 1 of this embodiment is configured to be able to support a general purpose use. Specifically, it carries a set of AFE circuits for sensors so that sensors of various kinds and characteristics can be coupled thereto. That is, the AFE unit 100 has a configurable amplifier 110, a gain amplifier supporting synchronous detection (also called a gain amplifier) 120, an SC-type low-pass filter (also called a low-pass filter) 130, an SC-type high-pass filter (also called a high-pass filter) 140, a variable regulator 150, a temperature sensor 160, a general purpose amplifier 170, and an SPI interface 180.

The configurable amplifier 110 is an amplifier for amplifying a signal inputted from the outside, such as the sensor 2, whose circuit configuration, circuit characteristic, and operation can be set up according to a control of the MCU unit 200.

The configurable amplifier 110 has three-channel amplifiers, i.e., three amplifiers. A lot of circuit configurations are realizable with these three amplifiers.

The gain amplifier 120 is an amplifier supporting the synchronous detection that amplifies an output of the configurable amplifier 110 and the signal inputted from the outside, such as the sensor 2, whose characteristic and operation can be set up according to the control of the MCU unit 200.

The low-pass filter 130 is an SC-type filter that eliminates high frequency components from outputs of the configurable amplifier 110 and the gain amplifier 120, and signals inputted from the outside, such as the sensor 2, and passes low frequency components, whose characteristic and operation can be setup according to the control of the MCU unit 200. The high-pass filter 140 is an SC-type filter that eliminates low frequency components from outputs of the configurable amplifier 110 and the gain amplifier 120 and the signal inputted from the outside, such as the sensor 2, and passes high frequency components, whose characteristic and operation can be set up according to the control of the MCU unit 200.

The variable regulator 150 is a variable voltage source for supplying a voltage to the A/D converter 260 of the MCU unit 200, whose characteristic and operation can be set up according to the control of the MCU unit 200. The temperature sensor 160 is a sensor for measuring a temperature of the semiconductor device 1, whose operation can be set up according to the control of the MCU unit 200.

The general purpose amplifier 170 is an amplifier for amplifying the signal inputted from the outside, such as the sensor 2, whose operation can be set up according to the control of the MCU unit 200. The SPI interface 180 is an interface for inputting and outputting data to/from the MCU unit 200, and is coupled with the SPI interface 270 of the MCU unit 200 through an SPI bus.

Figure 3:
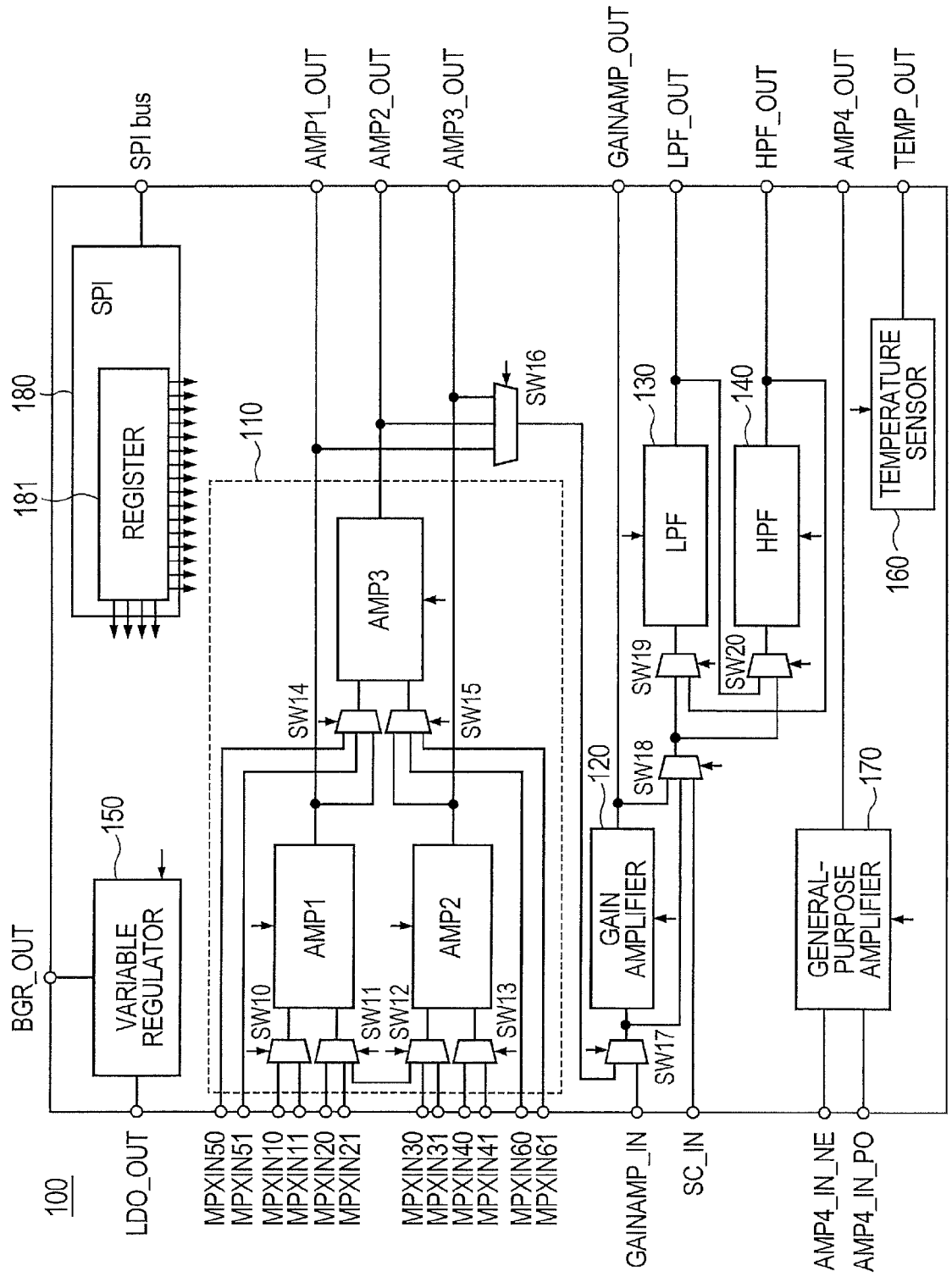
FIG. 3 is a diagram showing a coupling relationship of a circuit of the semiconductor device according to the first embodiment of the present invention.

Next, a configuration of the AFE unit 100 of the semiconductor device 1 according to this embodiment will be explained in detail. FIG. 3 shows a coupling relationship of circuits of the AFE unit 100. The SPI interface 180 is coupled to an external terminal (CS, SCLK, SDO, SDI) coupled to the SPI bus, and has a register (control register) 181. Configuration information (setting information) for changing the configuration and characteristic of the circuit is inputted from the MCU unit 200 through the SPI interface, and is stored in the register 181. The register 181 is coupled to circuits in the AFE unit 100, and the configuration and characteristic of the each circuit in the AFE unit 100 are set up according to configuration information of the register 181.

The configurable amplifier 110 has individual amplifiers AMP1, AMP2, and AMP3, to which switches SW10 to SW15 each for switching over an input/output of the amplifier are coupled.

In the individual amplifier AMP1, one input terminal thereof is coupled to MPXIN10 or MPXIN11 through the switch SW10, the other input terminal thereof is coupled to MPXIN20 or MPXIN21 through the switch SW11, and its output terminal is coupled to AMP1_OUT. Similarly, in the individual amplifier AMP2, one input terminal thereof is coupled to MPXIN30 or MPXIN31 through the switch SW12, the other input terminal thereof is coupled to MPXIN40 or MPXIN41 through the switch SW13, and its output terminal is coupled to AMP2_OUT.

Moreover, in the individual amplifier AMP3, one input terminal thereof is coupled to MPXIN50, MPXIN51, or an output terminal of the AMP1 through the switch SW14, the other input terminal thereof is coupled to MPXIN60, MPXIN61, or an output terminal of the AMP2 through the switch SW15, and its output terminal is coupled to AMP3_OUT. The output terminals of the AMP1 to the AMP3 are also coupled to the gain amplifier 120, the low-pass filter 130, and the high-pass filter 140.

In the configurable amplifier 110, depending on a setting value of the register 181, the switches SW10 to SW15 are switched over, a coupling configuration of the AMP1 to the AMP3 is changed, and their internal circuit configurations and characteristics are also changed as will be described later.

Figure 4:
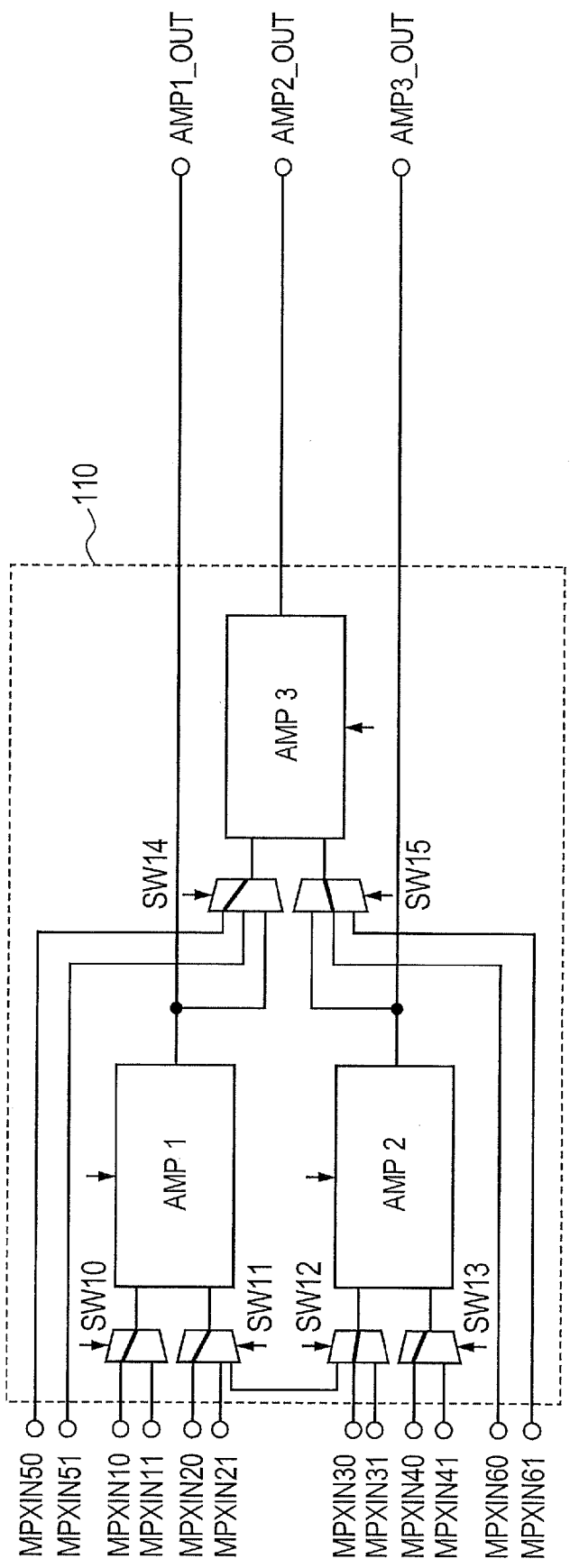
FIG. 4 is a diagram showing a coupling example of a circuit of the semiconductor device according to the first embodiment of the present invention.
Figure 5:
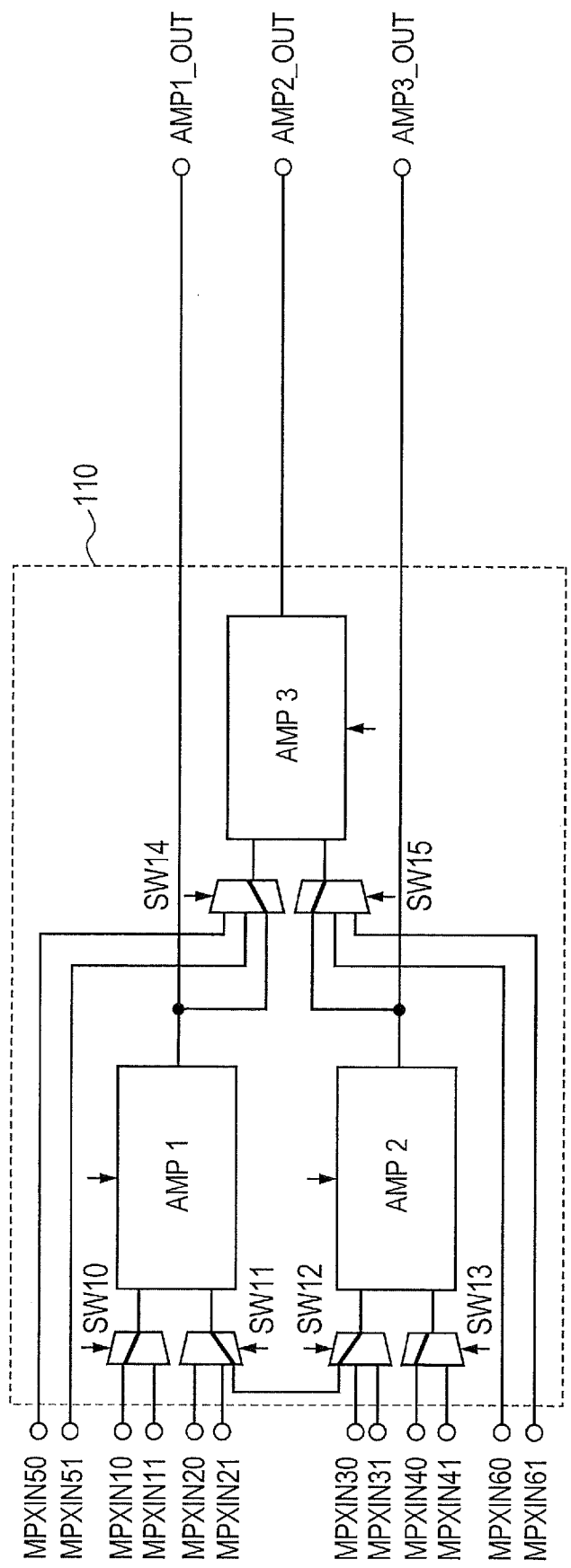
FIG. 5 is a diagram showing a coupling example of the circuit of the semiconductor device according to the first embodiment of the present invention.

FIG. 4 and FIG. 5 are examples of coupling switching of the AMP1 to the AMP3 by the switches SW10 to SW15. In FIG. 4, based on a setting of the register 181, by switching over the switches SW10, SW11, an input terminal of the AMP1 is coupled to the MPXIN10, the MPXIN20; by switching over the switches SW12, SW13, an input terminal of the AMP2 is coupled to the MPXIN30, the MPXIN40; and by switching over the switches SW14, SW15, an input terminal of the AMP3 is coupled to the MPXIN50, the MPXIN60. By establishing the coupling in this way, the AMP1, the AMP2, and the AMP3 can each be made to operate as a different independent amplifier.

In FIG. 5, based on the setting of the register 181, by switching over the switch SW10, one input terminal of the AMP1 is coupled to the MPXIN10; by switching over the switch SW12, one input terminal of the AMP2 is coupled to the MPXIN30; by switching over the switches SW11, SW12, the other input terminal of the AMP1 and the other input terminal of the AMP2 are coupled together; and by switching over the switches SW14, SW15, one input terminal of the AMP3 is coupled to the output terminal of the AMP1 and the other input terminal of the AMP3 is coupled to the output terminal of the AMP2. By establishing the coupling in this way, the instrumentation amplifier in which the AMP1 to the AMP3 are coupled to one another can be formed.

Moreover, as shown in FIG. 3, switches SW16, SW17 for switching over inputs are coupled to the gain amplifier 120. In the gain amplifier 120, its input terminal is coupled to output terminals of the AMP1 to the AMP3 through the switches SW16, SW17 or to GAINAMP_IN through the switch 17, and its output terminal is coupled to GAINAMP_OUT. An output terminal of the gain amplifier 120 is also coupled to the low-pass filter 130 and the high-pass filter 140.

Switches SW18, SW19 for switching over inputs are coupled to the low-pass filter 130; switches SW18, SW20 for switching over inputs are also coupled to the high-pass filter 140. In the low-pass filter 130, its input terminal is coupled to one of output terminals of the AMP1 to the AMP3, the output terminal of the gain amplifier 120, and SC_IN through the switches SW18, SW19 or to an output terminal of the high-pass filter 140 through the switch SW 19, and its output terminal is coupled to LPF_OUT. In the high-pass filter 140, its input terminal is coupled to one of the output terminals of the AMP1 to the AMP3, the output terminal of the gain amplifier 120, and the SC_IN through the switches SW18, SW19 or to an output terminal of the low-pass filter 130 through the SW19, and its output terminal is coupled to HPF_OUT.

Regarding the gain amplifier 120, the low-pass filter 130, and the high-pass filter 140, the switches SW16 to SW20 are switched over depending on the setting value of the register 181, a coupling configuration of the gain amplifier 120, the low-pass filter 130, and the high-pass filter 140 is changed, and their internal characteristics are also changed as will be described later.

Figure 6:
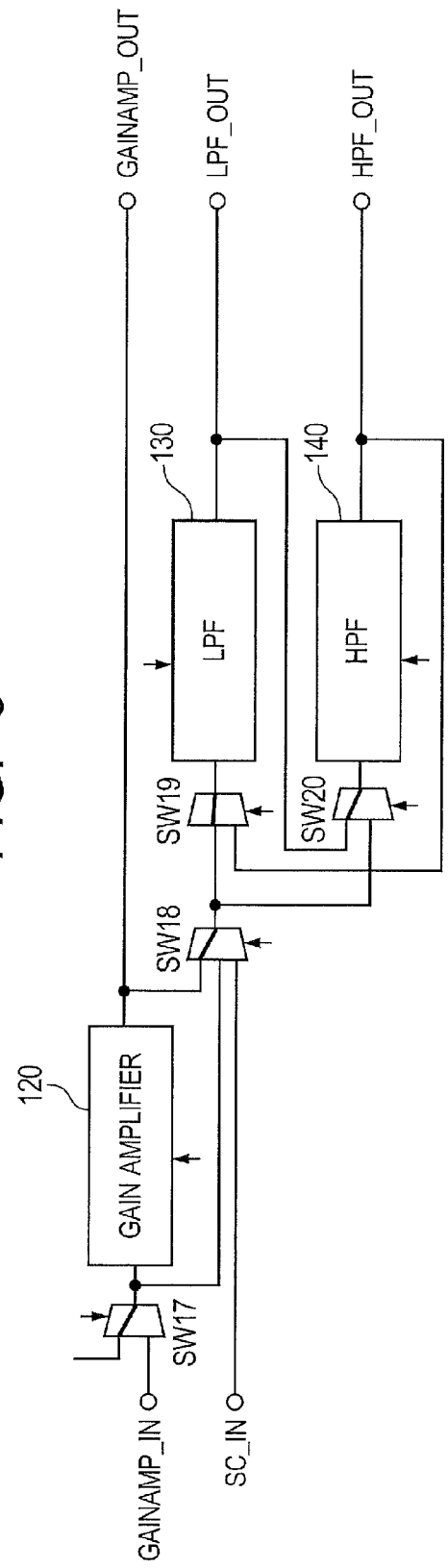
FIG. 6 is a diagram showing a coupling example of a circuit of the semiconductor device according to the first embodiment of the present invention.
Figure 7:
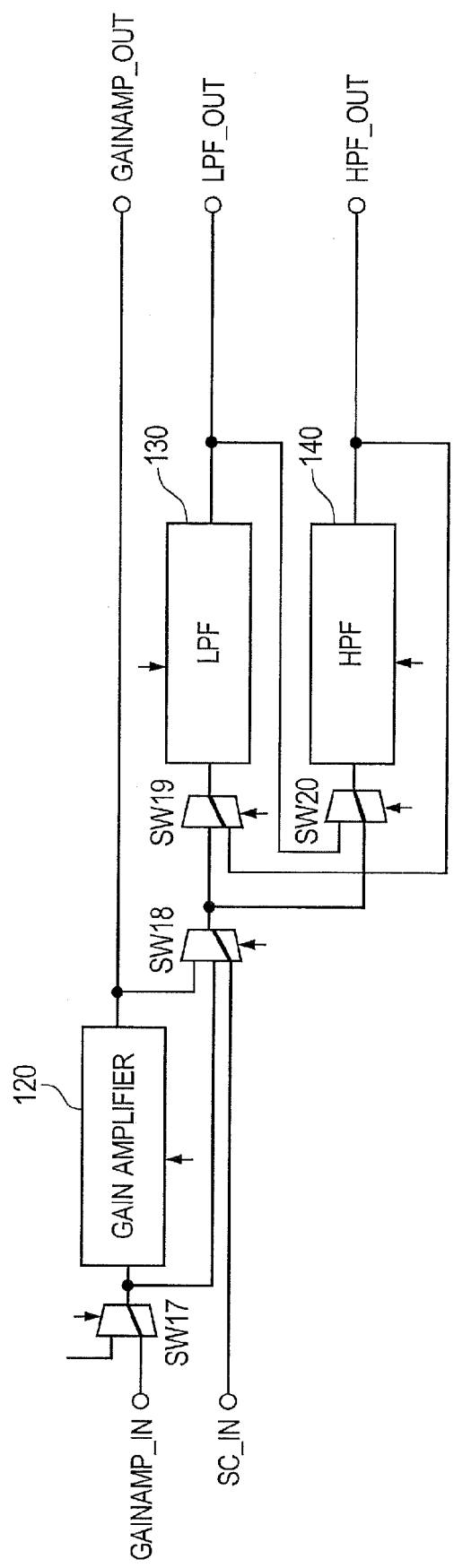
FIG. 7 is a diagram showing a coupling example of the circuit of the semiconductor device according to the first embodiment of the present invention.

FIG. 6 and FIG. 7 show an example of coupling switching of the gain amplifier 120, the low-pass filter 130, and the high-pass filter 140 by the switches SW17 to SW20. In FIG. 6, based on the setting of the register 181, an input terminal of the gain amplifier 120 is coupled to one of the output terminals of the AMP1 to the AMP3 by switching over the switch SW17, an input terminal of the low-pass filter 130 is coupled to the output terminal of the gain amplifier 120 by switching over the switches SW18, SW19, and an input terminal of the high-pass filter 140 is coupled to the output terminal of the low-pass filter 130 by switching over the switch SW20. By switching over the switches in this way, it is possible to form a circuit in which the gain amplifier 120, the low-pass filter 130, and the high-pass filter 140 are coupled in this order, each of which is any one of the AMP1 to the AMP3.

In FIG. 7, based on the setting of the register 181, the input terminal of the gain amplifier 120 is coupled to the GAIN-AMP_IN by switching over the switch SW17, the input terminal of the high-pass filter 140 is coupled to the SC_IN by switching over the switches SW18, SW20, and the input terminal of the low-pass filter 130 is coupled to the output terminal of the high-pass filter 140 by switching over the switch SW19. By switching over the switches in this way, it is possible to make the gain amplifier 120 operate as one independent amplifier, and to form a circuit in which the high-pass filter 140 and the low-pass filter 130 are coupled in this order.

Moreover, as shown in FIG. 3, an output terminal of the variable regulator 150 is coupled to BGR_OUT and LDO_OUT. A characteristic of the variable regulator is changed depending on the setting value of the register 181, as will be described later.

In the temperature sensor 160, its output terminal is coupled to TEMP_OUT. In the temperature sensor 160, its characteristic is changed depending on the setting value of the register 181 as will be described later.

In the general purpose amplifier 170, one input terminal thereof is coupled to AMP4_IN_NE, the other input terminal is coupled to AMP4_IN_PO, and an output terminal thereof is coupled to AMP4_OUT. The general purpose amplifier includes one operational amplifier. Its gain is changed depending on the setting value of the register 181, and ON/OFF of its power supply is also set.

Next, a specific circuit configuration of the configurable amplifier 110 will be explained using FIG. 8 to FIG. 14.

The configurable amplifier 110 is an amplifier for amplifying a sensor output signal, and is capable of changing its topology (circuit configuration) and changing its parameter (circuit characteristic) according to the setting of the control register. As a change of the characteristic, its gain can be set to be variable. For example, when using the individual amplifier independently, the gain can be set to 6 dB to 46 dB in 2 dB increments; when using it as the instrumentation amplifier, the gain can be set to 20 dB to 60 dB in 2 dB increments. Moreover, a slew rate can also be set to be variable and ON/OFF of the power supply can be switched over by a power-off mode.

Figure 8:
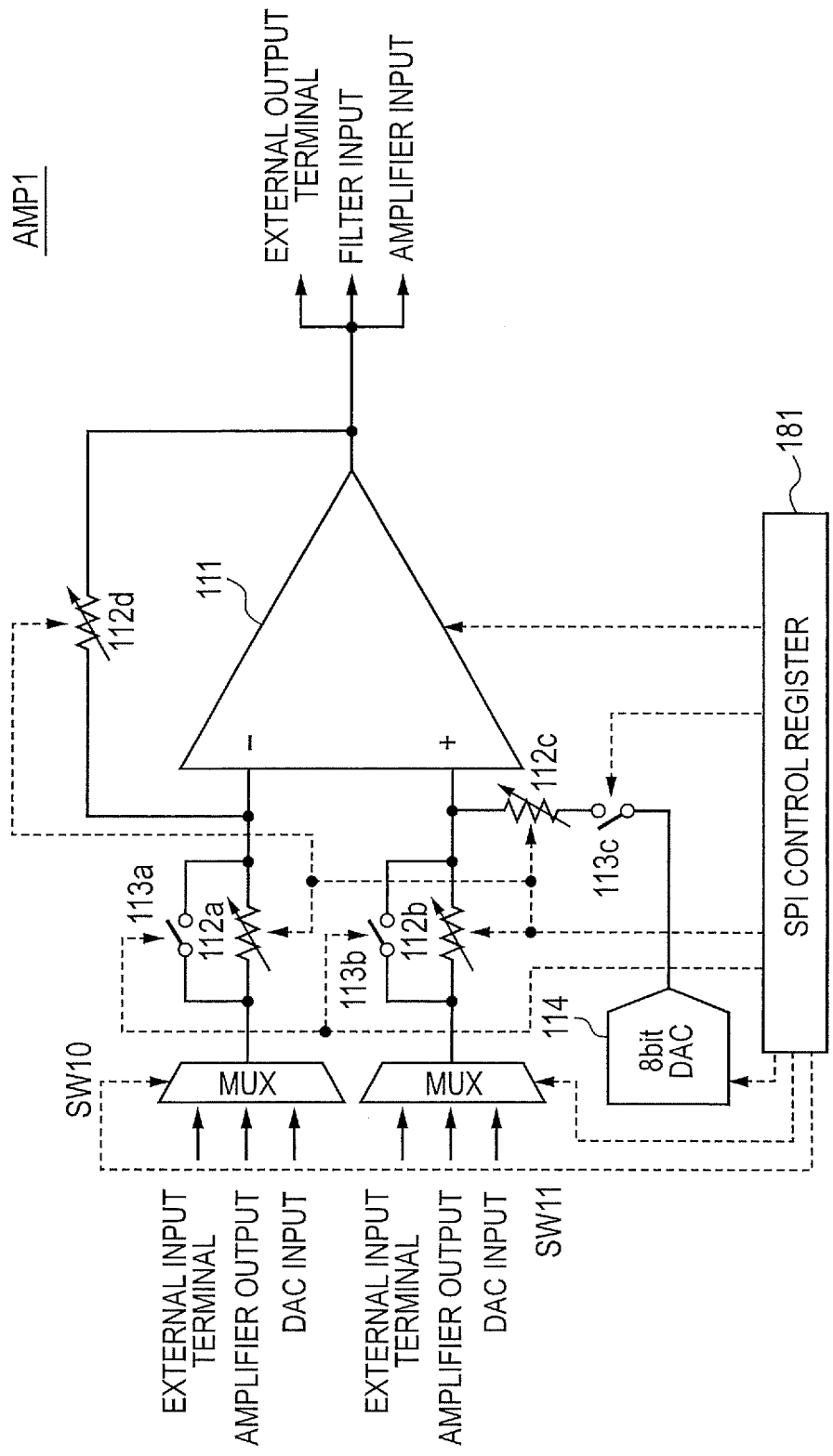
FIG. 8 is a circuit diagram showing a circuit configuration of the semiconductor device according to the first embodiment of the present invention.

FIG. 8 shows a circuit configuration of the individual amplifier AMP1 of the configurable amplifier 110. Incidentally, the AMP2 and the AMP3 have the same configuration.

As shown in FIG. 8, the individual amplifier AMP1 has an operational amplifier 111, and has variable resistances 112a to 112d and switches 113a to 113c which are coupled to respective terminals of the operational amplifier 111, and a DAC 114, and the multiplexers (switches) SW10, SW11 are coupled to the AMP1.

It is possible, depending on the setting value of the register 181, to switch over an input of the operational amplifier 111 by the multiplexers SW10, SW11, to switch over existence/absence of the variable resistances (input resistances) 112a, 112b by the switches 113a, 113b, and to switch over coupling of the DAC 114 by the switch 113c. Incidentally, as in FIG. 3, an output of the operational amplifier 111 can be switched over to anyone of couplings with the gain amplifier 120, with the low-pass filter 130, and with the high-pass filter 140 by the SW16, the SW17, and the SW18. Moreover, it is possible, depending on the setting value of the register 181, to change the gain, the operating point, the offset of the AMP1 by changing resistance values of the variable resistances 112a, 112b, 112c, and 112d and a setting of the DAC 114. Furthermore, it is possible, depending on the setting value of the register 181, to control the slew rate and ON/OFF of the power supply by controlling the operational amplifier.

By switching over respective switches and multiplexers, it is possible to form the I/V amplifier, the inverting amplifier, the subtracting (differential) amplifier, the non-inverting amplifier, and the summing amplifier.

Figure 9:
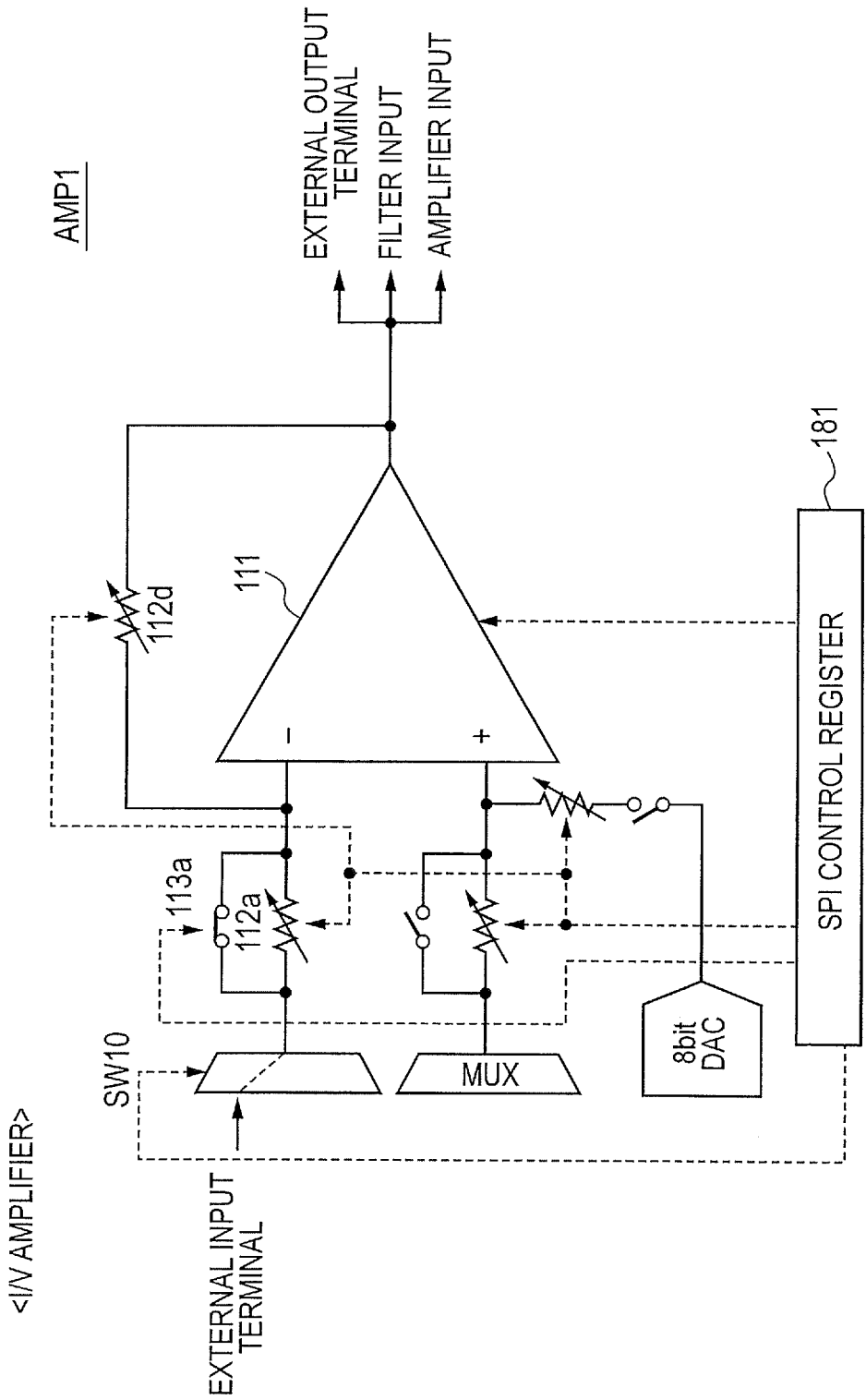
FIG. 9 is a circuit diagram showing an example of changing a configuration of the semiconductor device according to the first embodiment of the present invention.

FIG. 9 is an example of forming the I/V amplifier. According to the setting of the register 181, an external input terminal (MPXIN10) is coupled to an inversion input terminal by switching over the multiplexer SW10, and the variable resistance 112a is short-circuited by turning ON the switch 113a. This coupling forms the I/V amplifier. Moreover, based on the setting of the register 181, the gain of the amplifier is set by changing the resistance values of the variable resistances 112a, 112d. When a signal of a current-based sensor is inputted from an external input terminal, this I/V amplifier converts the input current into a voltage and outputs it.

Figure 10:
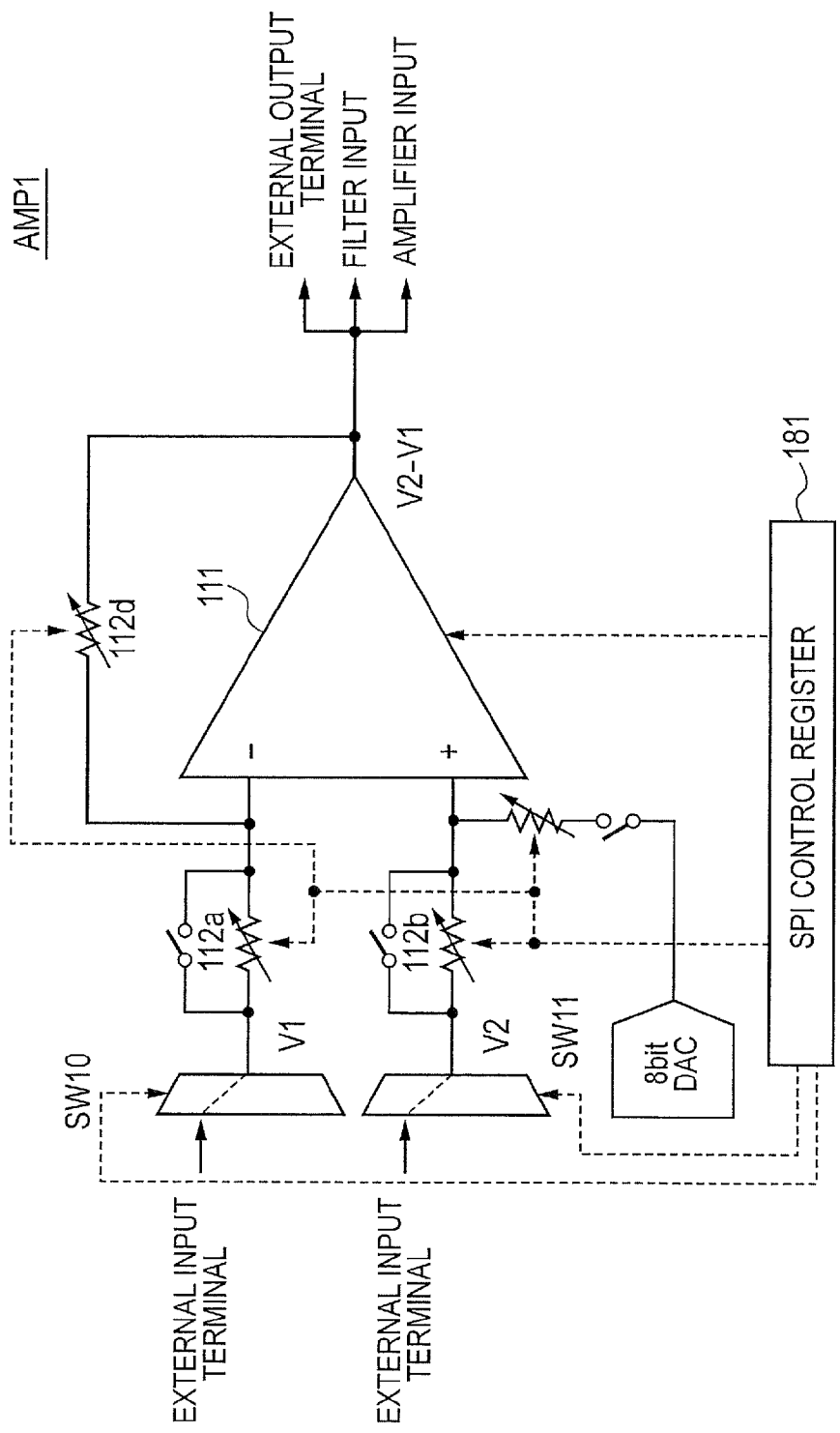
FIG. 10 is a circuit diagram showing an example of changing the configuration of the semiconductor device according to the first embodiment of the present invention.

FIG. 10 is an example of forming the subtracting (differential) amplifier. According to the setting of the register 181, by switching over the multiplexers SW10, SW11, the external input terminal (MPXIN10) is coupled to the inversion input terminal and an external input terminal (MPXIN20) is coupled to a non-inversion input terminal. This coupling forms the subtracting amplifier. Moreover, based on the setting of the register 181, the gain of the amplifier is set by changing the resistance values of the variable resistances 112a, 112b, and 112d. When two signals (V1, V2) are inputted from its external input terminals, this subtracting amplifier outputs a voltage (V2−V1) obtained by subtracting one input voltage from the other input voltage.

Figure 11:
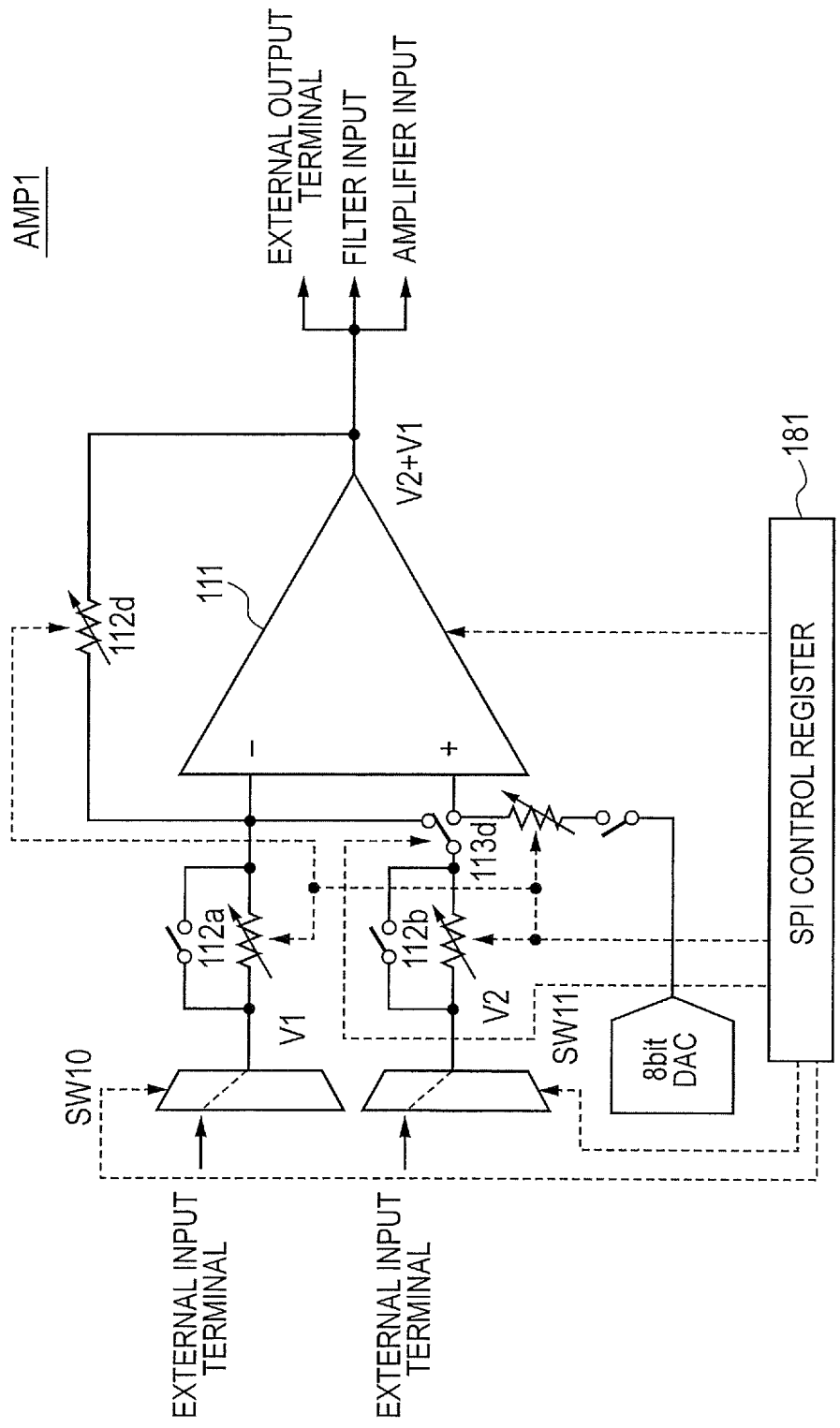
FIG. 11 is a circuit diagram showing an example of changing the configuration of the semiconductor device according to the first embodiment of the present invention.

FIG. 11 is an example of forming the summing amplifier. Incidentally, it is assumed here that the summing amplifier has a switch 113d between the variable resistance 112b and the inversion input terminal. According to the setting of the register 181, the external input terminal (MPXIN10) and the external input terminal (MPXIN20) are coupled to the inversion input terminal by switching over the multiplexers SW10, SW11 and the switch 113d. This coupling forms the summing amplifier. Moreover, based on the setting of the register 181, the gain of the amplifier is set by changing the resistance values of the variable resistances 112a, 112b, and 112d. When two signals (V1, V2) are inputted from its external input terminals, this summing amplifier outputs a voltage (V1+V1) obtained by adding one input voltage and the other input voltage.

Figure 12:
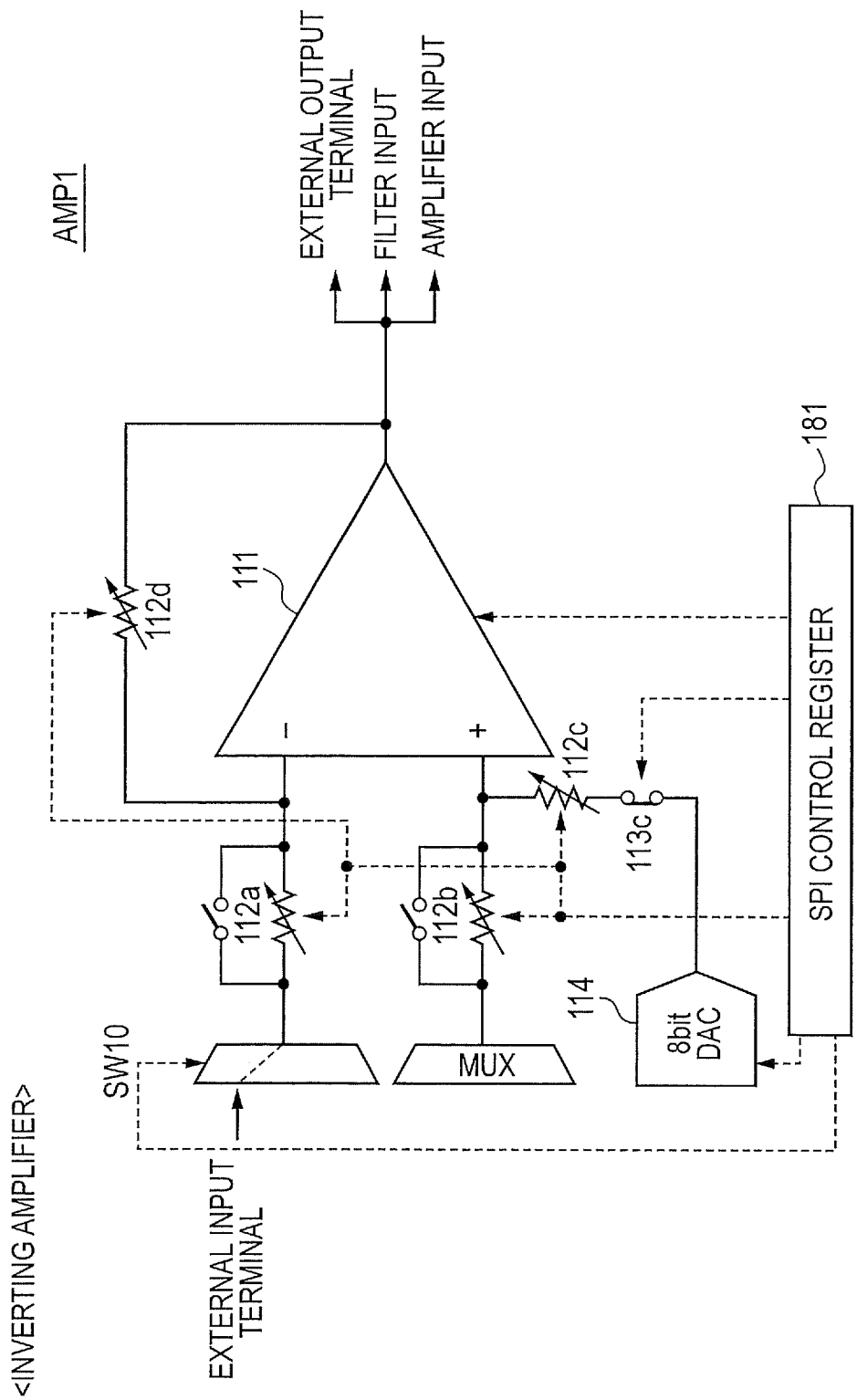
FIG. 12 is a circuit diagram showing an example of changing the configuration of the semiconductor device according to the first embodiment of the present invention.

FIG. 12 is an example of forming the inverting amplifier. According to the setting of the register, the external input terminal (MPXIN10) is coupled to the inversion input terminal by switching over the multiplexer SW10, and an output of the DAC 114 is coupled to the non-inversion input terminal by turning ON the switch 113c. This coupling forms the inverting amplifier. Moreover, based on the setting of the register 181, the gain of the amplifier is set by changing the resistance values of the variable resistances 112a, 112c, and 112d; an operating point and an offset of the amplifier are adjusted by changing an output voltage of the DAC. When a signal of a voltage-based sensor is inputted from an external input terminal, this inverting amplifier outputs a voltage obtained by inverting amplifying the input voltage.

Figure 13:
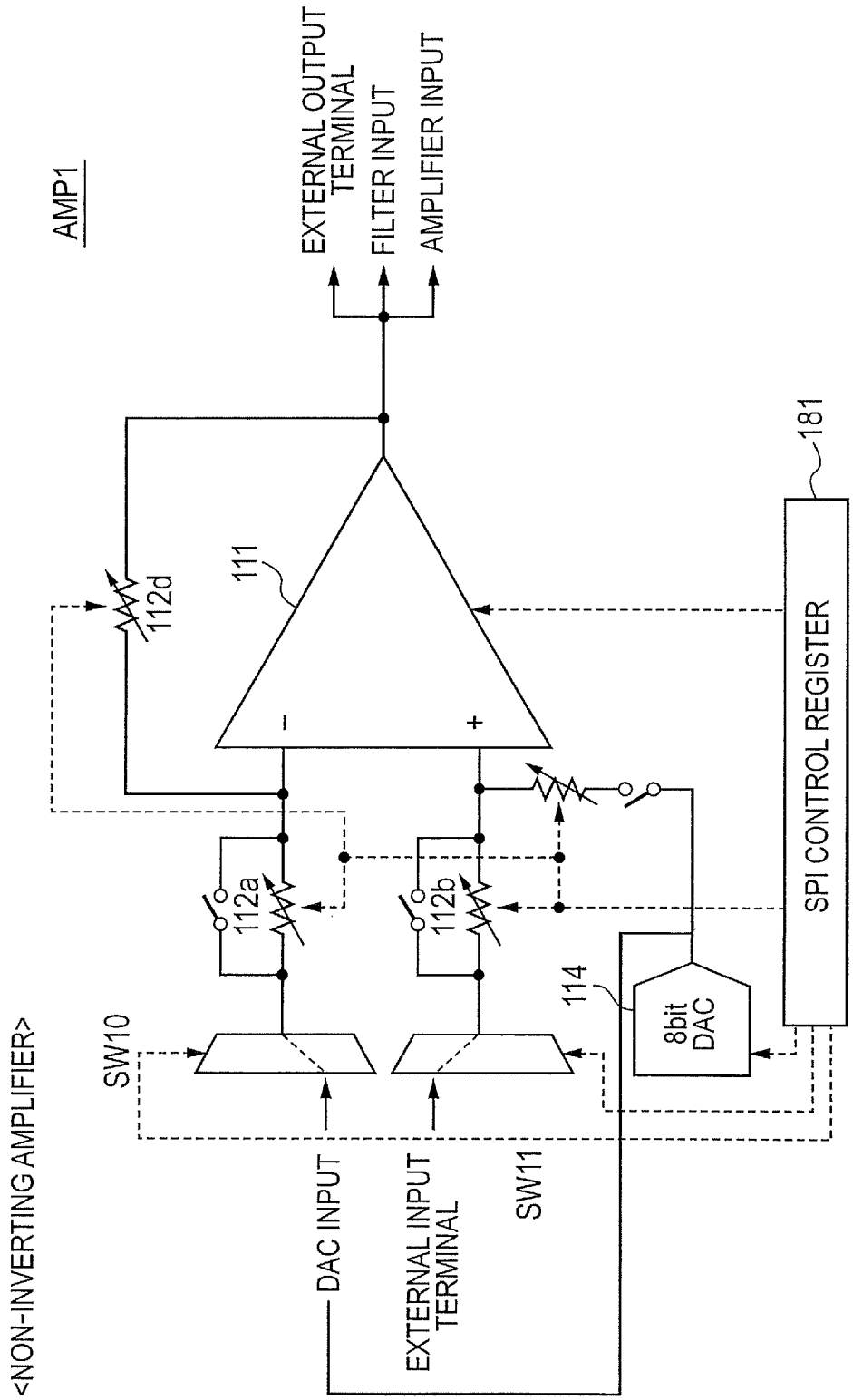
FIG. 13 is a circuit diagram showing an example of changing the configuration of the semiconductor device according to the first embodiment of the present invention.

FIG. 13 is an example of forming the non-inverting amplifier. According to the setting of the register, the output of the DAC 114 is coupled to the inversion input terminal by switching a multiplexer SW11; the external input terminal (MPXIN20) is coupled to the non-inversion input terminal by switching the multiplexer SW11. This coupling forms the non-inverting amplifier. Moreover, based on the setting of the register 181, the gain of the amplifier is set by changing the resistance values of the variable resistances 112a, 112b, and 112d; an operating point and an offset of the amplifier are adjusted by changing the output voltage of the DAC. When the signal of the voltage-based sensor is inputted from an external input terminal, this non-inverting amplifier outputs a voltage obtained by non-inverting amplifying the input voltage (whose phase is the same as that of the input).

Figure 14:
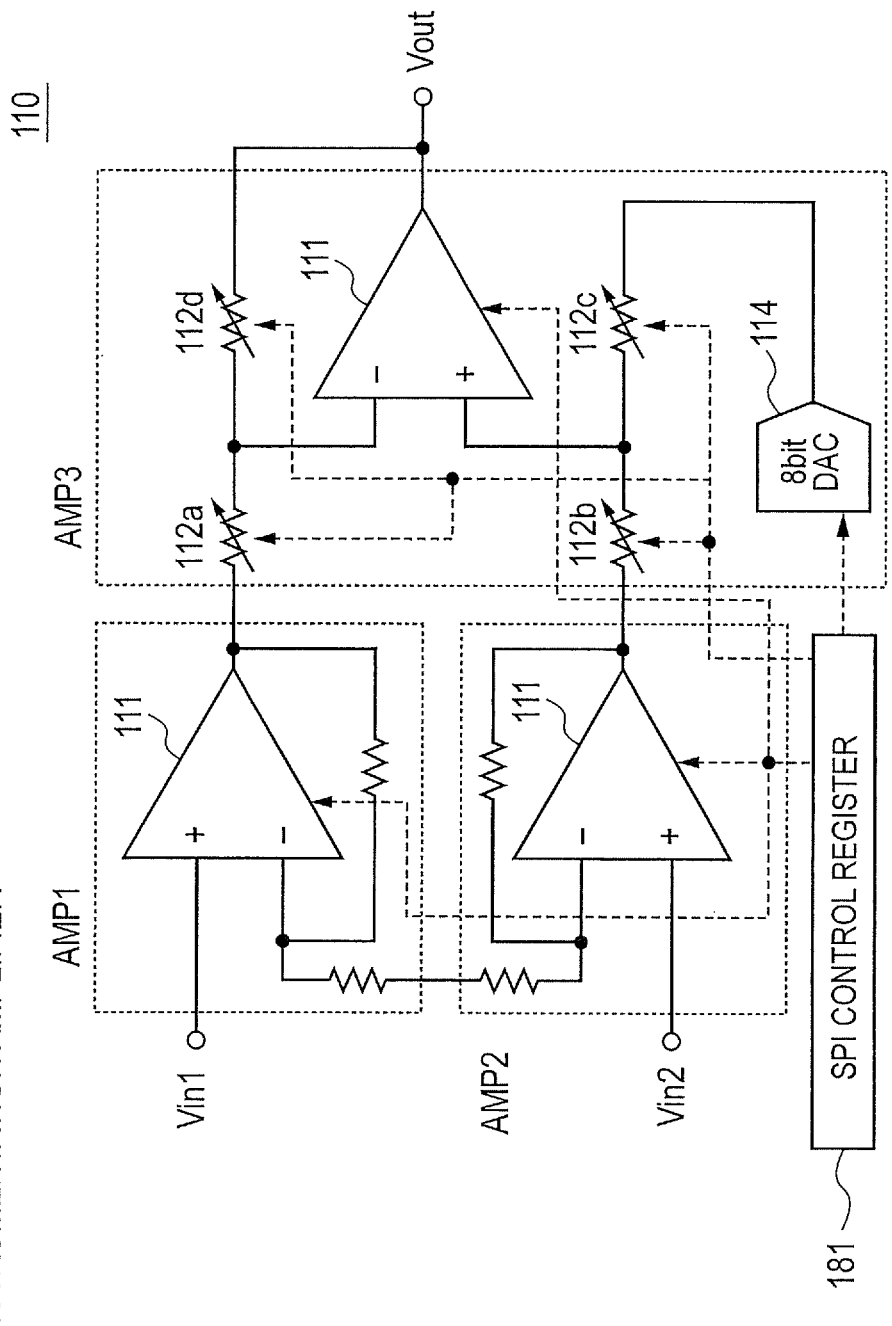
FIG. 14 is a circuit diagram showing an example of changing the configuration of the semiconductor device according to the first embodiment of the present invention.

FIG. 14 is an example in which the instrumentation amplifier is comprised of the AMP1 to the AMP3. As was explained in FIG. 5, the instrumentation amplifier of FIG. 14 can be comprised by coupling the AMP1 to the AMP3 using the multiplexers (switches) SW10 to SW15 according to the setting of the register 181. Incidentally, although an illustration of the switches is omitted, in the AMP1, the switch 113b is turned ON to short-circuit the variable resistance 112b; in the AMP2, the switch 113b is turned ON to short-circuit the variable resistance 112b; and in the AMP3, the switch 113c is turned ON to couple the DAC 114 to the non-inversion input terminal.

Moreover, based on the setting of the register 181, a gain of the instrumentation amplifier is set by changing the resistance values of the variable resistances 112a to 112d, and an operating point and an offset of the instrumentation amplifier are adjusted by changing an output voltage of the DAC 114. When a weak differential signal is inputted from an external input terminal, this instrumentation amplifier outputs a voltage that is obtained by non-inverting amplifying this differential signal by the AMP1 and by the AMP2, respectively, and further by differential amplifying it by the AMP3.

Next, specific circuit configurations of other circuits in the AFE unit 100 and the SPI interface will be explained using FIG. 15 to FIG. 21.

Figure 15:
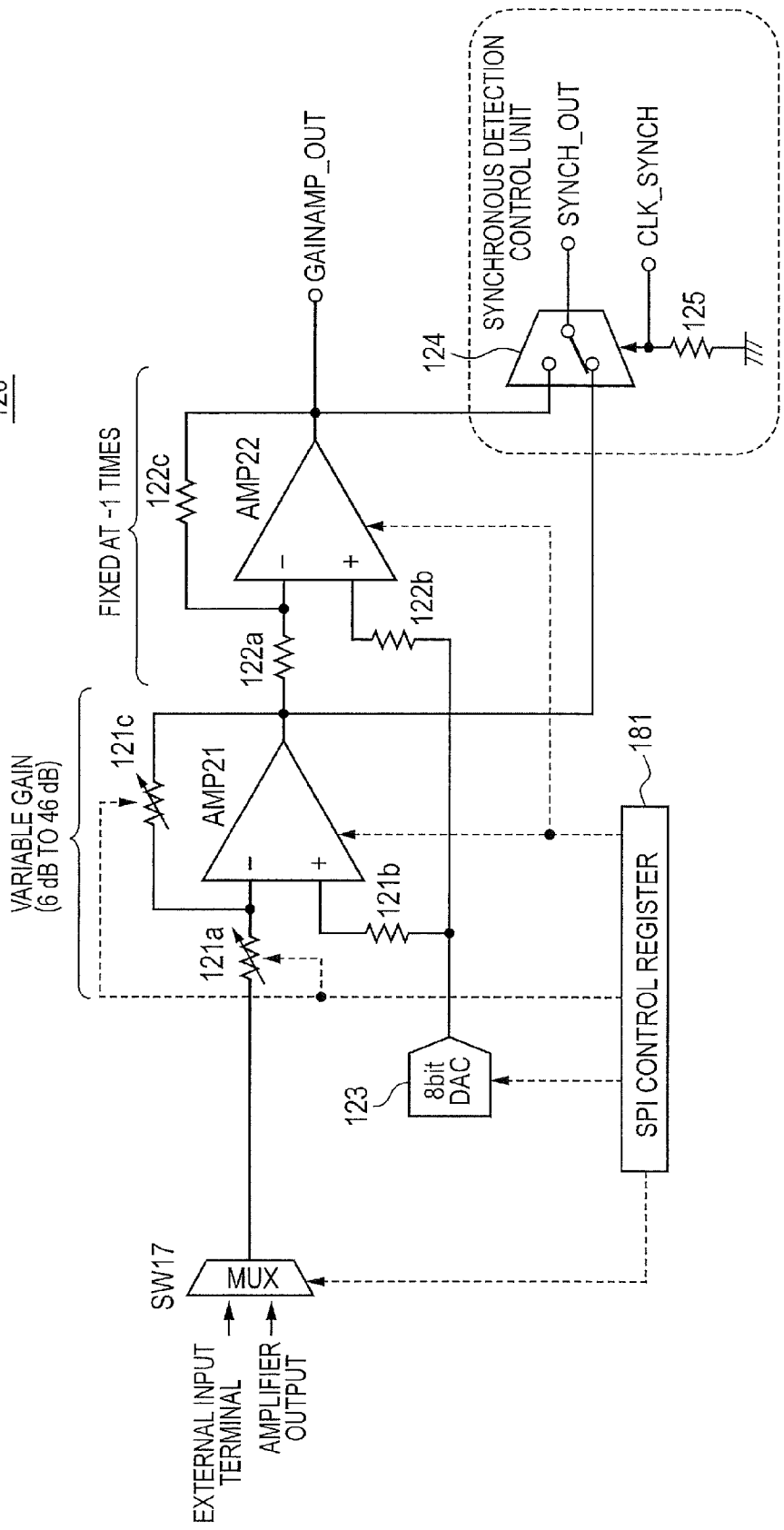
FIG. 15 is a circuit diagram showing a circuit configuration of the semiconductor device according to the first embodiment of the present invention.

FIG. 15 shows a circuit configuration of the gain amplifier 120. The gain amplifier 120 supports a synchronous detection function, and performs the amplification and the synchronous detection on the input signal. As a change of its characteristic, the gain amplifier 120 can set its gain to be variable. For example, the gain can be set to 6 dB to 46 dB in increments of 2 dB. Moreover, ON/OFF of its power supply can be switched over by the power-off mode.

As shown in FIG. 15, the gain amplifier 120 has operational amplifiers AMP21, AMP22 and has variable resistances 121a, 121c, fixed resistances 121b, 122a, 122b, and 122c all of which are coupled to respective terminals of the operational amplifiers AMP21, AMP22, and a DAC 123. Moreover, as shown in FIG. 3, the multiplexer (switch) SW17 is coupled to the variable resistance 121a. Furthermore, the gain amplifier 120 has a synchronous detection switch 124 and a fixed resistance 125 as a synchronous detection control unit for performing the synchronous detection.

Depending on the setting value of the register 181, the multiplexer SW17 is controlled to switch over an input of the gain amplifier 120. Moreover, a gain of the AMP21 and operating points, offsets of the AMP21, AMP22 can be changed by changing the resistance values of the variable resistances 121a, 121c and the setting of the DAC 123 depending on the setting value of the register 181. Furthermore, depending on the setting value of the register 181, ON/OFF of a power supply of the operational amplifiers AMP21, AMP22 is controllable.

In the gain amplifier 120, when a signal is inputted from the AMP1 to the AMP3 or an external input terminal, the signal that is inverting amplified by the AMP21 and is further inverting amplified by the AMP22 is outputted to the GAIN-AMP_OUT.

Moreover, asynchronous clock CLK_SYNCH is inputted from the MCU unit 200, coupling of the synchronous detection switch 124 is switched over in the timing of the synchronous clock CLK_SYNCH, and either of outputs of the AMP21 and the AMP22 is outputted to SYNCH_OUT.

Figure 16:
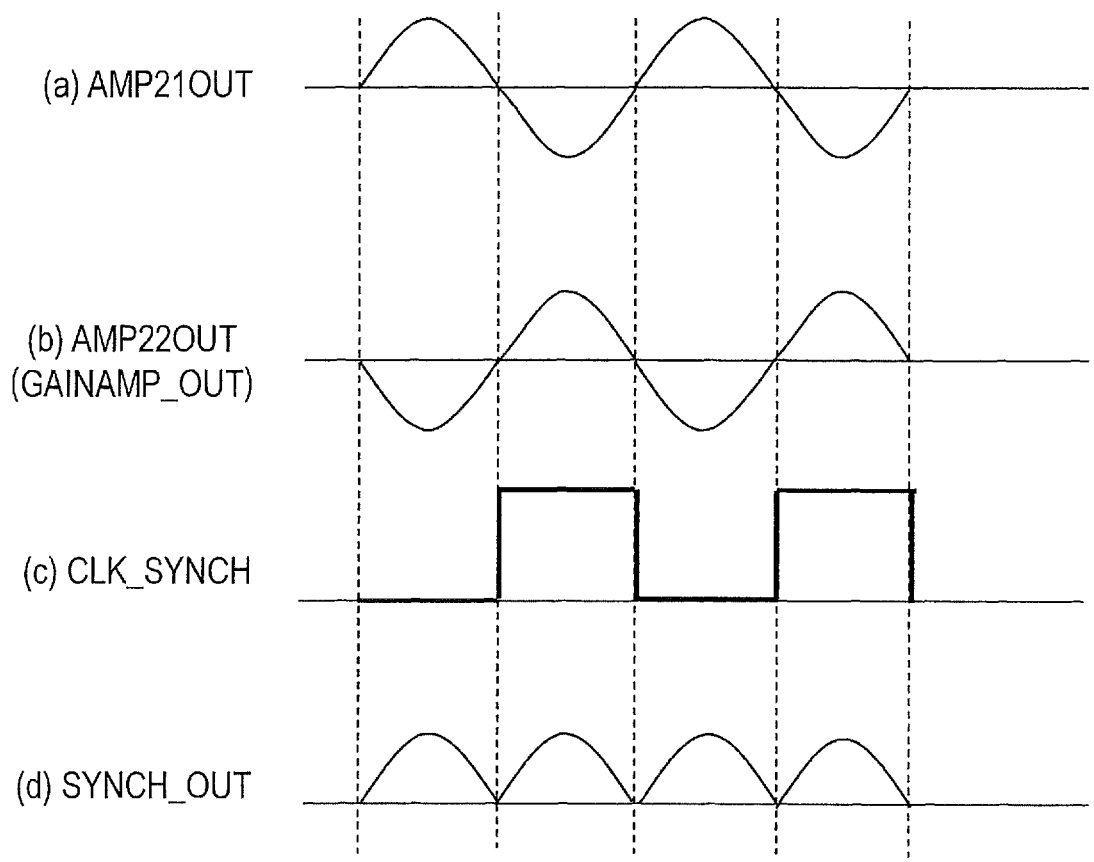
FIG. 16 is a timing chart showing an operation of the circuit of the semiconductor device according to the first embodiment of the present invention.

FIG. 16 is a timing chart showing the output operation of the gain amplifier 120. As in FIG. 16A, the AMP21 outputs an inverted signal of the input signal, and as in FIG. 16B, the AMP22 outputs a further inverted signal. This output signal of the AMP22 is outputted to the GAINAMP_OUT as an output of the gain amplifier 120.

The MCU unit 200 is coupled to the GAINAMP_OUT and generates a clock responding to a signal of the GAIN-AMP_OUT. Here, as in FIG. 17C, when the GAIN-AMP_OUT is in a high level compared with a reference value, the CLK_SYNCH that becomes high level is generated. Then, this synchronous clock CLK_SYNCH is supplied to the gain amplifier 120.

In response to this CLK_SYNCK, the synchronous detection switch 124 switches over a coupling of the SYNCH_OUT between the AMP21 and the AMP22. When the clock CLK_SYNCH is in a low level, it couples with the AMP21 and outputs an output of the AMP21 to the SYNCH_OUT; when the clock CLK_SYNCH is in a high level, it couples with the AMP22 and outputs an output of the AMP22 to the SYNCH_OUT. Then, the synchronous detection is performed and a signal obtained by performing full wave rectification is outputted from the SYNCH_OUT.

Figure 17:
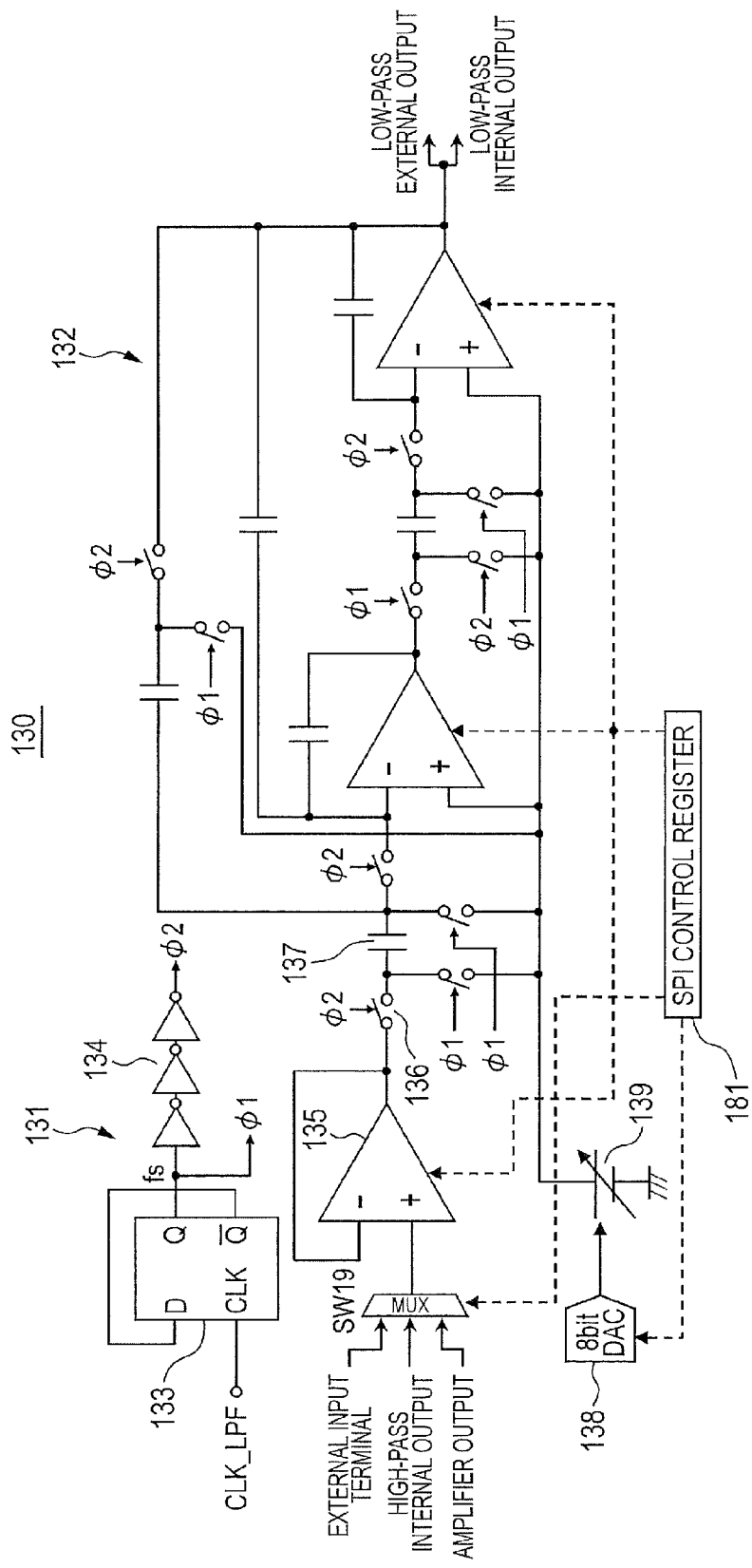
FIG. 17 is a circuit diagram showing the circuit configuration of the semiconductor device according to the first embodiment of the present invention.

FIG. 17 shows a circuit configuration of the low-pass filter 130. The low-pass filter 130 is the SC (switched capacitor) type low-pass filter with a variable cut-off frequency, and is used for filtering the input signal.

The characteristic of the low-pass filter 130 is such that a Q value is a fixed value, for example, 0.702. As a change of the characteristic, a cut-off frequency fc can be set to be variable. For example, it can be set up to 9 Hz to 900 Hz. Moreover, ON/OFF of its power supply can be switched over by the power-off mode.

As shown in FIG. 17, the low-pass filter 130 has a switching signal generation unit 131 for generating a switching signal and a filter unit 132 for filtering an input signal according to the switching signal.

The switching signal generation unit 131 has a flip-flop 133 and multiple inverters 134. The filter unit 132 has multiple operational amplifiers 135, and has multiple switches 136 coupled to the multiple operational amplifiers 135, a capacitor 137, and a variable power supply 139 controlled by the DAC 138. Moreover, the multiplexer (switch) SW19 is coupled as in FIG. 3.

Depending on the setting value of the register 181, the multiplexer SW19 is controlled to switch over an input of the low-pass filter 130. Moreover, depending on the setting value of the register 181, the variable power supply 139 can be controlled by changing a setting of the DAC 138, and thereby the operating point, the offset of the amplifier can be changed. Furthermore, depending on the setting value of the register 181, ON/OFF of a power supply of the low-pass filter 130 is controllable.

In the low-pass filter 130, a clock CLK_LPF is inputted from the outside to the switching signal generation unit 131, and the flip-flop 133 and the inverters 134 generate the switching signals Φ1, Φ2. In the filter unit 132, when the signal is inputted from an external input terminal, the gain amplifier 120, or the like, a signal is outputted through three operational amplifiers 135, and in that case, the switching signals Φ1, Φ2 turn ON/OFF the switches 136, which switch over coupling of the capacitor 137. Then, a signal with frequency components higher than the cut-off frequency of the input signal eliminated will be outputted.

This cut-off frequency can be changed by the clock CLK_LPF inputted from the outside by the MCU unit 200. Specifically, the cut-off frequency is fc=0.009×fs. In this formula, fs=(½)×f (f is the frequency of CLK_LPF).

Figure 18:
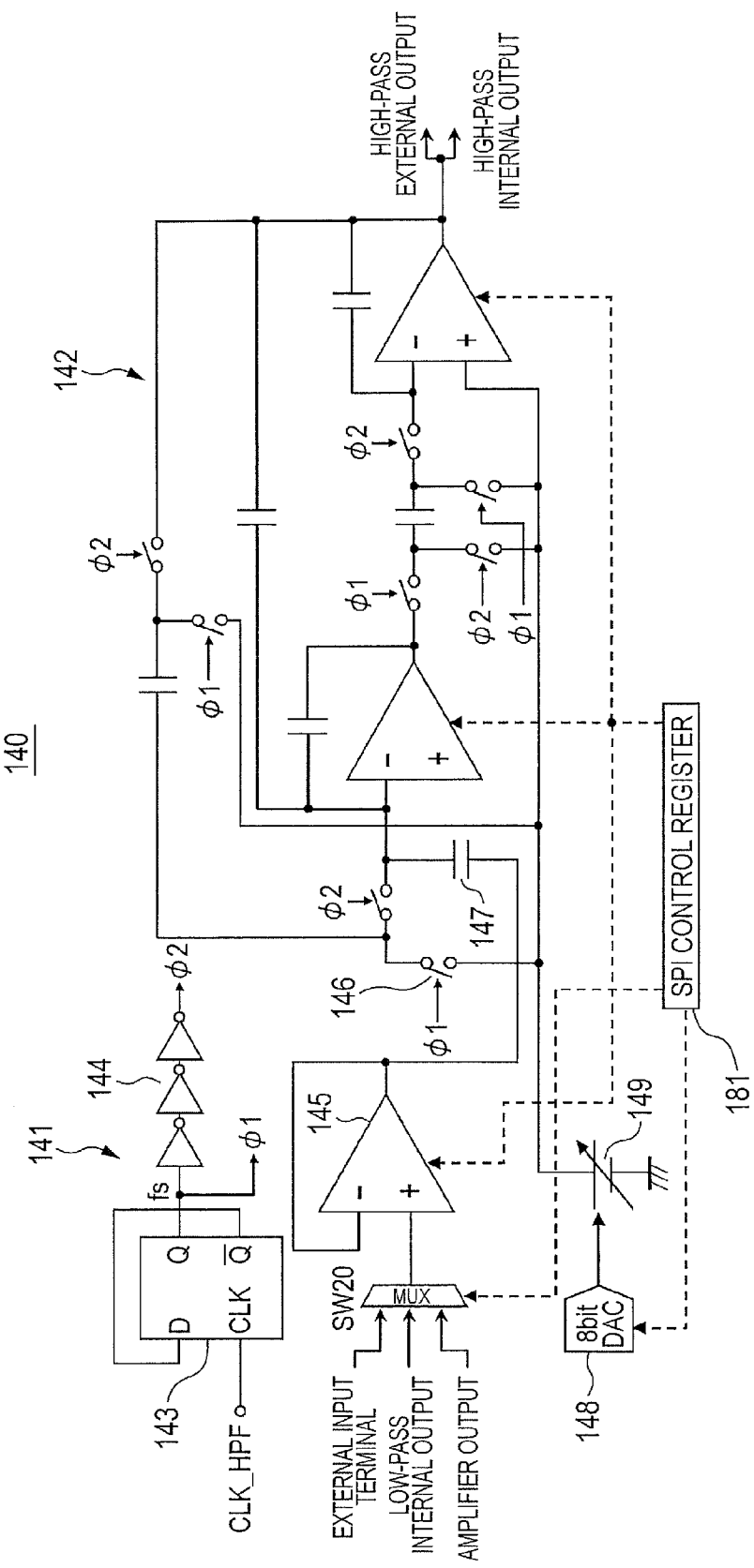
FIG. 18 is a circuit diagram showing the circuit configuration of the semiconductor device according to the first embodiment of the present invention.

FIG. 18 shows a circuit configuration of the high-pass filter 140. The high-pass filter 140 is the SC-type high-pass filter with a variable cut-off frequency, and is used for filtering an input signal.

The characteristic of the high-pass filter 140 is such that the Q value is a fixed value, for example, 0.702. As a change of the characteristic, the cut-off frequency fc can be set to be variable. For example, it can be set up to 8 Hz to 800 Hz. Moreover, ON/OFF of its power supply can be switched over by the power-off mode.

As shown in FIG. 18, the high-pass filter 140 has a switching signal generation unit 141 for generating a switching signal, and a filter unit 142 for filtering the input signal in response to the switching signal.

The switching signal generation unit 141 has a flip-flop 143 and multiple inverters 144. The filter unit 142 has multiple operational amplifiers 145, and has a variable power supply 149 controlled by multiple switches 146, a capacitor 147, and a DAC 148 coupled to the multiple operational amplifiers 145. Moreover, as shown in FIG. 3, the multiplexer (switch) SW20 is coupled to it.

Depending on the setting value of the register 181, the multiplexer SW20 is controlled to switch over an input of the high-pass filter 140. Moreover, depending on the setting value of the register 181, the variable power supply 149 can be controlled and an operating point, an offset of the amplifier can be changed by a setting of the DAC 148 being changed. Furthermore, depending on the setting value of the register 181, ON/OFF of a power supply of the high-pass filter 140 is controllable.

In the high-pass filter 140, a clock CLK_HPF is inputted into the switching signal generation unit 141 from the outside, and the flip-flop 143 and the inverters 144 generate switching signals Φ1, Φ2. In the filter unit 142, when a signal is inputted from an external input terminal, the gain amplifier 120, a signal is outputted through the three operational amplifiers 145, and in that case, the switches 146 are turned ON/OFF by the switching signals Φ1, Φ2, and coupling of the capacitor 147 is switched over. Then, a signal with frequency components lower than the cut-off frequency of the input signal eliminated will be outputted.

This cut-off frequency can be changed by the clock CLK_HPF inputted from the outside by the MCU unit 200. Specifically, the cut-off frequency is fc=0.008×fs. In this formula, fs=(½)×f (f is the frequency of CLK_HPF).

Figure 19:
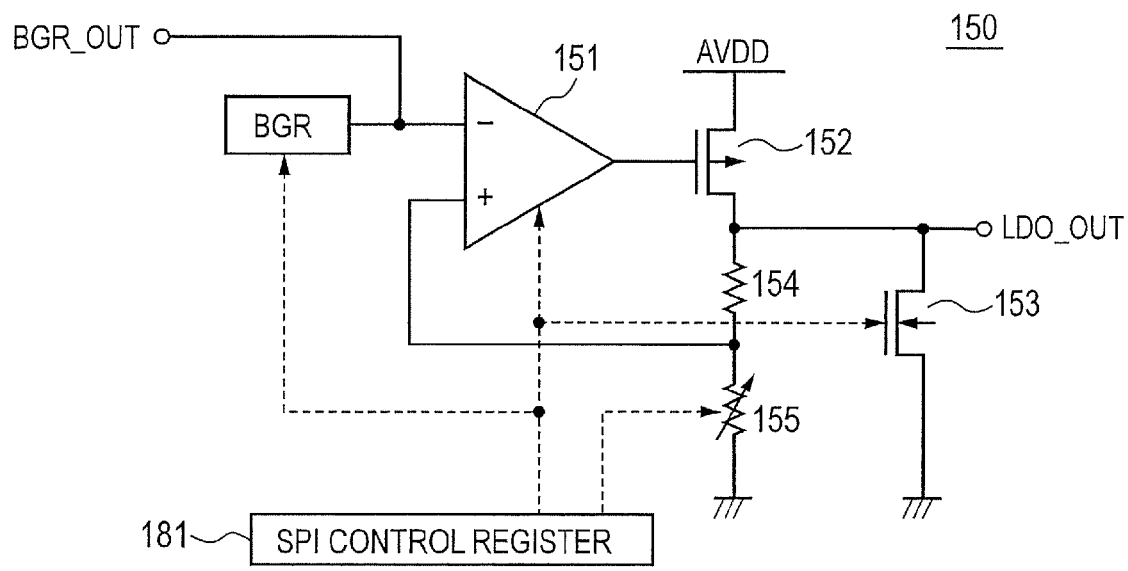
FIG. 19 is a circuit diagram showing the circuit configuration of the semiconductor device according to the first embodiment of the present invention.

FIG. 19 shows a circuit configuration of the variable regulator 150. The variable regulator 150 is a regulator for making the output voltage variable, and is a reference power supply generating circuit of the A/D converter 260 of the MCU unit 200. As a change of the characteristic, the variable regulator 150 can set the output voltage to 2.0 V to 3.3 V with an accuracy of ±5% in 0.1 V increments. For example, the characteristic of the variable regulator 150 is such that the output current is 15 mA. Moreover, the variable regulator 150 can control ON/OFF of an output power supply.

As shown in FIG. 19, the variable regulator 150 has an operational amplifier 151, and has the followings: a band gap reference BGR coupled to the input side of the operational amplifier 151, transistors 152, 153 coupled to the output side of the operational amplifier 151, a fixed resistance 154, and a variable resistance 155.

The output voltage can be changed by setting a voltage of the BGR and by changing a resistance value of the variable resistance 155 depending on the setting value of the register 181. Furthermore, depending on the setting value of the register 181, ON/OFF of a power supply of the operational amplifier 151 and ON/OFF of the transistor 153 are switched over, and start/stop of outputting the output voltage is controlled.

In the variable regulator 150, the voltage of the BGR is outputted from the BGR_OUT. The operational amplifier 151 operates in response to the voltage of the BGR and a voltage of the variable resistance 155 to control the transistor 152, and a voltage in proportion to a ratio of the fixed resistance 154 and the variable resistance 155 is outputted.

Figure 20:
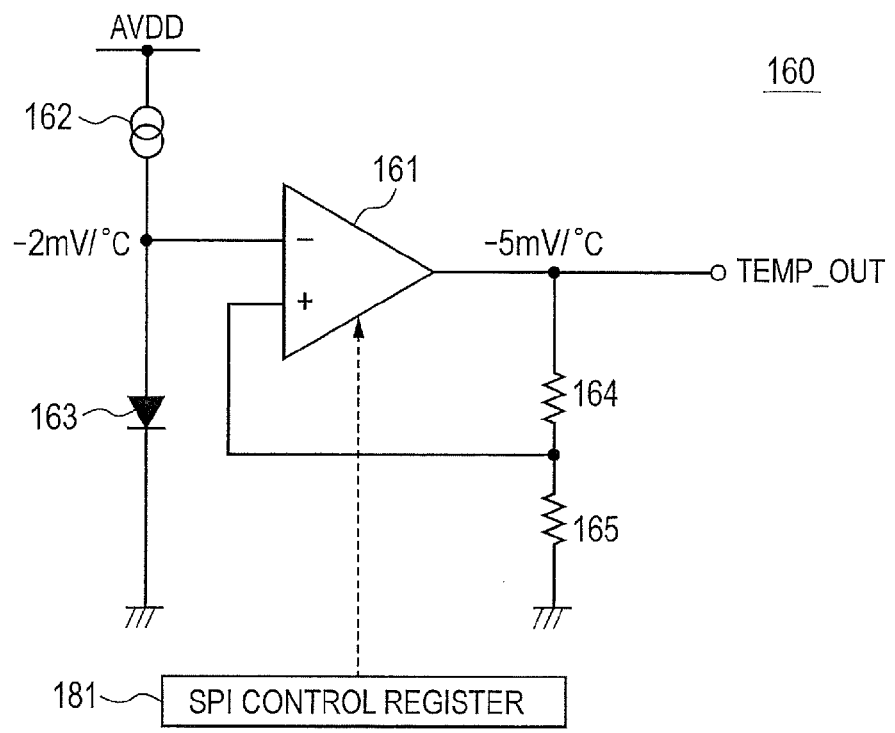
FIG. 20 is a circuit diagram showing the circuit configuration of the semiconductor device according to the first embodiment of the present invention.

FIG. 20 shows a circuit configuration of the temperature sensor 160. The temperature sensor 160 is a sensor for measuring the temperature of the semiconductor device 1, and can be used in order that the MCU unit 200 may perform correction of a temperature characteristic based on this measurement result. For example, an output temperature coefficient is −5 mV/° C. as the characteristic of the temperature sensor 160. Moreover, ON/OFF of the power supply can be switched over by the power-off mode.

As shown in FIG. 20, the temperature sensor 160 has an operational amplifier 161, and further has a current source 162 and a diode 163 both coupled to the input side of the operational amplifier 161 and fixed resistances 164, 165 coupled to the output side of the operational amplifier 161. A power supply of the operational amplifier 161 can be turned ON/OFF depending on the setting value of the register 181.

In the temperature sensor 160, a voltage of the diode 163 changes at −2 mV/° C. in proportion to the temperature, and the operational amplifier 161 non-inverting amplifies this voltage and outputs it as at −5 mV/° C.

Figure 21:
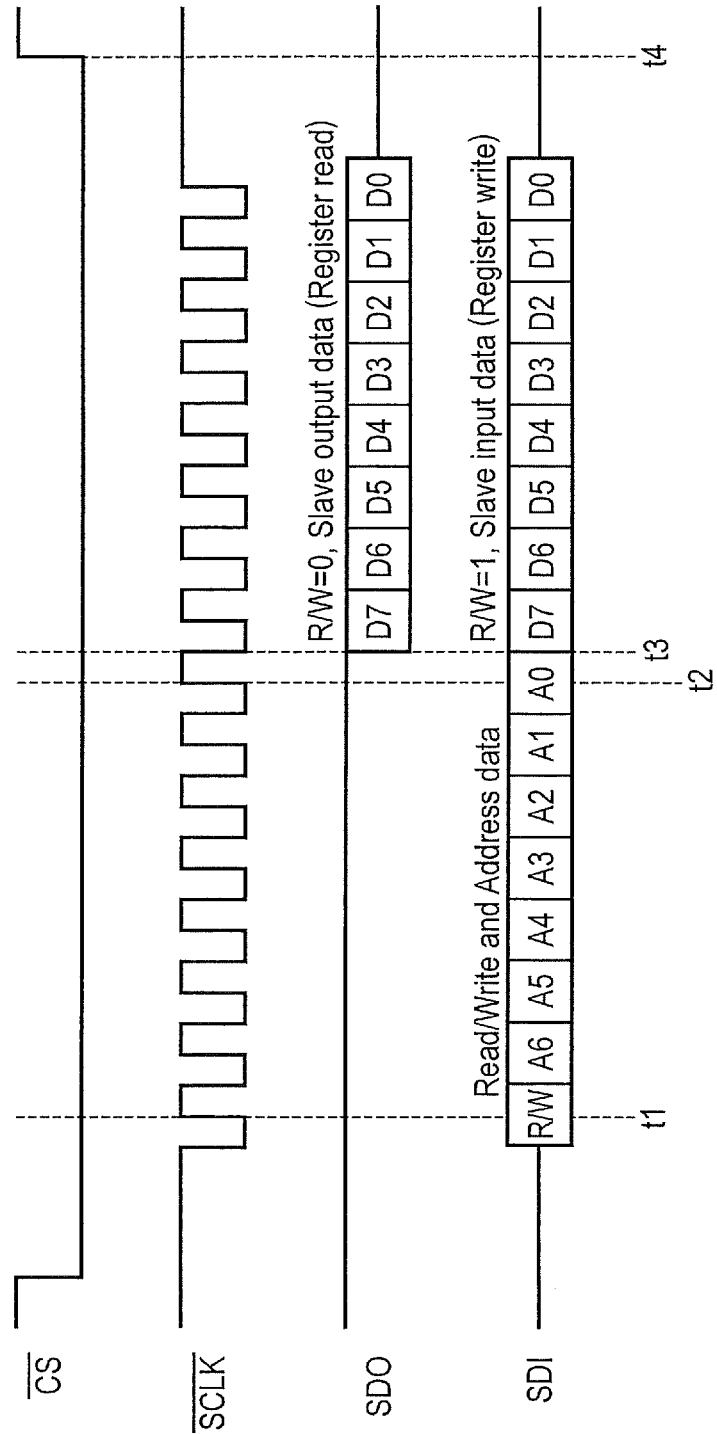
FIG. 21 is a timing chart showing a communication timing of the semiconductor device according to the first embodiment of the present invention.

FIG. 21 shows a communication timing of the SPI interface 180. The SPI interface 180 is an interface between the MCU unit and the AFE unit, and performs a setting of the AFE unit, i.e., writing/reading of the register 181. Here, an SPI clock frequency is 10 MHz, the amount of communications data is 16 bits, and a communication direction is toward MSB.

As shown in FIG. 21, a chip select CS (inverse signal), a serial clock SCLK (inverse signal), and serial-data input SDI are inputted into the AFE unit 100 from the MCU unit 200, and serial-data output SDO is outputted to the MCU unit 200 from the AFE unit 100.

When the chip select CS becomes a low level, and each bit is inputted and outputted synchronizing with the serial clock SCLK. The MCU unit 200 sets a bit that indicates the read/write of the register 181 in an R/W, and sets an address of the register 181 in which read/write is performed in address A1 to A6.

When R/W indicates "write," the MCU unit 200 sets up the data to be written in the register in D0 to D7. When R/W indicates "read," the MCU unit 200 sets up the data read from the register 181 in D0 to D7.

When the R/W and A1 to A6 are entered into the SDI, the AFE unit 100 samples the data in the timing (t1) of a rise edge of the clock SCLK and latches the R/W and the address in the timing (t2) of A0. After the timing A0, transmit data is set with one bit shifted in the timing (t3) of a fall-down edge of the D7 to D0 clock SCLK. Furthermore, the data is latched in the timing (t4) of the chip select CS.

In this way, the semiconductor device 1 of this embodiment can set the circuit configuration and characteristic of the AFE unit 100 inside the semiconductor device to be variable. For this reason, various sensors can be coupled with a single semiconductor device, which can be used in many application systems (applications).

For example, if the circuit configuration of the configurable amplifier 110 is specified as the non-inverting amplifier, since a voltage-based sensor can be coupled to it, it can be used for application systems using an infrared sensor, a temperature sensor, and a magnetic sensor. As one example, it can be used for a digital camera having an infrared sensor, a printer having a temperature sensor, a tablet terminal having a magnetic sensor, an air conditioner having an infrared sensor.

Moreover, if the circuit configuration of the configurable amplifier 110 is specified as an instrumentation amplifier, since a sensor whose differential output is weak becomes coupleable to it, it can be used for application systems using a pressure sensor, a gyro sensor, and a shock sensor. As one example, it can be used for a sphygmomanometer having a pressure sensor, a weighing machine having a pressure sensor, a mobile phone having a gyro sensor, a liquid crystal television having a shock sensor.

Furthermore, in the case where the circuit configuration of the configurable amplifier 110 is specified as the I/V amplifier, since a sensor with a current output is coupleable, it can be used for an application system using a photodiode, a human detection sensor, an infrared sensor, or the like. As one example, it can be used for a digital camera having a photodiode, a surveillance camera having a human detection sensor, a toilet seat having a human detection sensor, a bar code reader having an infrared sensor.

Figure 22:
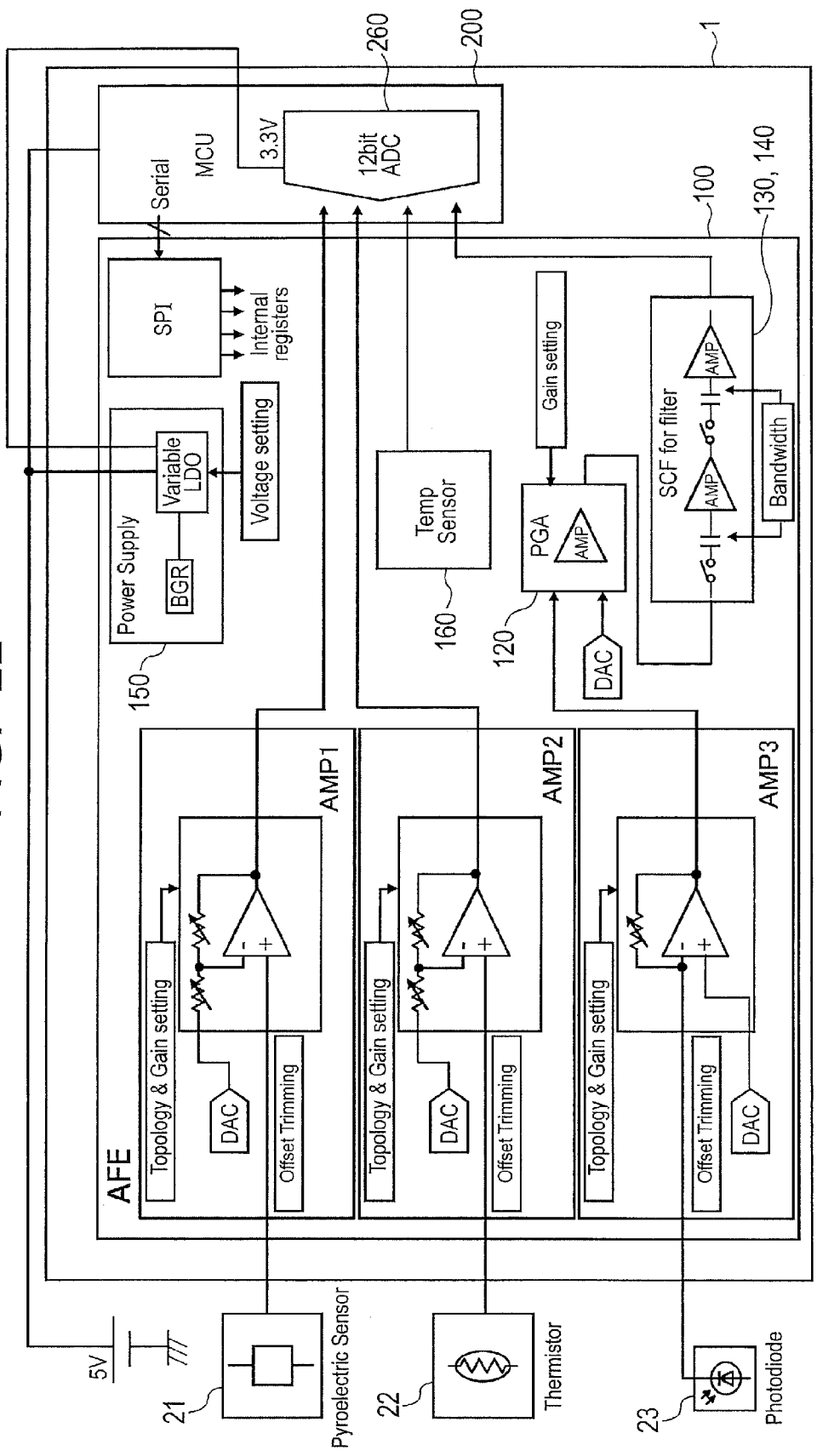
FIG. 22 is a system configuration diagram showing an application example of the semiconductor device according to the first embodiment of the present invention.

An example of a system in which a sensor is coupled to the semiconductor device 1 will be explained using FIG. 22 to FIG. 24. FIG. 22 is an example in which three kinds of sensors are coupled to the semiconductor device 1. In this example, the configurable amplifier 110 is set to have three individual amplifiers AMP1 to AMP3 of three channels, to each of which a different sensor is coupled, respectively.

A pyroelectric sensor (infrared sensor) 21 is coupled to the AMP1. For this reason, the AMP1 is set to have a configuration and a characteristic suited to the pyroelectric sensor 21. The AMP1 is set to have a circuit configuration of the non-inverting amplifier, whose input is coupled to the external input terminal to which the pyroelectric sensor 21 is coupled and whose output is coupled to an external output terminal to which the MCU unit 200 is coupled. Moreover, its gain and offset are set to fit the pyroelectric sensor 21. By this, an output signal of the pyroelectric sensor 21 is non-inverting amplified by the AMP1, is A/D converted by the A/D converter 260 of the MCU unit 200, and is subjected to a processing according to detection of the pyroelectric sensor 21.

A thermistor (temperature sensor) 22 is coupled to the AMP2. For this reason, the AMP2 is set to have a configuration and a characteristic suited to the thermistor 22. The AMP2 is set to have the circuit configuration of the non-inverting amplifier, whose input is coupled to the external input terminal to which the thermistor 22 is coupled and whose output is coupled to an external output terminal to which the MCU unit 200 is coupled. Moreover, its gain and offset are set to fit the thermistor 22. By this, an output of the thermistor 22 is non-inverting amplified by the AMP2, is outputted to the MCU unit 200, is A/D converted by the A/D converter 260 of the MCU unit 200, and is subjected to a processing according to detection of the thermistor 22.

A photodiode 23 is coupled to the AMP3. For this reason, the AMP3 is set to have a configuration and a characteristic suited to the photodiode 23. The AMP3 is set to have the circuit configuration of the non-inverting amplifier, and its input is coupled to the external input terminal to which the photodiode 23 is coupled. An output of the AMP3 is coupled to the input of the gain amplifier 120, the output of the gain amplifier 120 is coupled to an input of filters (including the low-pass filter 130 and the high-pass filter 140), and an output of the filters is coupled to an external output terminal to which the MCU unit 200 is coupled. Moreover, a gain and an offset of the AMP3, a gain of the gain amplifier 120, and cut-off frequencies of filters 130, 140 are set to fit the photodiode 23. Thereby, an output signal of the photodiode 23 is non-inverting amplified by the AMP2, is further amplified by the gain amplifier 120, subsequently is eliminated of a noise by the filters (130,140), and is outputted to the MCU unit 200. In the MCU unit 200, the signal is A/D converted by the A/D converter 260, and is subjected to a processing according to detection of the photodiode 23.

Incidentally, an output of the temperature sensor 160 is coupled to the A/D converter 260 of the MCU unit 200, and an output voltage (3.3V) of the variable regulator 150 is supplied to the A/D converter 260.

Figure 23:
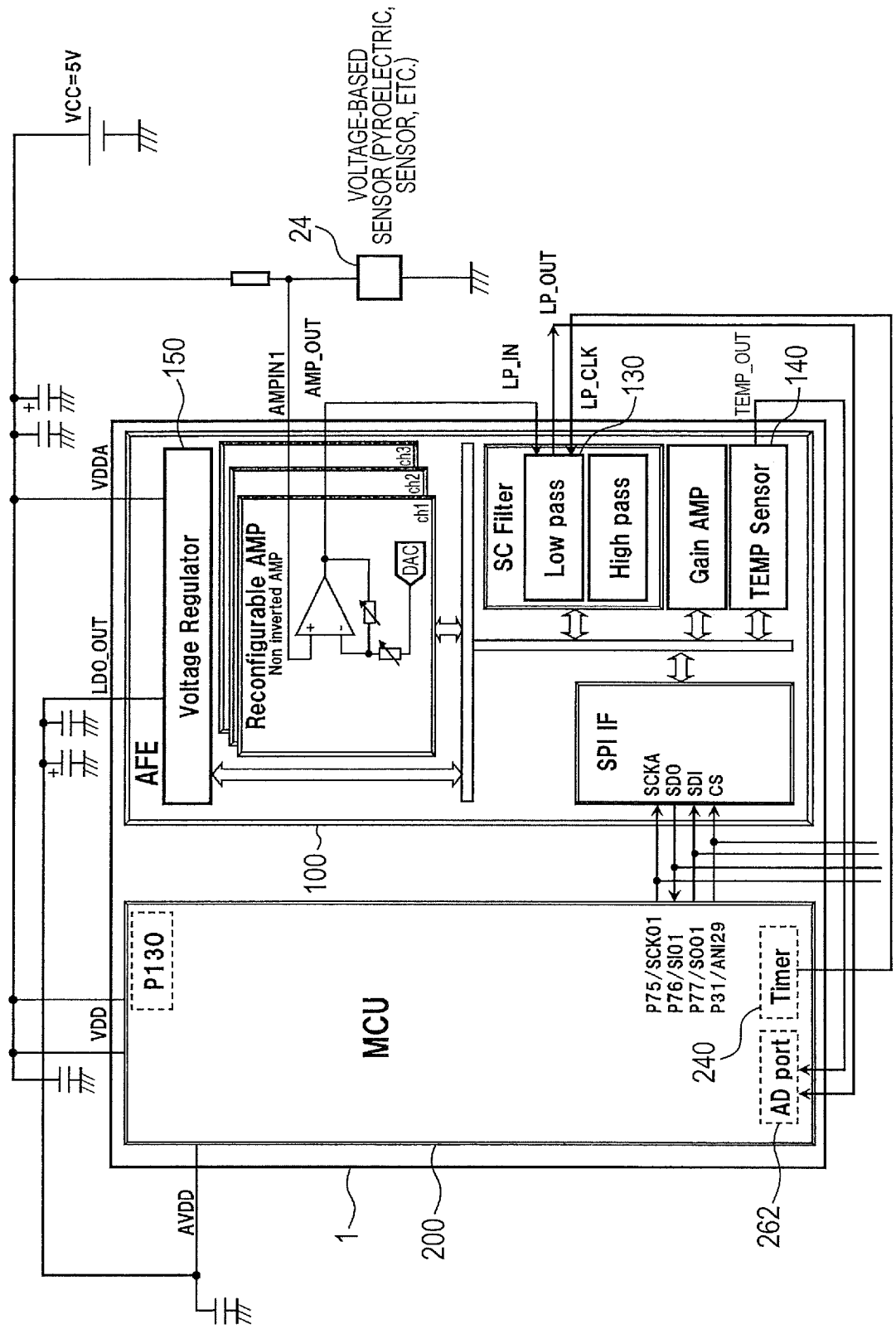
FIG. 23 is a system configuration diagram showing an application example of the semiconductor device according to the first embodiment of the present invention.

FIG. 23 is an example in which a voltage-based sensor 24, such as a pyroelectric sensor and a thermistor, is coupled to the semiconductor device 1. For example, it is an example applicable to an application system, such as a digital camera, a printer, a tablet terminal, and an air-conditioner each of which has the voltage-based sensor 24.

The configurable amplifier 110 is configured to be three-channel individual amplifiers being independent among one another, and one of them is used as the AMP1. In order to support an output signal of the voltage-based sensor 24, a circuit configuration of the AMP1 is specified as the non-inverting amplifier. In this example, the output signal of the voltage-based sensor 24 is amplified by the AMP1 and is made to pass through the low-pass filter 130, and subsequently is A/D converted by the MCU unit 200.

Therefore, an input of the AMP1 is coupled to the external input terminal to which the voltage-based sensor 24 is coupled, and an output of the AMP1 is coupled to the input of the low-pass filter 130. In this example, the output of the AMP1 and the input of the low-pass filter 130 are coupled together through the external terminal. An output of the low-pass filter 130 is coupled to an AD port 262 (an input port of the A/D converter) of the MCU unit 200. A clock of the low-pass filter 130 is supplied by the timer 240 of the MCU unit 200.

A circuit optimal to the voltage-based sensor 24 can be formed by setting a cut-off frequency of the low-pass filter 130 and setting the gain and the offset of the AMP1 according to a characteristic of the voltage-based sensor 24.

Incidentally, the output of the temperature sensor 160 is coupled to the AD port 262 of the MCU unit 200. A VCC power supply is supplied to the MCU unit 200 and the AFE unit 100, and an output of the variable regulator 150 is coupled to a power supply input of the A/D converter 260 of the MCU unit 200.

Figure 24:
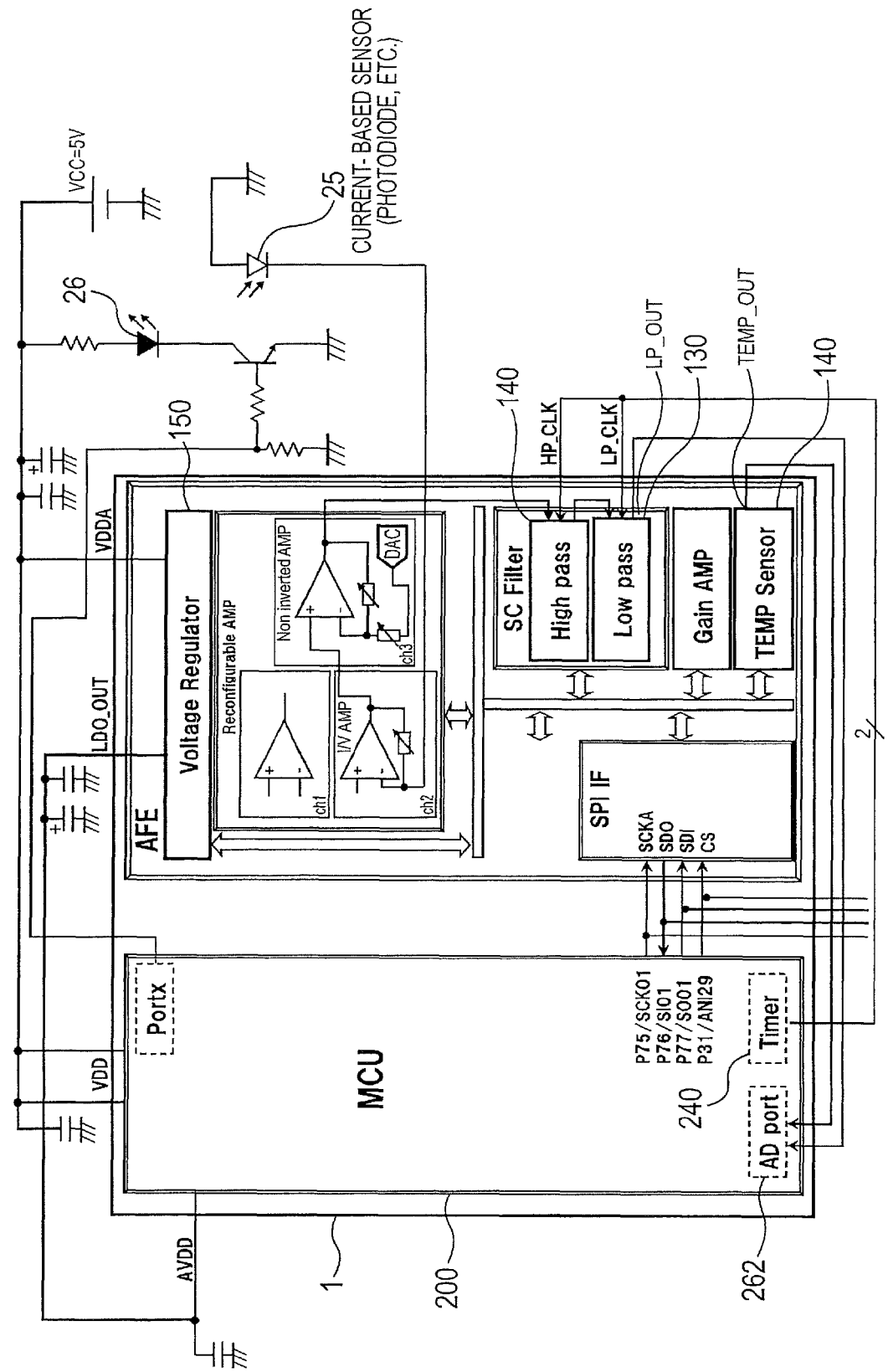
FIG. 24 is a system configuration diagram showing an application example of the semiconductor device according to the first embodiment of the present invention.

FIG. 24 shows an example in which a current-based sensor 25, such as a photodiode, is coupled to the semiconductor device 1. It is an example applicable to application systems, such as a fire alarm, a surveillance camera, a toilet seat, and a bar code reader each of which has the current-based sensor.

The configurable amplifier 110 is configured to be independent individual amplifiers of three channels, and the AMP2 and the AMP3 are used so. In order to support the output signal of the current-based sensor 25, the AMP1 is set to have a circuit configuration of the I/V amplifier, and the AMP3 is set to have the circuit configuration of the non-inverting amplifier. Thus, it is also possible to couple two amplifiers of the AMP1 to the AMP3 arbitrarily to configure the semiconductor device 1.

In this example, an output signal of the current-based sensor 25 is amplified by the AMP2 and the AMP3, further, is made to pass through the high-pass filter 140 and the low-pass filter 130, and is A/D converted in the MCU unit 200.

Therefore, an input of the AMP2 is coupled to the external input terminal to which the current-based sensor 25 is coupled, an output of the AMP2 is coupled to an input of the AMP3, and the output of the AMP3 is coupled to the input of the high-pass filter 140. Then, an output of the high-pass filter 140 is coupled to the input of the low-pass filter 130, and the output of the low-pass filter 130 is coupled to the AD port 262 of the MCU unit 200. The clocks of the high-pass filter 140 and the low-pass filter 130 are supplied by the timer 240 of the MCU unit 200.

By setting the gains and the offsets of the AMP1 and the AMP2, and setting the cut-off frequencies of the high-pass filter and the low-pass filter according to the characteristic of the current-based sensor 25, an optimal circuit for the current-based sensor 25 can be formed.

Incidentally, the temperature sensor 160 and the variable regulator 150 are coupled with the MCU unit 200 similarly with FIG. 23.

In an example of FIG. 24, a light emitting diode 26 is coupled to the MCU unit 200, and the light emitting diode 26 emits light by the control of the MCU unit 200. Then, the current-based sensor 25 detects light outputted from the light emitting diode 26, and a signal according to the detection is processed by the AFE unit 100 and the MCU unit 200.

Next, a configuration of the MCU unit 200 of the semiconductor device 1 according to this embodiment will be explained. In this embodiment, the configuration and the characteristic of the AFE unit 100 are set up and changed by the control of the MCU unit 200 as described above. In the MCU unit 200, by the CPU core 210 executing a program stored in the memory 220, a control of a configuration change (configuration setting) of the AFE unit 100 is realized.

Figure 25:
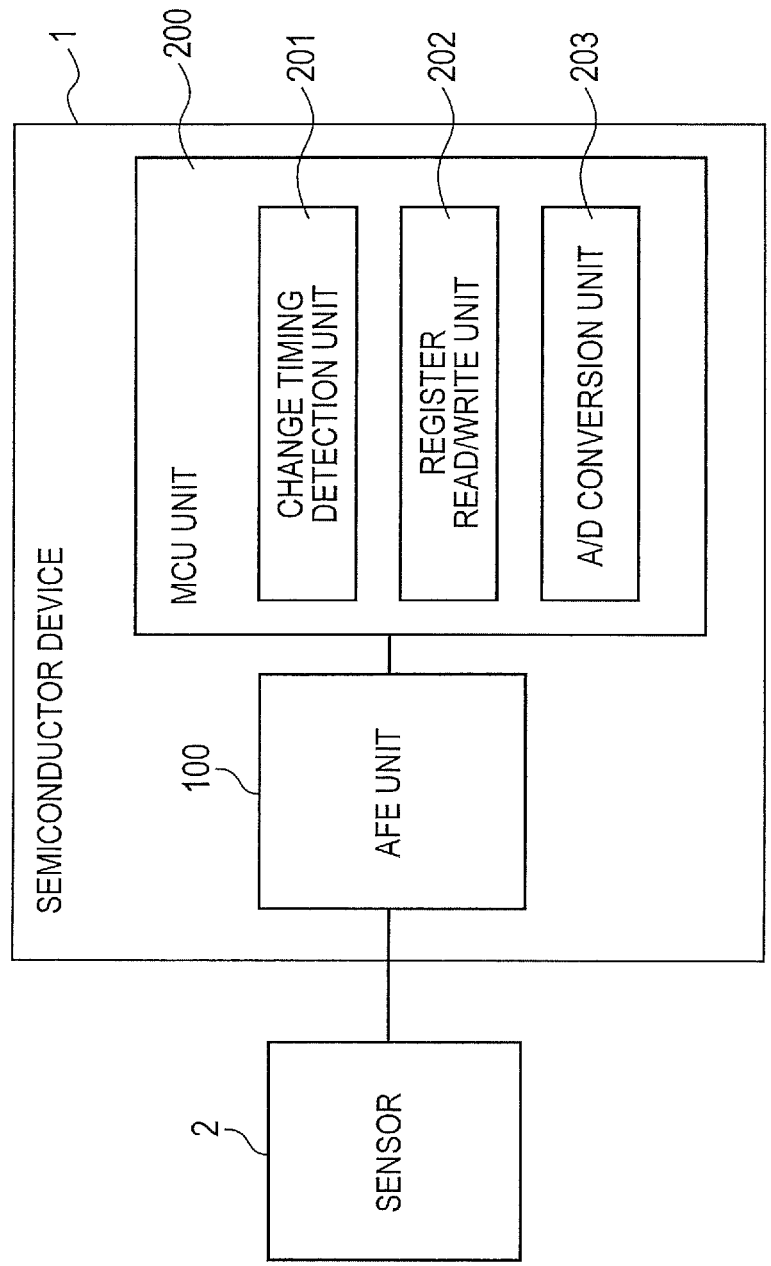
FIG. 25 is a functional block diagram of the semiconductor device according to the first embodiment of the present invention.

FIG. 25 shows an example of a functional configuration of the MCU unit 200 for performing the configuration change of the AF unit 100. As shown in FIG. 25, the MCU unit 200 has a change timing detection unit 201, a register read/write unit (configuration setting unit) 202, and an A/D converter unit 203. For example, the change timing detection unit 201 and the register read/write unit 202 are implemented by the CPU core 210 executing the program and the A/D converter unit 203 is implemented by the A/D converter 260.

The change (setting) timing detection unit 201 detects a timing at which settings of the configuration and the characteristic of the AFE unit 100 are changed, and notifies it to the register read/write unit 202. As the change timing, a direction from a computer apparatus outside the semiconductor device, signals from the timer 240 of the MCU unit 200 and the AFE unit 100 can be used. Moreover, when setting information of the register 181 has already been written in the memory 220, a timing of initialization at the time of starting the semiconductor device 1 serves as a setting timing.

According to the detection of the change timing detection unit 201, the register read/write unit (setting unit) 202 writes the configuration information to the register 181 of the AFE unit 100, and changes the configuration and the characteristic of the AFE unit 100. A content of the information to be written may be information inputted from an external computer apparatus, may be information previously stored in the memory 220, and may be information that the CPU core 210 generated by execution of a program.

Moreover, the register read/write unit 202 also performs reading of the register 181 of the AFE unit 100 according to a direction from an external computer apparatus. Incidentally, the register read/write unit 202 specifies the address of the register 181 to the AFE unit 100, as described above, and performs writing/reading.

The A/D converter unit 203 converts an analog signal outputted from the AFE unit 100 into a digital signal. Moreover, the A/D converter unit 203 switches over ON/OFF of an A/D conversion operation according to an operation of the register read/write unit 202.

By the configuration like this, the MCU unit 200 can switches over the configuration and the characteristic of the AFE unit 100 during an operation of the semiconductor device 1.

For example, in a fire alarm and an automatic faucet device, it is possible to enlarge a gain of the amplifier for every six-month or one-year elapse. Thereby, even when sensitivity of a sensor falls by dust or aged deterioration, the sensitivity of the sensor can be kept constant by enlarging the gain at fixed intervals, and the device can be made to perform a normal operation for the long term.

Moreover, the power-off mode of the AFE unit 100 is controllable according to an operating time. For example, the circuits of the AFE unit 100 can be made to perform intermittent operations by switching over ON/OFF of the power supplies thereof at a predetermined interval and the circuit that performs the intermittent operation can be selected freely. Therefore, low power consumption of the semiconductor device 1 can be attained.

Moreover, it is also possible to detect a characteristic of the sensor 2 that couples to the semiconductor device 1 and to automatically change the configuration and the characteristic of the AFE unit 100 according to the characteristic of the sensor 2. For example, it is possible to perform trimming that absorbs variation according to a characteristic variation of the sensor 2.

Figure 26:
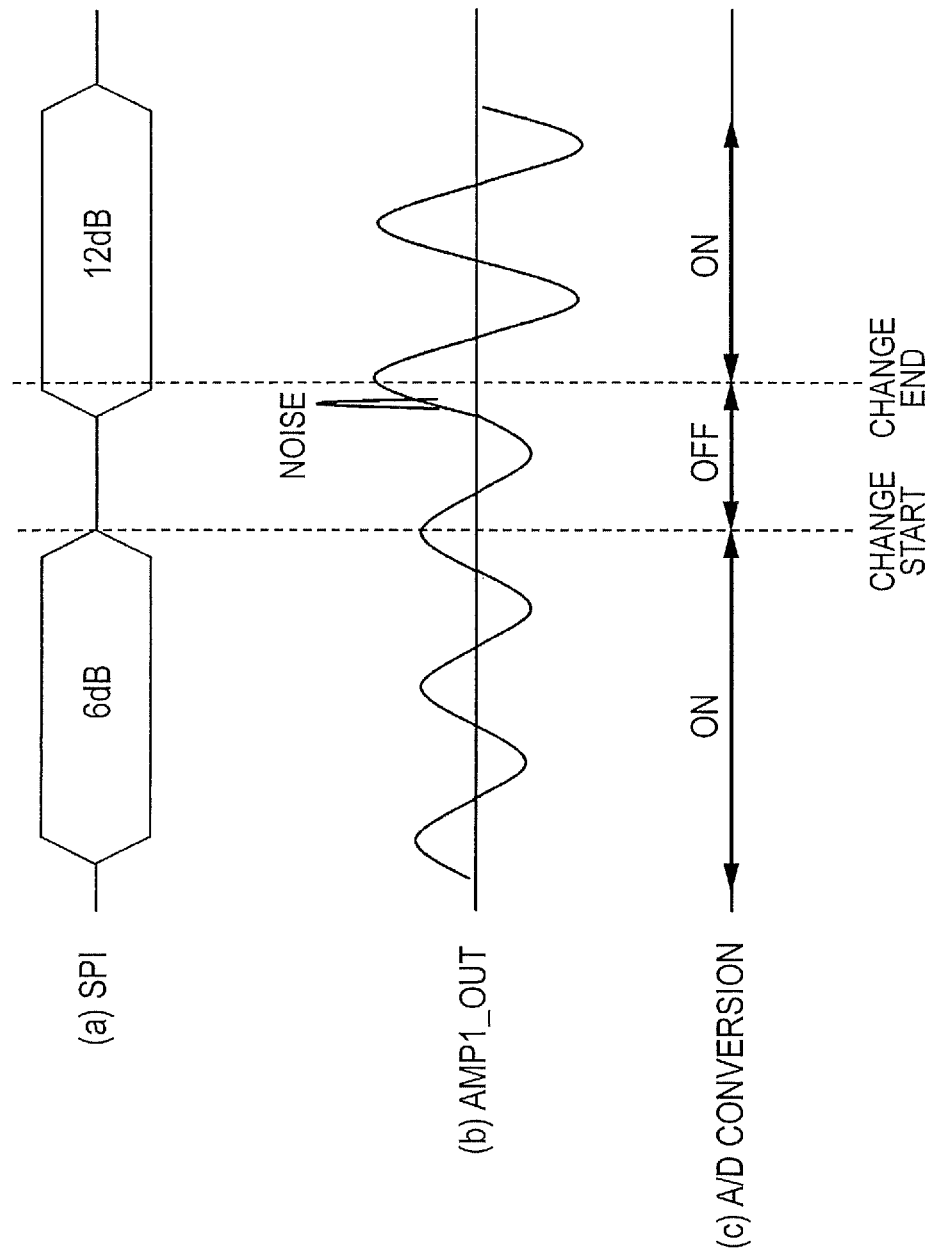
FIG. 26 is a timing chart showing an operation of the semiconductor device according to the first embodiment of the present invention.

Since the configuration and the characteristic of the circuit during an operation of the AFE unit 100 are changed by the control of the MCU unit 200, there is a possibility that a noise may occur in an output signal of the AFE unit 100. FIG. 26 shows an example of the output signal of the AFE unit 100 at the time of this configuration change.

As in FIG. 26A, through the SPI interface, the MCU unit 200 rewrites the register 181 of the AFE unit 100 and switches over the gain of the AMP1 from 6 dB to 12 dB. Then, since a resistance value of the variable resistance shown in FIG. 8 is changed in switching over the gain as shown in FIG. 26B, there is a possibility that a noise may occur in an output signal outputted from the operational amplifier of the AMP1.

For this reason, in this embodiment, as in FIG. 26C, ON/OFF of the A/D converter unit 203 is switched over. First, when the AMP1 is in operation of 6 dB, the A/D converter unit 203 is ON. When the change timing detection unit 201 detects a timing of the configuration change and the register read/write unit 202 starts writing to the register 181 of the AFE unit 100, the A/D converter unit 203 is turned OFF to suspend the A/D conversion. Then, when the writing of the register 181 is completed, the A/D converter unit 203 is turned ON to start the A/D conversion. By controlling in this way, since a noise at the time of the configuration change is not A/D converted, malfunction by the noise can be prevented.

Incidentally, the noise of the amplifier may be eliminated regardless of ON/OFF of the A/D conversion. For example, at the time of the configuration change, the noise may be filtered as a configuration of coupling the filter and the amplifier. Moreover, coupling with the MCU unit 200 may be cut temporarily by switching over a switch for selecting an output destination of the amplifier.

In the semiconductor device 1 according to this embodiment as described above, since it is necessary to decide the configuration and the characteristic of the AFE unit 100 according to a sensor to be coupled, evaluation of a register setting value is performed using the semiconductor device 1 in a design development of the semiconductor device 1 (sensor system) suitable for the sensor. Hereinafter, the setting evaluation performed in a development process of the semiconductor device 1 will be explained.

Figure 27:
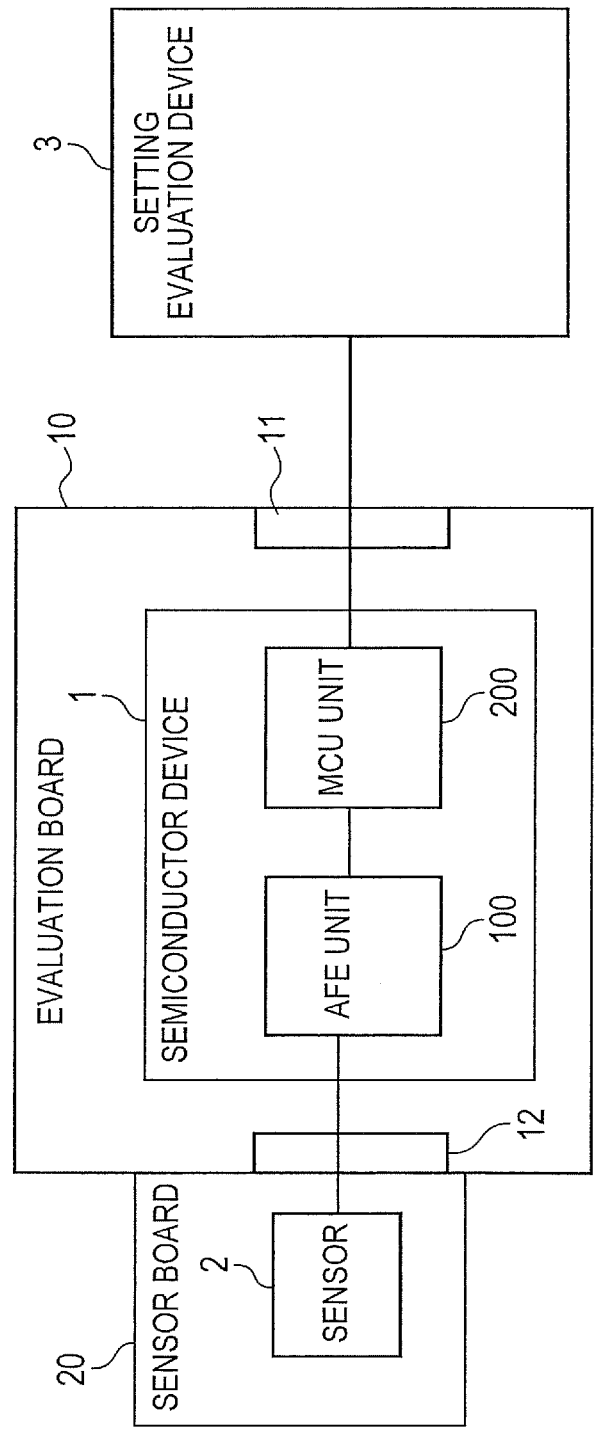
FIG. 27 is a configuration diagram of a setting evaluation system including the semiconductor device according to the first embodiment of the present invention.

FIG. 27 shows a configuration of the setting evaluation system (development support system) of the semiconductor device 1 according to this embodiment. As shown in FIG. 27, this setting evaluation system has a setting evaluation device 3, an evaluation board 10 that carries the semiconductor device 1, and a sensor board that carries the sensor 2.

The evaluation board 10 has a USB interface 11 and a sensor interface 12. The setting evaluation device 3 is coupled to the USB interface 11 by USB cable, and the setting evaluation device 3 is coupled to the semiconductor device so that inputting/outputting therebetween may be possible through the USB interface 11. A sensor board 20 establishes coupling with the sensor interface 12, and the sensor 2 and the semiconductor device 1 are coupled to be capable of input/output through the sensor interface 12.

The setting evaluation device (development support apparatus) 3 sets up the register 181 of the AFE unit 100 to the semiconductor device 1 by using a below-mentioned GUI. The semiconductor device 1 rewrites the register 181 according to a direction of the setting evaluation device 3, and performs amplification of an output signal of the sensor 2 and the A/D conversion. The setting evaluation device 3 acquires an A/D conversion result of the semiconductor device 1, checks an operation of the semiconductor device 1, and evaluates the setting value of the register 181.

Figure 28:
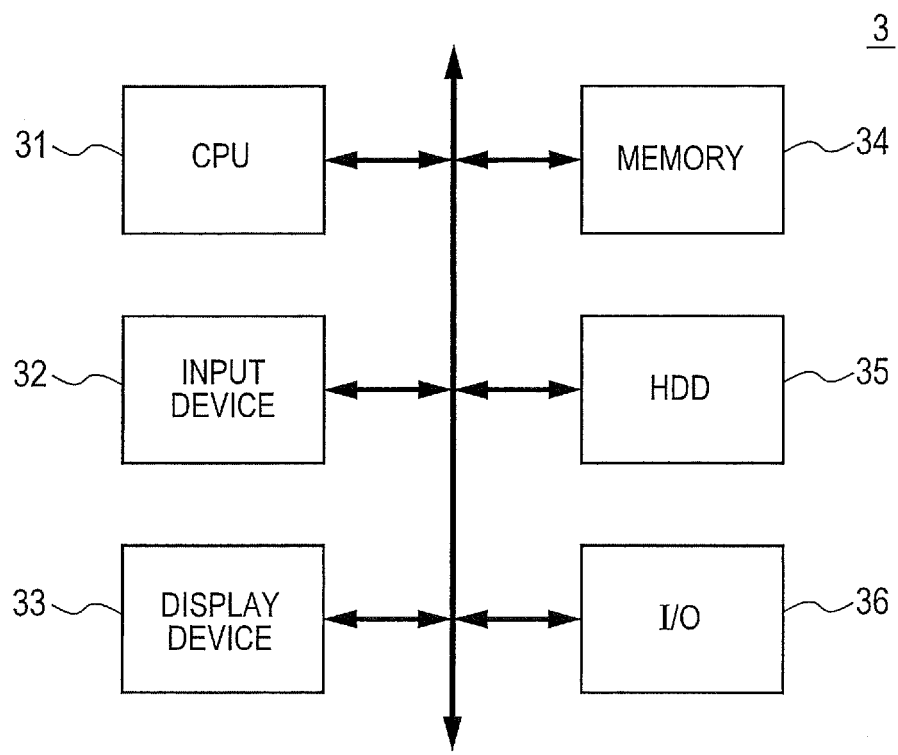
FIG. 28 is a hardware configuration diagram of a setting evaluation device of the semiconductor device according to the first embodiment of the present invention.

FIG. 28 shows an example of a hardware configuration of realizing the setting evaluation device 3. As shown in FIG. 28, the setting evaluation device 3 is computer system, such as a personal computer and a workstation, and includes a central processing unit (CPU) 31 and memory 34. The CPU 31 and the memory 34 are coupled to a hard disk drive (HDD) 35 serving as an auxiliary memory device through a bus. The setting evaluation device 3, as user interface hardware, has, for example, an input devices 32 with which a user makes an input, such as a pointing device (a mouse and a joy stick) and a keyboard, and a display device 33 on which visual data of the GUI is presented to the user, such as a CRT and a liquid crystal display. The setting evaluation device 3 can store a program for giving a command to the CPU 31 and making it perform a function of the setting evaluation device 3 in cooperation with the operating system in a storage medium such as the HDD 35. This program is executed by being loaded to the memory 34. Moreover, the setting evaluation device 3 has an input/output interface (I/O) 36, such as a USB coupled to the evaluation board 10. Incidentally, the setting evaluation device 3 may be not a single computer but can be comprised of multiple computers.

Figure 29:
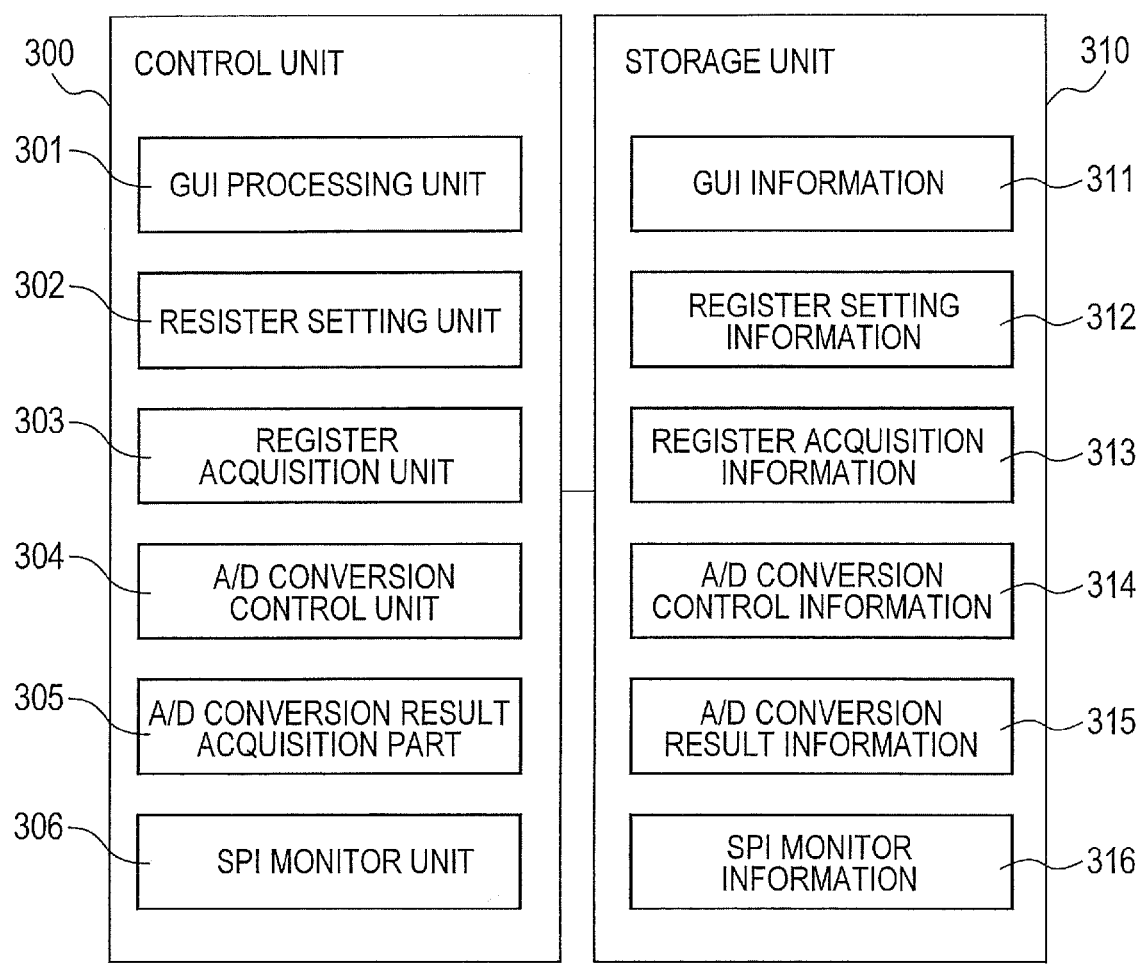
FIG. 29 is a functional block diagram of the setting evaluation device of the semiconductor device according to the first embodiment of the present invention.

FIG. 29 shows a functional block of the setting evaluation device 3. As shown in FIG. 29, the setting evaluation device 3 has a control unit 300 and a storage unit 310.

The control unit 300 realizes functions of the units by the CPU 31 executing a program. The control unit 300 has a GUI processing unit 301, a register setting unit 302, a register acquisition unit 303, an A/D conversion control unit 304, an A/D conversion result acquisition unit 305, and an SPI monitor unit 306.

The storage unit 310 is realized by the HDD 35 and the memory 34. The storage unit 310 stores GUI information 311, register setting information 312, register acquisition information 313, A/D conversion control information 314, A/D conversion result information 315, and SPI monitor information.

The GUI information 311 is information for displaying a GUI that includes a window for setting and evaluating the semiconductor device 1 as will be described later and the like. The GUI processing unit (GUI display unit) 301 displays the GUI on the display device 33 based on this GUI information 311, and further receives an input operation to the GUI by the user.

The register setting information 312 is setting information (configuration information) that is set up in the register 181 of the semiconductor device 1. The register setting unit (setting information generation unit and setting unit) 302 generates the register setting information 312 according to an input operation of the GUI, and directs the configuration change (setting) by outputting the generated register setting information 312 to the semiconductor device 1.

The register acquisition information 313 is the information of the register 181 acquired from the semiconductor device 1, and is the information written in the current register 181. The register acquisition unit 303 directs the semiconductor device 1 to acquire this register acquisition information 313, and outputs it to the user through the GUI.

The A/D conversion control information 314 is information of a parameter for the A/D conversion in the MCU unit 200 of the semiconductor device 1 and the like. In response to the input operation of the GUI, the A/D conversion control unit 304 generates this A/D conversion control information 314, outputs the A/D conversion control information 314 to the semiconductor device 1 to control the A/D conversion operation of the MCU unit 200.

The A/D conversion result information 315 is information showing an A/D conversion result in the MCU unit 200 of the semiconductor device 1. The A/D conversion result acquisition unit 305 directs the semiconductor device 1 to acquire this A/D conversion result information 315, and outputs it to the user through the GUI.

SPI monitor information 316 is communication information of the SPI interface between the MCU unit 200 and the AFE unit 100 in the semiconductor device 1. The SPI monitor unit 306 directs the semiconductor device 1 to acquire this SPI monitor information 316, and outputs it to the user through the GUI.

Figure 30:
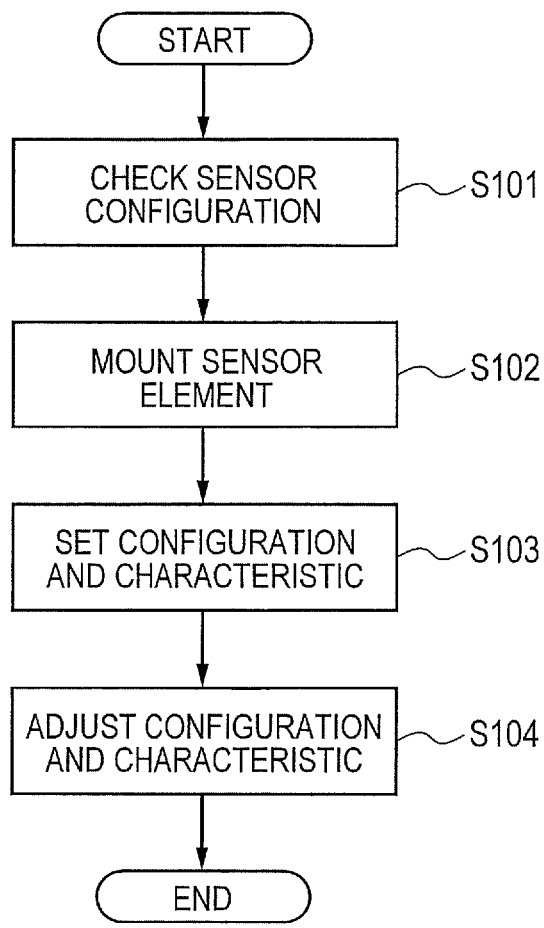
FIG. 30 is a flowchart showing a setting evaluation method of the semiconductor device according to the first embodiment of the present invention.

Next, a setting evaluation method (development method) of the semiconductor device 1 in the setting evaluation system shown in FIG. 27 will be explained using FIG. 30.

First, a configuration of the sensor 2 coupled to the semiconductor device 1 is checked (S101). That is, the circuit configuration, the characteristic, and the output signal of the sensor 2 are checked. For example, in the case where the sensor 2 is a Hall device, it takes a sensor configuration of bridge resistances and outputs a differential voltage as its output signal.

Subsequently, the sensor 2 is mounted to the semiconductor device 1 (S102). That is, the sensor 2 is attached to the sensor board 20, and the sensor board 20 is coupled to the sensor interface 12 of the evaluation board 10 carrying the semiconductor device 1.

Subsequently, a configuration and a characteristic of the semiconductor device 1 are set up by the setting evaluation device 3 (S103). That is, the setting evaluation device 3 is coupled to the evaluation board 10, and the user sets up the circuit configuration, an input terminal, a gain, and a bias of the AFE unit 100 in the semiconductor device 1 by operating the GUI of the setting evaluation device 3.

Subsequently, the user adjusts the configuration and the characteristic of the semiconductor device 1 with the setting evaluation device 3 (S104). That is, the semiconductor device 1 A/D converts the output signal of the sensor 2, and according to a result of this A/D conversion, the user sets up again the configuration and the characteristic of the semiconductor device 1 by operating the GUI of the setting evaluation device 3. For example, the user adjusts a DAC bias of the AFE unit 100 and performs the setting of an intermediate potential of the amplifier, while referring to the A/D conversion result with the GUI.

Next, a setting evaluation processing performed in the setting evaluation device 3 will be explained using FIG. 31. Incidentally, this setting evaluation is performed at S103 and S104 of FIG. 30. The setting evaluation device 3 stores a setting evaluation program for performing the setting evaluation processing of FIG. 31, and when the user executes the setting evaluation program, the following processing is started.

First, the GUI processing unit 301 displays ADC_Control window (S201). That is, when the setting evaluation program is run, the GUI processing unit 301 displays the ADC_Control window as a first window, The ADC_Control window is a window for controlling the A/D conversion of the semiconductor device 1 and is also a window for starting display of other windows.

Subsequently, the A/D conversion control unit 304 sets up the A/D conversion operation to the semiconductor device 1, and starts the A/D conversion (S202). The A/D conversion control unit 304 generates the A/D conversion control information 314 that is a parameter of the A/D conversion following an operation that the user entered to the ADC_Control window, and sets up the parameter of the A/D conversion in the MCU unit 200 of the semiconductor device 1. Then, following the operation of the ADC_Control window, the A/D conversion control unit 304 directs start of the A/D conversion to the MCU unit 200, and the MCU unit 200 starts the A/D conversion on the signal from the AFE unit 100.

Subsequently, the GUI processing unit 301 determines whether the ADC_Control window shall be closed (S203) and repeats steps S201, S202 until the user performs an operation of Close.

Moreover, the GUI processing unit 301 displays a SimpleViewConfig window (S204). That is, when the user performs an operation for displaying the SimpleViewConfig window in the ADC_Control window at S201, the GUI processing unit 301 displays this window. The SimpleViewConfig window is a window for setting up the configuration and the characteristic of the AFE unit 100 of the semiconductor device 1.

Subsequently, the register setting unit 302 sets up the register 181 of the semiconductor device 1 (S205). That is, according to an operation that the user entered to the SimpleViewConfig window, the register setting unit 302 generates the register setting information 312 that is the configuration information of the AFE unit 100 and outputs the register setting information 312 to the MCU unit 200, and the MCU unit 200 writes it in the register 181 of the AFE unit 100.

Subsequently, the GUI processing unit 301 determines whether the SimpleViewConfig window shall be closed (S206) and repeats steps S204, S205 until the user performs the operation of Close.

Moreover, the register acquisition unit 303 acquires the current configuration information from the register 181 of the semiconductor device 1 (S207). That is, when the user performs an operation for displaying the setting information of the register 181 in the ADC_Control window at S201, the register acquisition unit 303 directs the MCU unit 200 and reads the register 181 of the AFE unit 100 from the MCU unit 200 to acquire the register acquisition information 313 that was read.

Subsequently, the GUI processing unit 301 displays a RegisterList window (S208). That is, when having acquired the register acquisition information 313 from the semiconductor device 1, the GUI processing unit 301 displays the RegisterList window, and displays the acquired register acquisition information 313 in this window. By the RegisterList window, a content of the register 181 being set up in the AFE unit 100 can be checked.

Subsequently, the GUI processing unit 301 determines whether the RegisterList window shall be closed (S209) and repeats steps S207, S208 until the user performs the operation of Close.

Moreover, the A/D conversion result acquisition unit 305 acquires the A/D conversion result from the MCU unit 200 of the semiconductor device 1 (S210). That is, when the user performs an operation for displaying the A/D conversion result in the ADC_Control window at S201, the A/D conversion result acquisition unit 305 directs the MCU unit 200 to acquire the A/D conversion result information 315.

Subsequently, the GUI processing unit 301 displays a PortData window or Graph window (S211). That is, when having acquired the A/D conversion result information 315 from the semiconductor device 1, the GUI processing unit 301 displays the PortData window or the Graph window according to the user's operation, and displays the acquired A/D conversion result information 315 in this window. The PortData window displays the A/D conversion result information 315 numerically, and the Graph window displays the A/D conversion result information 315 in a graph.

Subsequently, the GUI processing unit 301 determines whether the PortData window or Graph window shall be closed (S212), and repeats steps S210, S211 until the user performs the operation of Close.

Moreover, the SPI monitor unit 306 acquires the SPI monitor information from the MCU unit 200 of the semiconductor device 1 (S213). That is, when the user performs an operation for displaying the SPI monitor information on the ADC_Control window at S201, the SPI monitor unit 306 directs the MCU unit 200 to acquire the SPI monitor information 316.

Subsequently, the GUI processing unit 301 displays an SPMonitor window (S214). That is, when having acquired the SPI monitor information 316 from the semiconductor device 1, the GUI processing unit 301 displays the SPMonitor window, and displays the acquired SPI monitor information 316 in this window.

Subsequently, the GUI processing unit 301 determines whether the SPMonitor window shall be closed (S215), and repeats steps S213, S214 until the user performs the operation of Close.

Next, a display example of the GUI displayed on the setting evaluation device 3 in each processing of FIG. 31 will be explained using FIG. 32 to FIG. 42.

Figure 31:
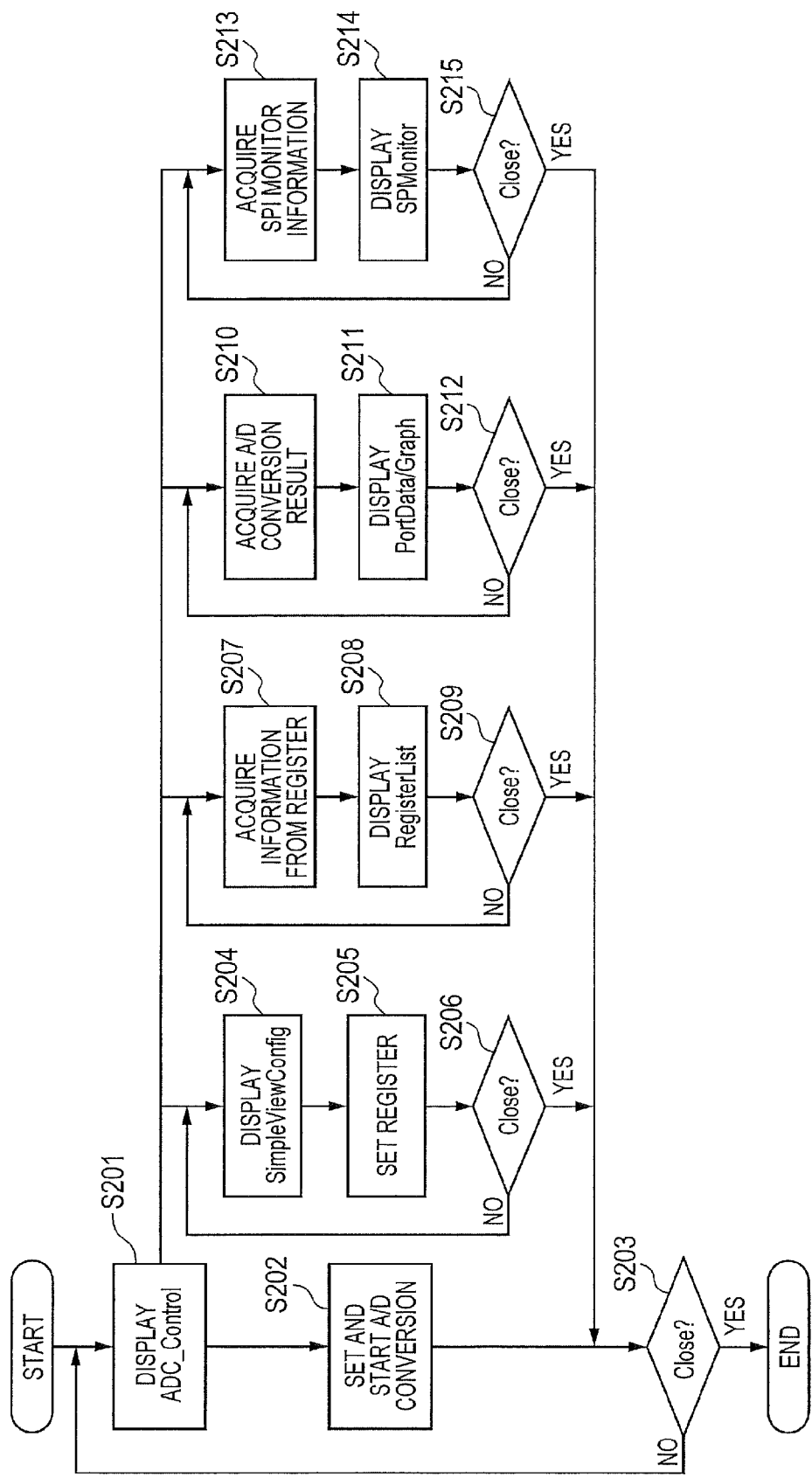
FIG. 31 is a flowchart showing the setting evaluation method of the semiconductor device according to the first embodiment of the present invention.
Figure 32:
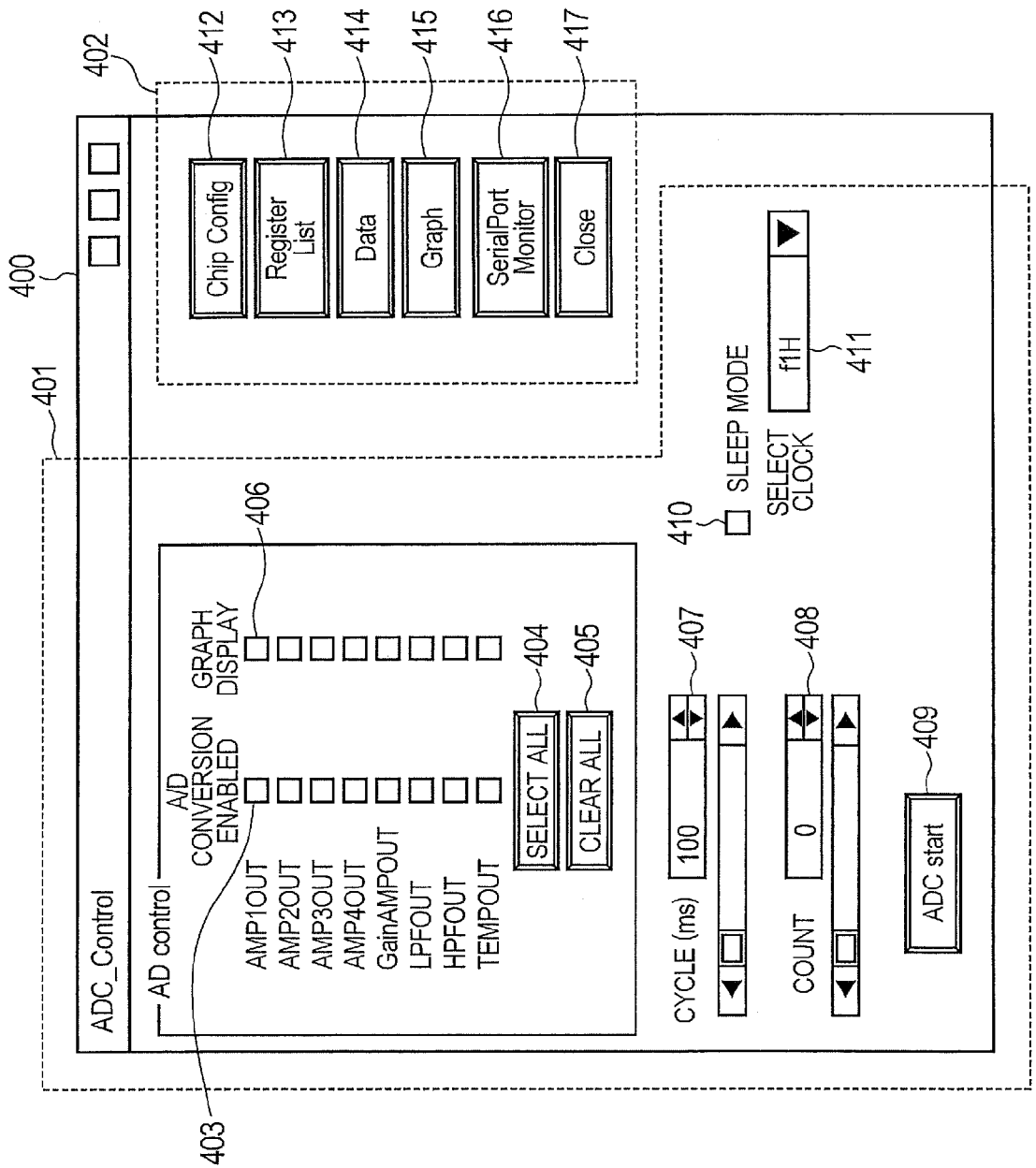
FIG. 32 is a display image diagram of a GUI used in setting evaluation of the semiconductor device according to the first embodiment of the present invention.

FIG. 32 is a display example of the ADC_Control window displayed at S201 of FIG. 31. As shown in FIG. 32, an ADC- Control window 400 has an A/D conversion control area 401 in which a parameter of the A/D conversion is set, and a window start area 402 for starting display of other windows. In the A/D conversion control area 401, when each parameter is entered, each time it is entered, a parameter is outputted to the MCU unit 200.

In the A/D conversion control area 401, an "A/D conversion enabled" check box 403 is for setting an enable of the A/D conversion by being checked. The MCU unit 200 of the semiconductor device 1 sets up whether the A/D conversion is performed on each output signal of the AFE unit 100. By an "all selection" button 404, all the check boxes can be checked collectively; by an "all clear" button 405, all the check boxes can be cleared collectively.

A "graphical representation" check box 406 is for selecting the output terminal that performs graphical representation by being checked. The user sets up which output signal of the AFE unit 100 is selected to display its A/D conversion result in the Graph window in which the graphical representation is performed.

A "cycle" input box 407 is for setting a sampling period of the A/D conversion in the MCU unit 200 in the unit of ms. It is possible to change a numerical value by a spin button of the input box, and also to change a numerical value by a scroll bar in a lower part of the input box.

A "count" input box 408 is for setting the number of times of performing the A/D conversion in the MCU unit 200. Incidentally, when "0" is entered, the setting becomes a case where the number of measurements is limitless, that is, the A/D conversion is repeated until the program is ended (until the window is closed). This can be set up with the spin button or the scroll bar like the "cycle."

An "ADCstart" button 409 is for setting up execution start of the A/D conversion in the MCU unit 200. When the "ADCstart" button 409 is clicked, the A/D conversion is started on a signal of the output terminal to which the A/D conversion is enabled in the MCU unit 200.

A "sleep mode" check box 410 is for setting ON/OFF of a sleep mode of the semiconductor device 1. When the box 410 is checked, the sleep mode is set as ON. For example, in the semiconductor device 1, the MCU unit 200 turns OFF the power supplies of the circuits of the AFE unit 100, which goes into the sleep mode.

A "Select clock" pull-down menu 411 is for selecting and setting a frequency of the clock generated in the MCU unit 200. The MCU unit 200 generates the selected clock by the oscillator 230, and operates using this as the operating clock.

In the window start area 402, each button corresponds to a window that is displayed, respectively. A "ChipConfig" button 412 is a button for displaying the SimpleViewConfig window. If this button is clicked, the SimpleViewConfig window will be displayed and the configuration and the characteristic of the AFE unit 100 of the semiconductor device 1 will be able to set up in the register 181 with the GUI.

A "RegisterList" button 413 is a button for displaying the RegisterList window. If this button is clicked, the RegisterList window will be displayed and the setting value of the register 181 of the AFE unit 100 will be able to be displayed.

A "Data" button 414 is a button for displaying the PortData window. If this button is clicked, the PortData window is displayed and data of the A/D conversion result in the MCU unit 200 will be able to be displayed numerically.

A "Graph" button 415 is a button for displaying the Graph window. If this button is clicked, the Graph window will be displayed and the A/D conversion result in the MCU unit 200 will be able to be displayed in a graph.

A "SerialPortMonitor" button 416 is a button for displaying the SPMonitor window. If this button is clicked, the SPMonitor window will be displayed and a transmission state of the SPI interface between the MCU unit 200 and the AFE unit 100 of the semiconductor device 1 will be able to be displayed.

A "Close" button 417 is a button for closing this ADC_Control window 400 and ending the program. This button corresponds to S203 of FIG. 31.

Figure 33:
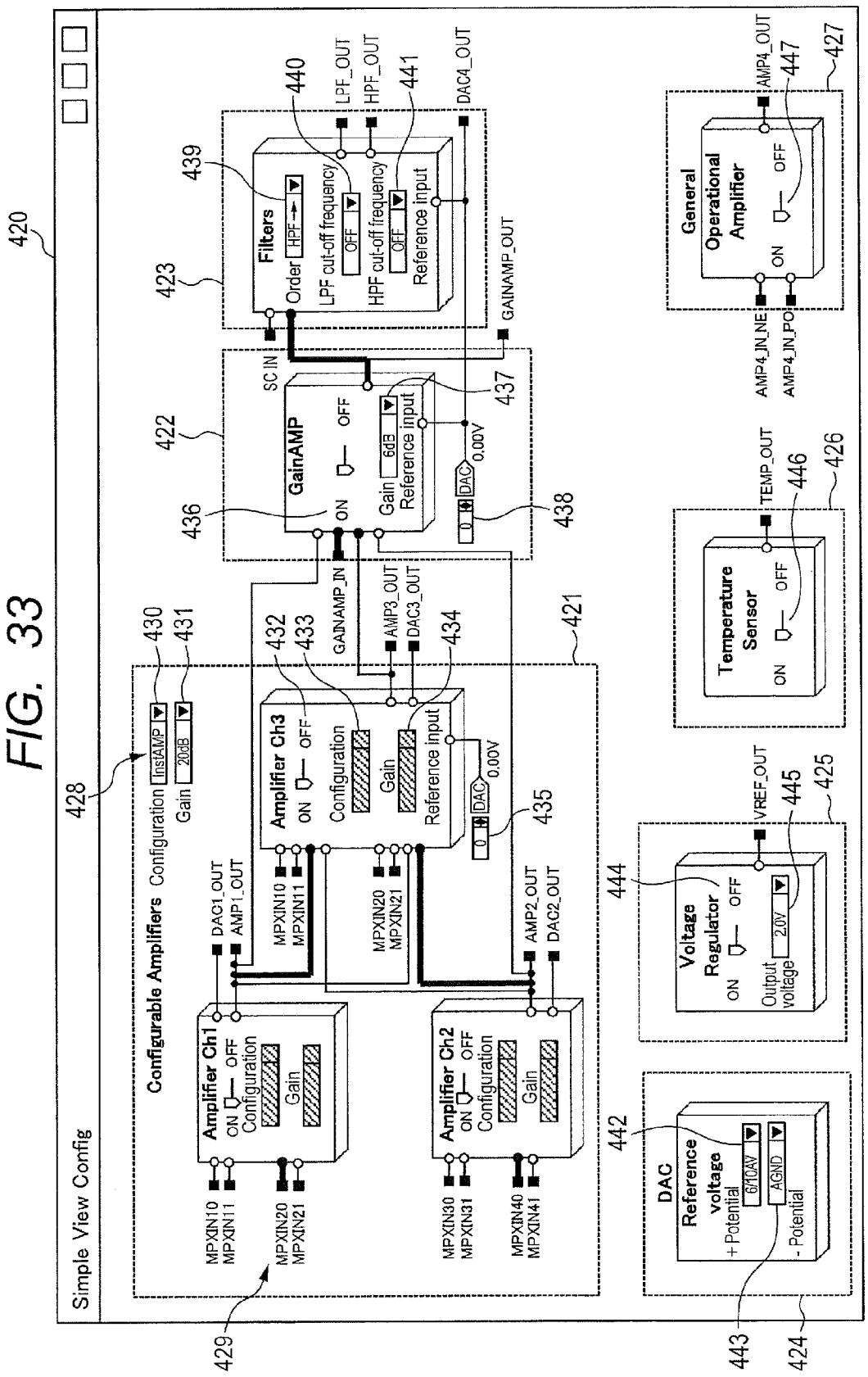
FIG. 33 is a display image diagram of the GUI used in the setting evaluation of the semiconductor device according to the first embodiment of the present invention.

FIG. 33 shows a display example of the SimpleViewConfig window displayed at S204 of FIG. 31. As shown in FIG. 33, a SimpleViewConfig window 420 has a configurable amplifier setting area 421 in which a setting of the configurable amplifier 110 is performed, a gain amplifier setting area 422 in which a setting of the gain amplifier 120 is performed, a filter circuit setting area 423 in which a setting of the low-pass filter 130 and the high-pass filter 140 is performed, a DAC reference voltage setting area 424 in which a reference voltage of the DAC coupled to operational amplifiers is performed, a variable regulator setting area 425 in which a setting of the variable regulator 150 is performed, a temperature sensor setting area 426 in which a setting of the temperature sensor 160 is performed, and a general purpose amplifier setting area 427 in which a setting of the general purpose amplifier 170 is performed.

The configurable amplifier setting area 421 has an entire setting area 428 in which a setting of the entire configurable amplifier is performed and an individual setting area 429 in which the AMP1, the AMP2, and the AMP3 of the Ch1, Ch2, and Ch3 are set up individually. In the individual setting area 429, areas of the respective amplifiers are displayed so that the AMP1, the AMP2, and the AMP3 can be set up, respectively.

In the entire setting area 428, a "Configuration" pull-down menu (entire configuration setting unit) 430 is for selecting and setting up a circuit configuration of the entire configurable amplifier 110. Here, when "InstAMP" is selected, the instrumentation amplifier in which the amplifiers of Ch1 to Ch3 are coupled is formed. Then, only when the amplifiers are set as "InstAMP," the gain of the instrumentation amplifier can be selected and set up with a "gain" pull-down menu (entire characteristic setting unit) 431.

Figure 34:
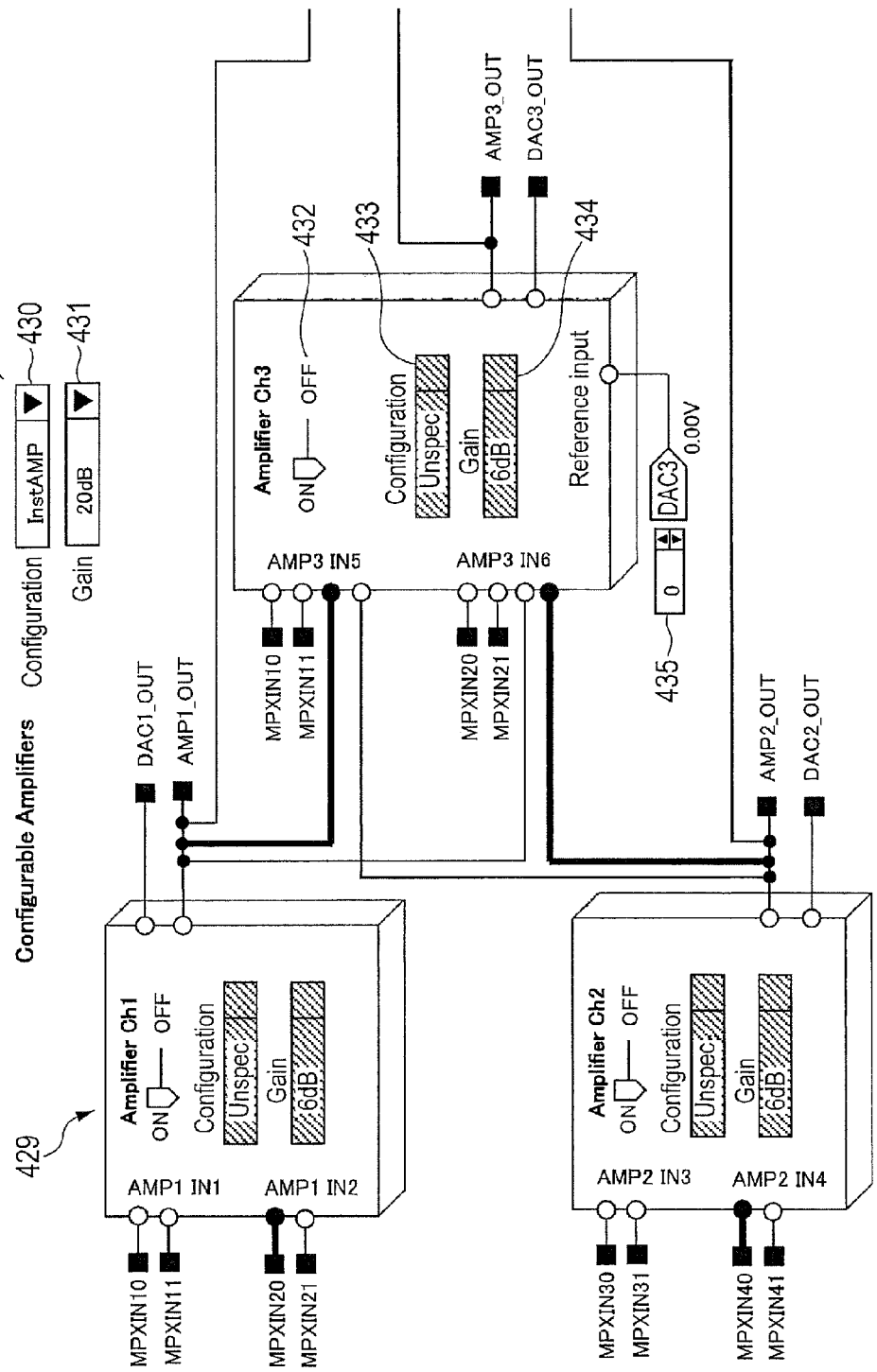
FIG. 34 is a display image diagram of the GUI used in the setting evaluation of the semiconductor device according to the first embodiment of the present invention.

FIG. 34 is a display example where the "InstAMP" is selected in the "Configuration" pull-down menu 430. As shown in FIG. 34, in this case, the instrumentation amplifier has a configuration in which the amplifiers of Ch1 to Ch3 are automatically coupled, becoming a state where each of the amplifiers of the Ch1 to Ch3 cannot be set up. That is, only the gain of the entire instrumentation amplifier and the DAC of the AMP3 can be set up.

Figure 35:
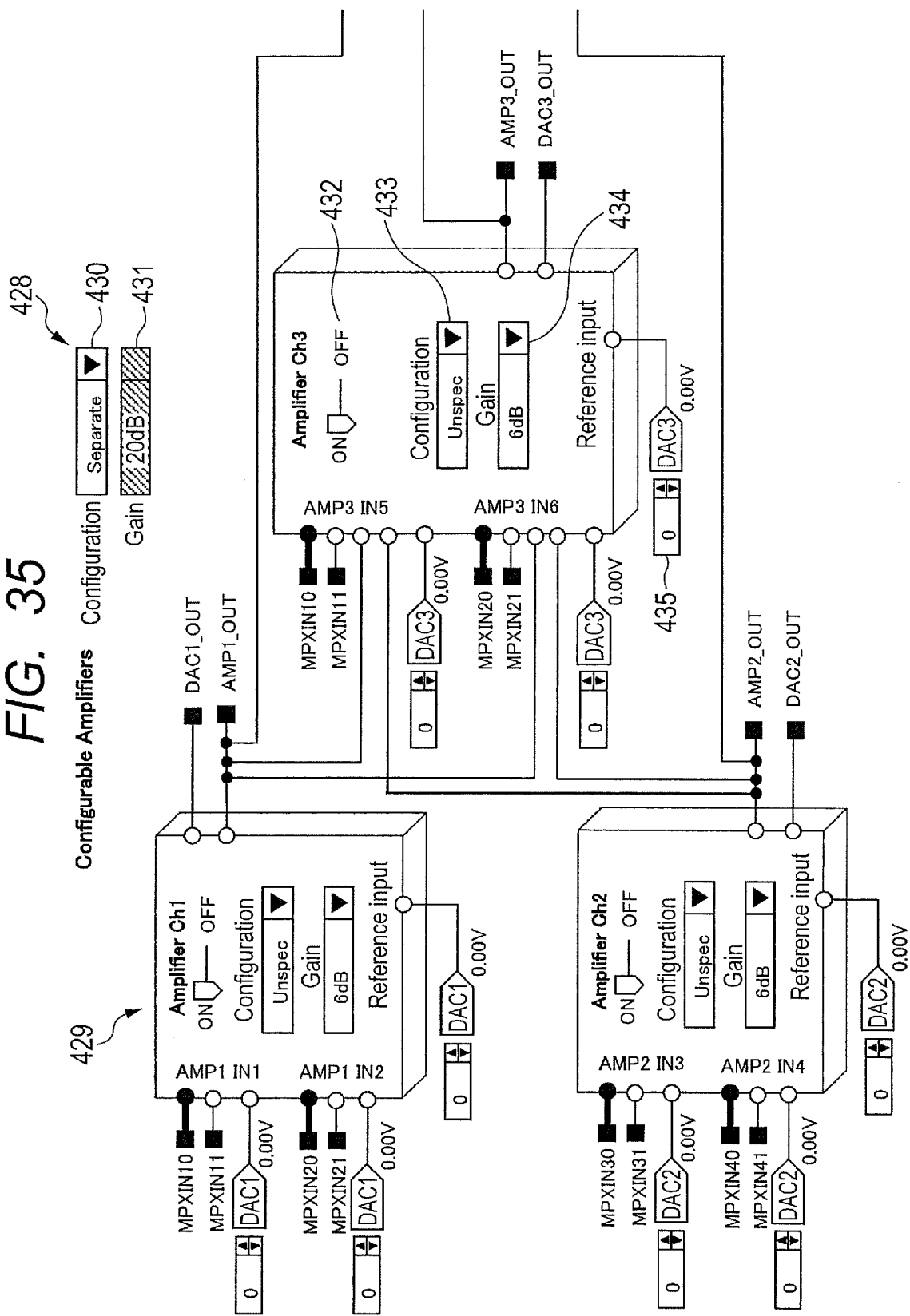
FIG. 35 is a display image diagram of the GUI used in the setting evaluation of the semiconductor device according to the first embodiment of the present invention.

When "Separate" is selected in the "Configuration" pull-down menu 430 of FIG. 33, becoming a state where the Ch1 to Ch3 of the configurable amplifier can be set up individually. FIG. 35 shows a display example when "Separate" is selected. As shown in FIG. 35, in this case, each of the amplifiers of Ch1 to Ch3 has a configuration of being not coupled and independent, i.e., its configuration and characteristic can be set up individually. That is, a configuration, a gain, and a DAC of each amplifier can be set up and the entire gain cannot be set up.

As shown in FIG. 35, in the individual setting area 429, a name of the amplifier to be set up is displayed in its upper part, being displayed as "Amplifier Ch1," "Amplifier Ch2," and "Amplifier Ch3," respectively.

An "ON/OFF" slide switch 432 is for setting power ON/OFF of the individual amplifier. A knob of the slide switch 432 is dragged/dropped to set the ON/OFF.

A "Configuration" pull-down menu (individual configuration setting unit) 433 is for selecting and setting up a circuit configuration of the individual amplifier. Here, when "Invertor" is selected, a configuration of the individual amplifier is set as the inverting amplifier; when "Forward" is selected, a configuration of the individual amplifier is set as the non-inverting amplifier; when "Diff" is selected, a configuration of the individual amplifier is set as a differential amplifier; when "I/V" is selected, a configuration of the individual amplifier is set as the I/V amplifier; and respective circuit configurations are set up automatically.

Moreover, when "Custom" is selected in the "Configuration" pull-down menu 433, the inside of individual amplifier can be set up in detail. Incidentally, also when an icon of each of the amplifiers Ch1 to Ch3 is clicked, a detailed setting is possible.

Figure 36:
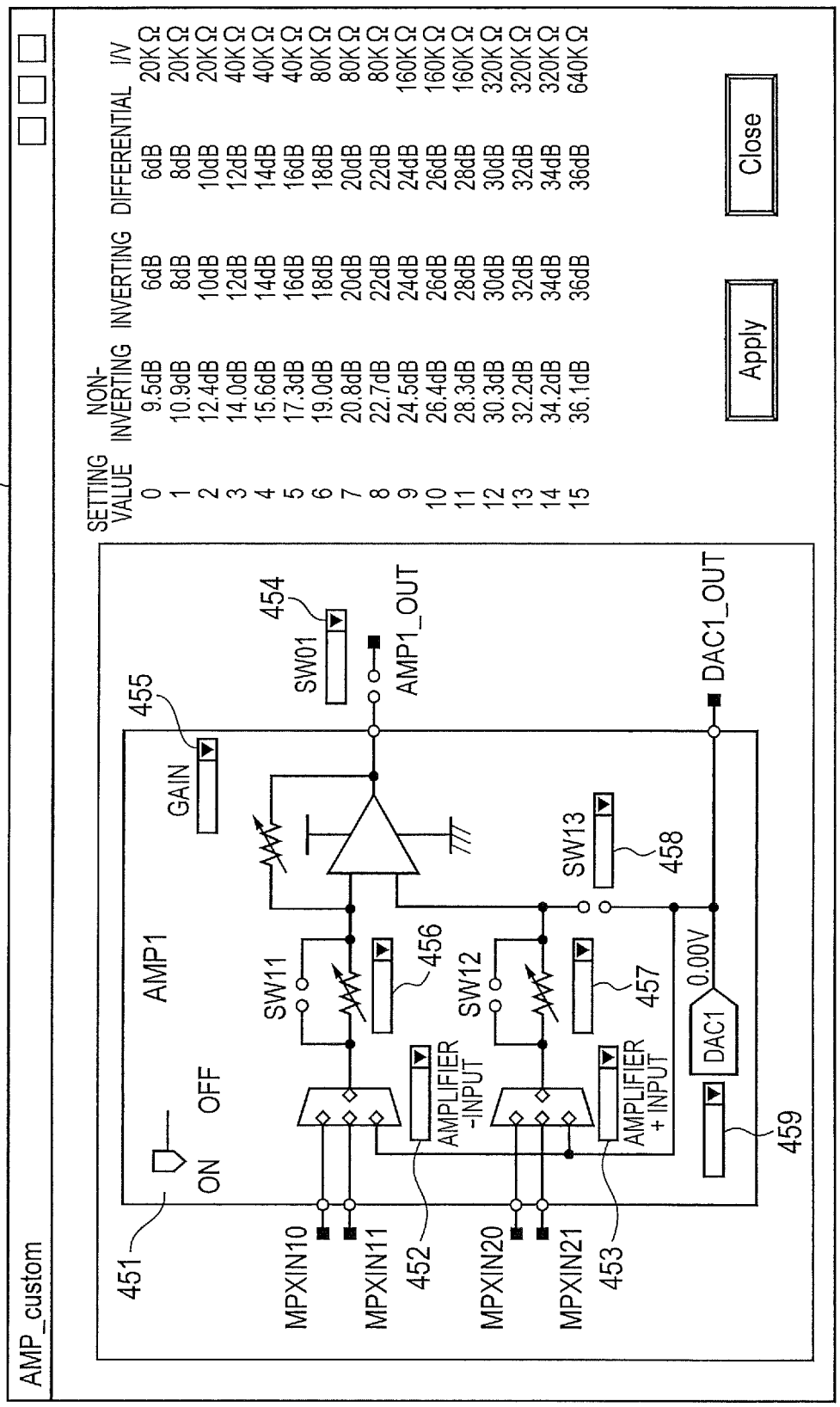
FIG. 36 is a display image figure of the GUI used in the setting evaluation of the semiconductor device according to the first embodiment of the present invention.

Specifically, as shown in FIG. 36, an AMP_Custom window is displayed and enables the user to perform the setting. In this AMP_Custom window 450, the same circuit image as an actual circuit configuration of the individual amplifier is displayed.

ON/OFF of a power supply of the amplifier is set by a slide switch 451, coupling destinations of the input terminal and the output terminal of the amplifier are set with pull-down menus 452 to 454, the gain of the amplifier is set with a pull-down menu 455, couplings of the input resistance and the DAC are set with pull-down menus 456 to 458, and the output voltage of the DAC is set with a pull-down menu 459. Incidentally, since the setting of the gain is different according to a configuration of the amplifier, a setting value displayed in a setting value display area 460 is set.

Moreover, as shown in FIG. 35, a "gain" pull-down menu (individual characteristic setting unit) 434 is for selecting and setting up a gain of the individual amplifier. When the circuit configuration is set to "I/V," a display of the pull-down menu shows a feedback resistance value. For example, it is all right to display so that a selectable range may be changed according to the circuit configuration.

A "DAC" input box (individual characteristic setting unit) 435 is for setting an output voltage of an 8-bit DAC. Incidentally, the setting values of multiple DACs may be interlocked. Any number of 0 to 255 can be entered into this input box, and the setting value can be increased or decreased in increments of "1" with the spin button of the input box. Then, when a number is entered into the input box, an actual DAC output voltage value is displayed on the lower right of the icon of the DAC.

Other areas of FIG. 33 will be explained. As shown in FIG. 33, in the gain amplifier setting area 422, "GainAMP" is displayed in its upper part as a name of the circuit to be set up.

In the gain amplifier setting area 422, like the configurable amplifier, power ON/OFF is set with a slide switch 436, its gain is set with a pull-down menu 437, and an output of the DAC is set with an input box 438. This setting of the DAC is made common to that of the filter.

In the filter circuit setting area 423, "Filters" is displayed in its upper part as a name of the circuit to be set up.

An "Order" pull-down menu 439 is for selecting and setting up a passing order of the filter circuits. Here, when "LPF" is selected, the filter circuits are automatically set to have a configuration that allows the signal to pass through only the low-pass filter 130; when "HPF" is selected, they are automatically set to have a configuration that allows the signal to pass through only the high-pass filter 140; when "LPF→HPF" is selected, they are automatically set to have a configuration that allows the signal to pass through the low-pass filter 130 and the high-pass filter 140 in this order; and when "HPF→LPF" is selected, they are automatically set to have a configuration that allows the signal to pass through the high-pass filter 140 and the low-pass filter 130 in this order.

An "LPF cut-off frequency" pull-down menu 440 is for selecting and setting up the cut-off frequency of the low-pass filter 130, and an "HPF cut-off frequency" pull-down menu 441 is for selecting and setting up a cut-off frequency of the high-pass filter 140. Incidentally, the pull-down menu may be made capable of setting ON/OFF of power supplies of the low-pass filter 130 and the high-pass filter 140.

In the DAC reference voltage setting area 424, "DACReference voltage" is displayed in its upper part as a name of the circuit to be set up.

A "+ Potential" pull-down menu 442 is for setting a setting voltage upper limit of each 8-bit DAC (DACs 1 to 4). Here, when "AVDD" is selected, the setting voltage upper limit of each 8-bit DAC (DACs 1 to 4) is set to AVDD. When "⅘AVDD" is selected, the setting voltage upper limit of each 8-bit DAC (DACs 1 to 4) is set to (⅘)×AVDD. When "⅗AVDD" is selected, the setting voltage upper limit of each 8-bit DAC (DACs 1 to 4) is set to (⅗)×AVDD.

A "− Potential" pull-down menu 443 is for setting a setting voltage lower limit of each 8-bit DAC (DACs 1 to 4). When "AGND" is selected, the setting voltage lower limit of each 8-bit DAC (DACs 1 to 4) is set to AGND. When "⅕AVDD" is selected, the setting voltage lower limit of each 8-bit DAC (DACs 1 to 4) is set to (⅕)×AVDD. When "⅖AVDD" is selected, the setting voltage lower limit of each 8-bit DAC (DACs 1 to 4) is set to (⅖)×AVDD.

In the variable regulator setting area 425, "Voltage Regulator" is displayed in its upper part as a name of the circuit to be set up. Here, power ON/OFF is set with a slide switch 444 like the configurable amplifier.

An "Output voltage" pull-down menu 445 is for selecting and set an output voltage of the variable regulator 150.

In the temperature sensor setting area 426, "Temperature Sensor" is displayed in its upper part as a name of the circuit to be set up. Here, power ON/OFF is set with a slide switch 446 like the configurable amplifier.

In the general purpose amplifier setting area 427, "General Operational Amplifier" is displayed in its upper part as a name of the circuit to be set up. Here, power ON/OFF is set with a slide switch 447 like the configurable amplifier.

Figure 37:
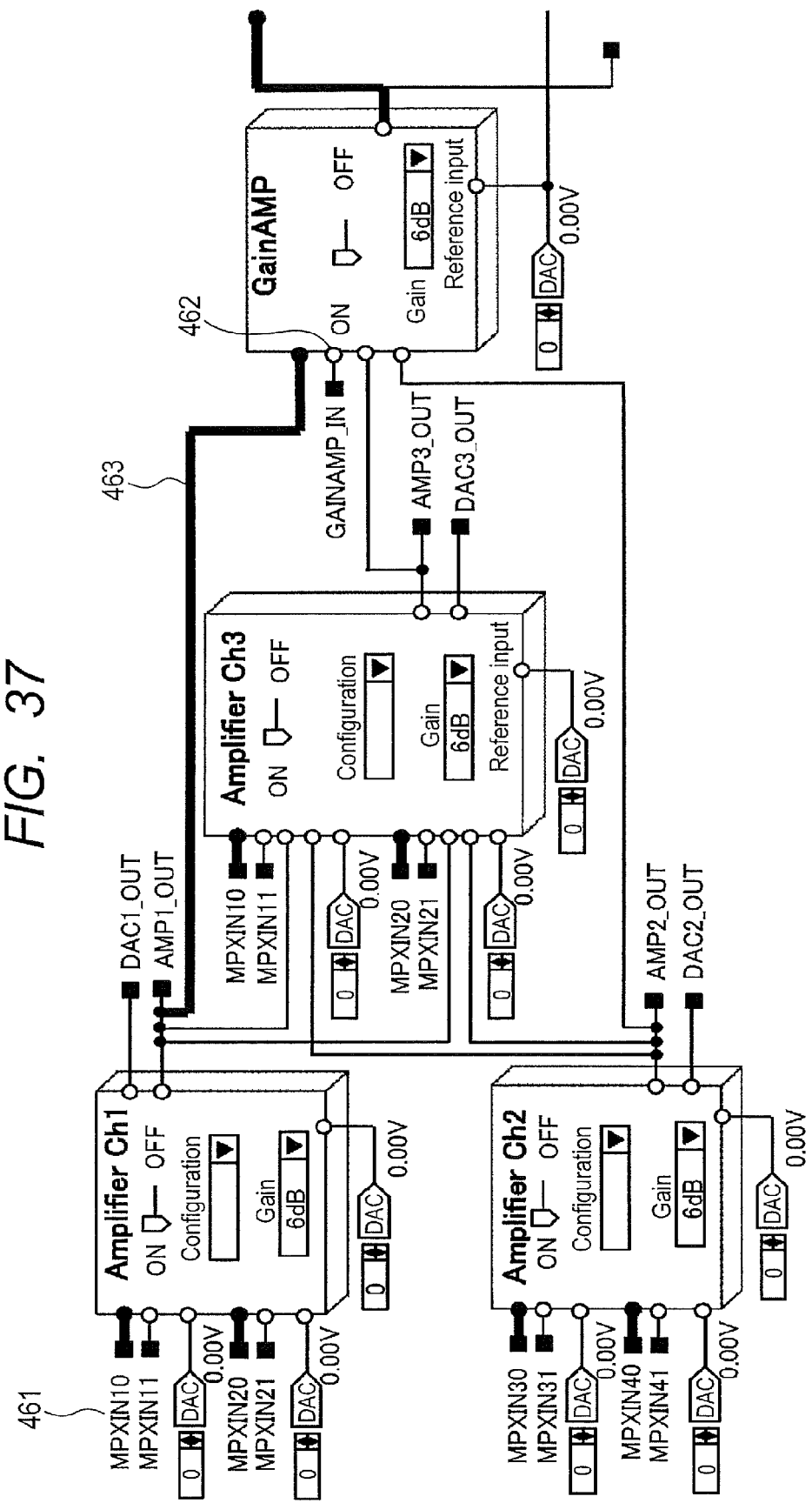
FIG. 37 is a display image diagram of the GUI used in the setting evaluation of the semiconductor device according to the first embodiment of the present invention.

Moreover, coupling of each contact terminal can be set up in the SimpleViewConfig window. FIG. 37 is a display example of couplings of terminals. Each external terminal of the AFE unit 100 is shown by a square figure, and an external terminal name is shown beside the square mark.

Internal terminals of each circuit inside the AFE unit 100 are displayed with figures of circles. The internal terminal of an open circle is a terminal not yet coupled, and the internal terminal of a solid circle is a terminal already coupled. For example, if the open circle of a symbol 462 is clicked, its representation will be changed to the solid circle, which indicates being in a coupled state.

In each wire, a thin wire is a wire not yet coupled, and a thick wire indicates a wire already coupled like a symbol 463. Switching may be configured so that when the thin wire is clicked, it is switched over to the thick wire indicating the coupled state.

Incidentally, although in the above, FIG. 36 was explained as a detailed circuit setting, also each circuit other than the configurable amplifier can be set up in detail by displaying an actual circuit configuration as in FIG. 36.

Figure 38:
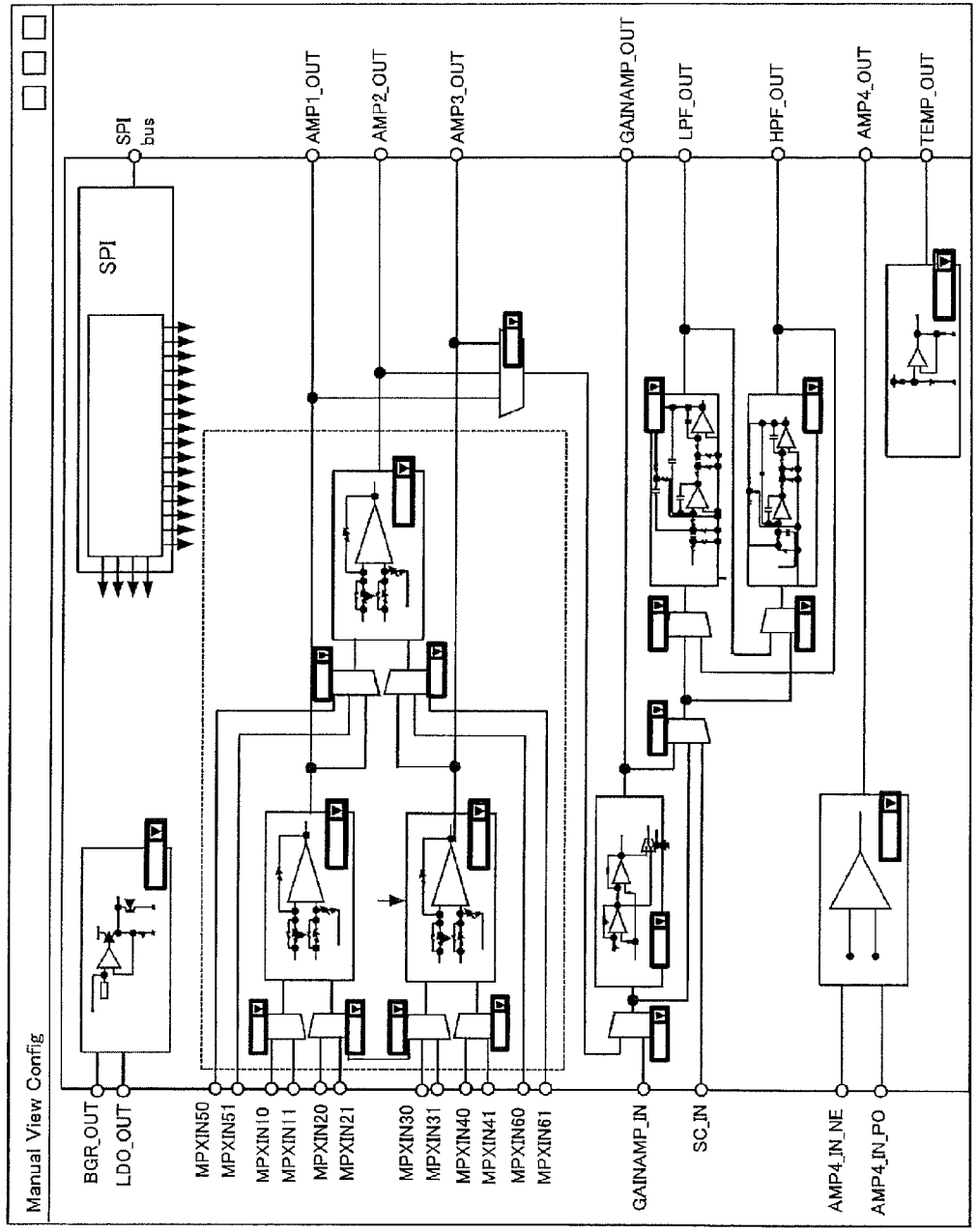
FIG. 38 is a display image diagram of the GUI used in the setting evaluation of the semiconductor device according to the first embodiment of the present invention.

Moreover, one window may be modified to enable each circuit to be set up in detail. For example, like in FIG. 38, one window may be modified so as to be able to display all the circuit images simultaneously, enabling the user to perform the setting of them. FIG. 38 is a display example of Manual-ViewConfig window that displays a circuit image corresponding to the circuit configuration of FIG. 3 and enables the user to set it up in detail. In FIG. 38, the circuits of the AFE unit 100 are displayed and pull-down menus for setting up respective circuits are displayed. Incidentally, since a setting method and setting details are the same as those of the above, their explanations are omitted.

Figure 39:
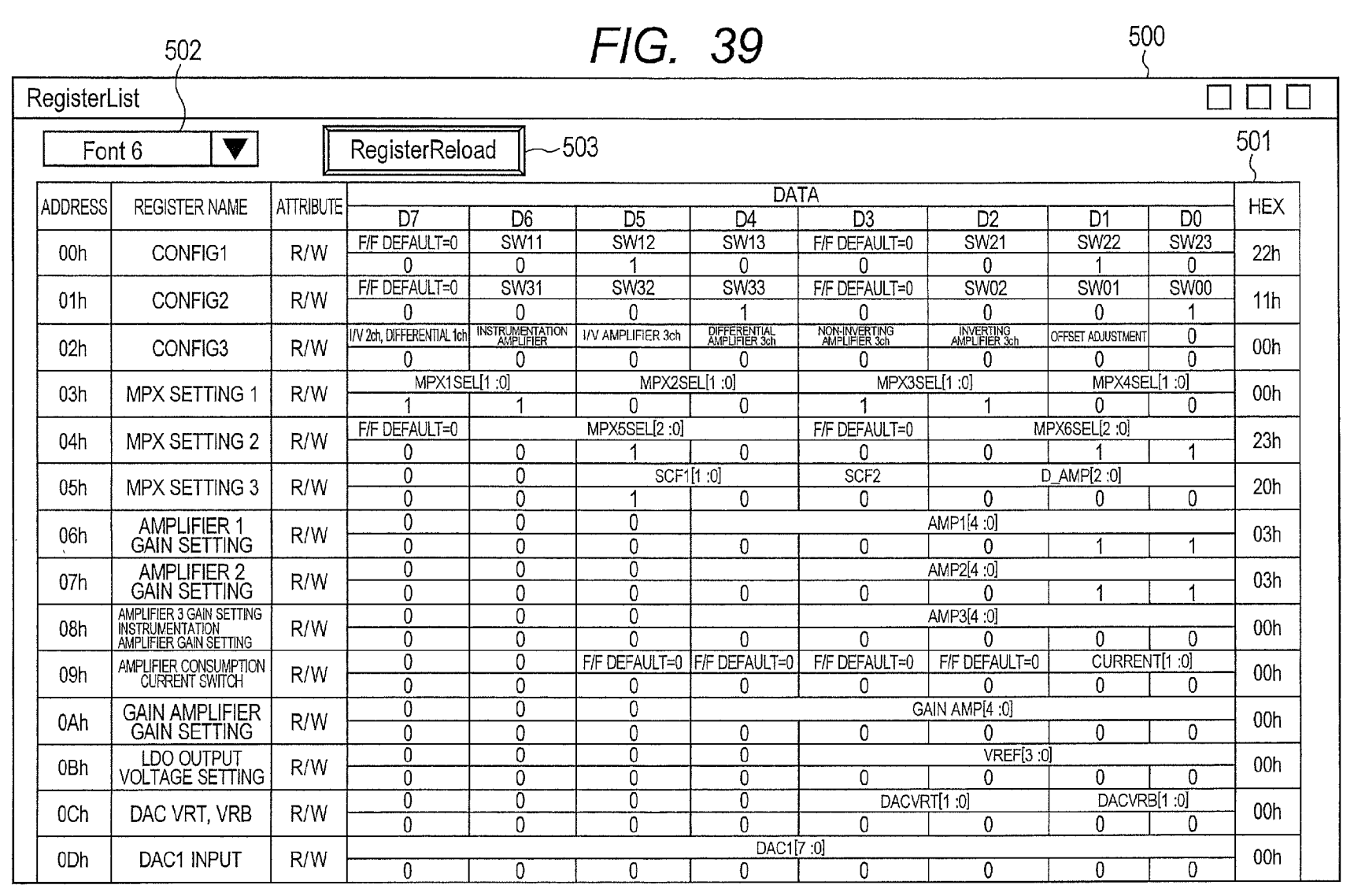

FIG. 39 shows a display example of the RegisterList window displayed at S208 of FIG. 31. As shown in FIG. 39, in a RegisterList window 500, a list of register setting values is displayed in the register display area 501.

The register display area 501 lists items of an address, a register name, an attribute of the register, and a bit representation and a HEX representation of register data for each address of the register. By displaying the register name, the user can understand at a glance what the register is for setting up. Moreover, by displaying a meaning of each bit of the data, the user can understand what a bit of each data is intended to set up.

A "Font" pull-down menu 502 enables the user to select and specify a font size of the register display area 501. A "RegisterReload" button 503 is for re-acquiring the setting value of the register from the semiconductor device 1 by the button being clicked.

FIG. 40 shows a display example of the PortData window displayed at S211 of FIG. 31. As shown in FIG. 40, in a PortData window 510, the A/D conversion result is displayed in the data display area 511. In the data display area 511, the data is displayed in cells arranged in a matrix (in columns and rows). A count number of the A/D conversion is displayed in a Count column, and a numerical value of the A/D conversion result is displayed in each Ch column. Here, only the output signal that is given A/D conversion enabled in the ADC_Control window is displayed. Incidentally, an output terminal of the AFE unit may be displayed.

Moreover, as shown in FIG. 41, a "File" menu 512, an "Edit" menu 513, and a "View" menu 514 are displayed in the PortData window 510. For example, in the "File" menu 512, the A/D conversion result can be outputted to a file by selecting "attach name and store (A)." In the "Edit" menu 513, a part of or all of data can be copied and pasted to an other file by selecting "Copy (C)."

A format of data display can be selected in the "View" menu 514. Here, when "decimal" is selected, the A/D conversion result is displayed in decimals; when "hexadecimal" is selected, the A/D conversion result is displayed in hexadecimals. Moreover, when "automatic scroll" is selected, if the A/D conversion is performed repeatedly, the A/D conversion result will be displayed one by one being automatically scrolled.

Figure 42:
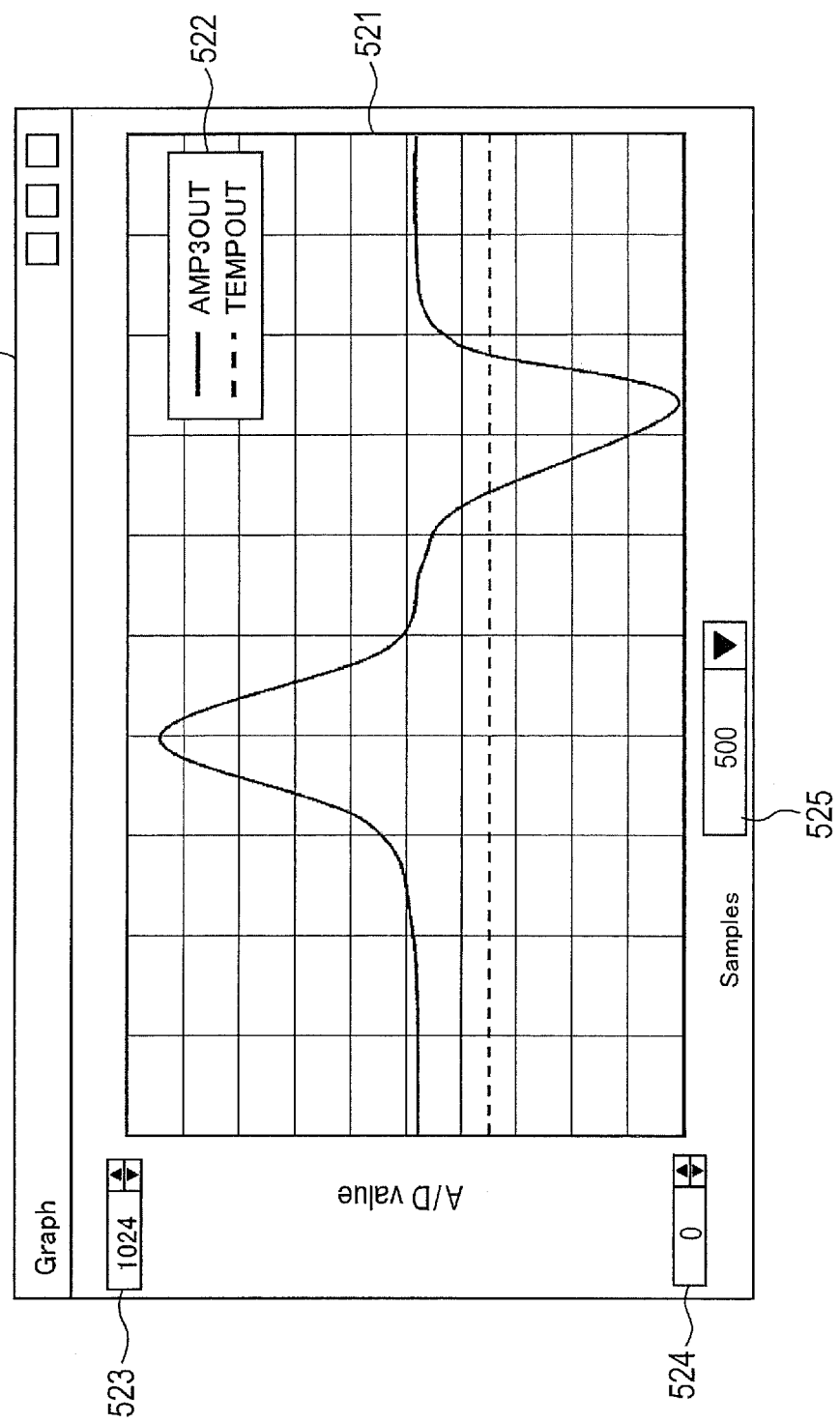
FIG. 42 is a display image diagram of the GUI used in the setting evaluation of the semiconductor device according to the first embodiment of the present invention.

FIG. 42 is a display example of the Graph window displayed at S211 of FIG. 31. As shown in FIG. 42, in a Graph window 520, the A/D conversion result is displayed in a graphical representation area 521. In the graphical representation area 521, display is done with a time on a horizontal axis and the A/D conversion result on a vertical axis.

Graph legends are displayed in a legend display area 522. Here, an output for which the graphical representation is checked in the ADC_Control window is displayed.

With a maximum input box 523, a maximum on the vertical axis of the graph can be set up. For example, a default is set to 1024. Moreover, with a minimum input box 524, a minimum on the vertical axis of the graph can be set up. For example, the default is set to zero.

A "Sample" pull-down menu 525 is for selecting a Sample number displayed on the horizontal axis of the graph. For example, a scale of the horizontal axis is fixed to 50 [Sample/div].

Figure 43:
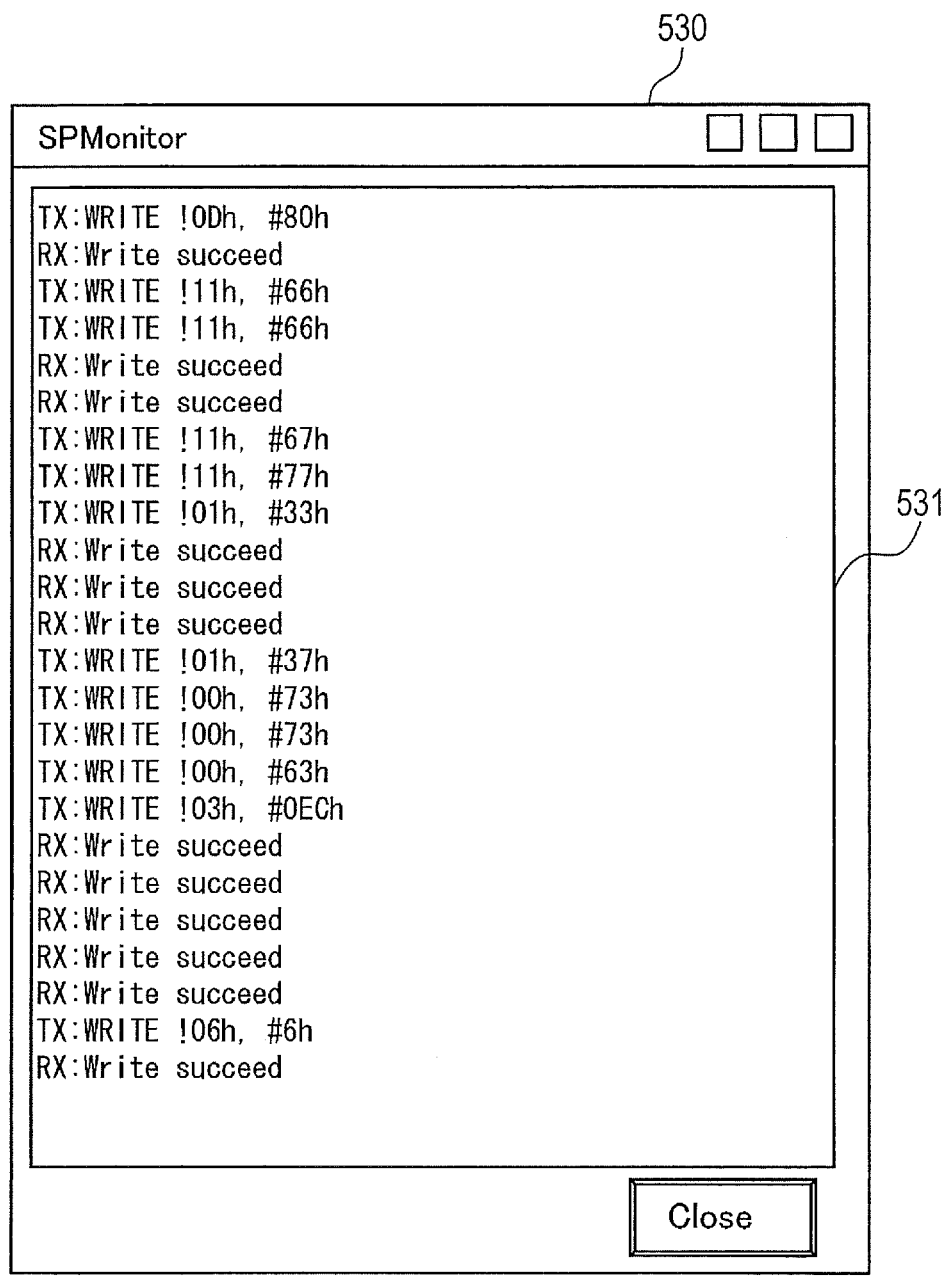
FIG. 43 is a display image diagram of the GUI used in the setting evaluation of the semiconductor device according to the first embodiment of the present invention.

FIG. 43 shows a display example of the SPMonitor window displayed at S214 of FIG. 31. As shown in FIG. 43, in the SPMonitor window 530, the SPI monitor information is displayed in the monitor display area 531.

Transmit (TX) data and receive (RX) data are displayed in the monitor display area 531 as communications data of the SPI. As the transmit data, for example, WRITE, a register address, and the register data are displayed. A write success/failure is displayed as the receive data. Moreover, the register data that were read are also displayed. Each time communication is performed through the SPI interface, monitor data is displayed one by one in the monitor display area 531.

The following effects are attained by this embodiment that was explained above. First, miniaturization and low power consumption can be attained. In this embodiment, since the semiconductor device 1 is configured to include the MCU circuit and the AFE circuit inside it, miniaturization is possible as compared with the case where multiple analog circuit ICs are mounted over a mounting substrate. Moreover, since a power supply of the AFE unit can be turned OFF to set the MCU unit to be in the sleep mode corresponding to a low power consumption mode, it is possible to reduce power consumption.

Moreover, a development process of an analog IC can be shortened. In order to develop an analog circuit suited to a sensor, since processes of circuitry design, mask design, mask manufacture, and sample manufacture become needed usually, it may take three to eight months. In this embodiment, since the analog circuit corresponding to the sensor can be formed only by changing a setting of the semiconductor device, it is possible to develop the semiconductor device without conducting the development processes of the circuitry design to the sample manufacture. Therefore, a sensor system can be developed in a short period of time, and can be put in the market timely in an early stage.

Moreover, it makes it possible to easily develop the semiconductor device. In this embodiment, since a configuration and a characteristic of the analog circuit corresponding to the sensor are set up through the GUI, it is possible to perform the setting and evaluation (system verification) easily. Since the configuration and characteristic can be intuitively set up with the GUI and the setting and evaluation can be performed simultaneously, it is possible to perform the development in a further shorter period of time.

Moreover, the same semiconductor device can support multiple application systems. In this embodiment, since the circuit configuration was made able to be changed freely, various sensors, such as the current-based sensor and the voltage-based sensor, can be coupled to the single semiconductor device. Since it is not necessary to develop a separate semiconductor device for each sensor, a development period can be shortened.

Second Embodiment of Present Invention

Figure 44:
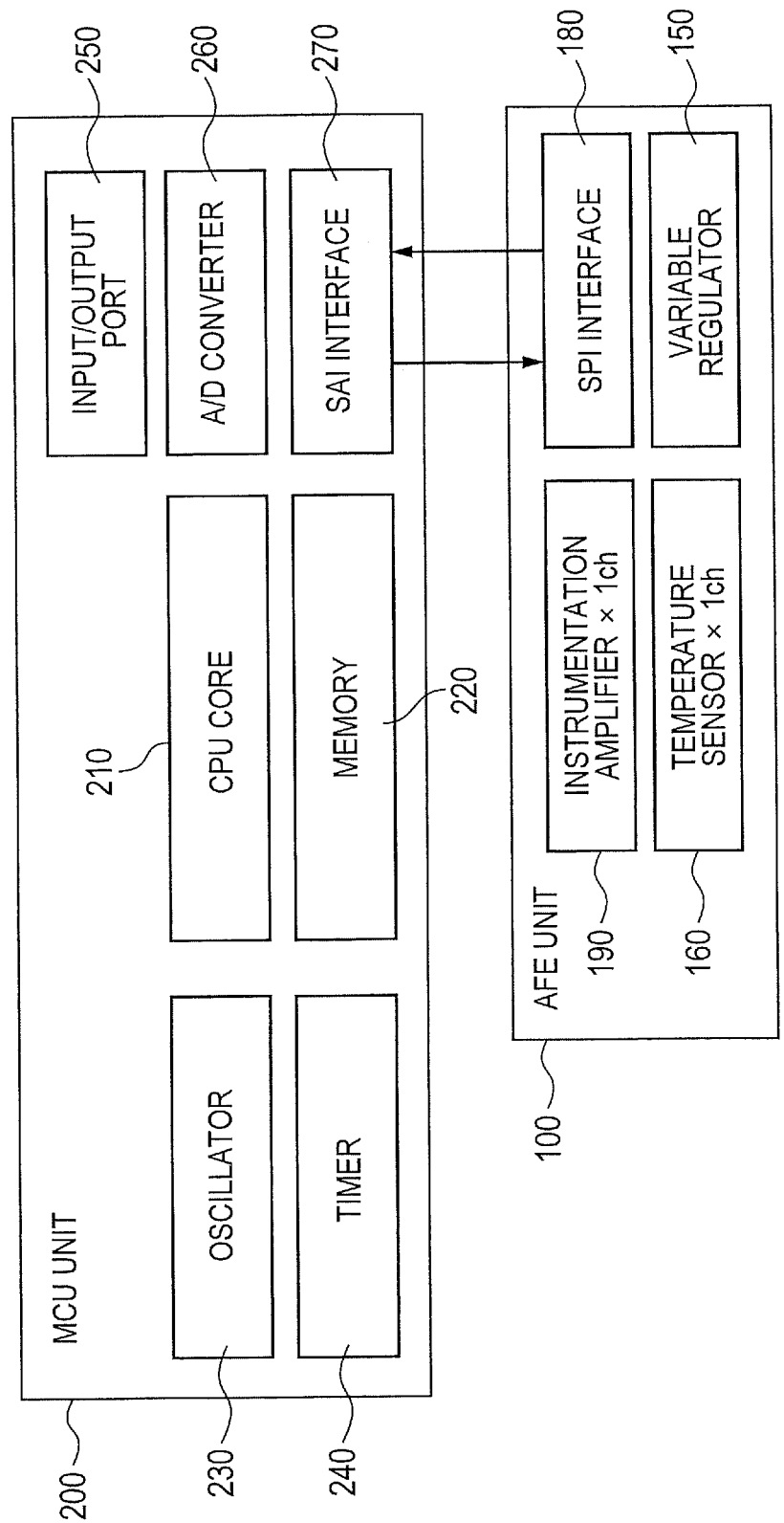
FIG. 44 is a circuit block diagram of a semiconductor device according to a second embodiment of the present invention.

Hereinafter, a second embodiment of the present invention will be described with reference to drawings. FIG. 44 shows a circuit block of the semiconductor device 1 according to this embodiment.

The semiconductor device according to the first embodiment was specified to be for a use of a general purpose system and was configured to surely have the AFE circuits that were needed by many sensors. On the other hand, in the semiconductor device according to this embodiment, it is specified to be for a use of a common measuring instrument and is configured to be limited to the AFE circuit that is needed only for a sensor of the common measuring instrument.

As shown in FIG. 44, in the semiconductor device 1 of this embodiment, a configuration of the MCU unit 200 is the same as that of the first embodiment of FIG. 2, and the AFE unit 100 has an instrumentation amplifier 190, the variable regulator 150, the temperature sensor 160, and the SPI interface 180. Being compared with the semiconductor device of the first embodiment, the semiconductor device 1 is of a configuration that has none of the configurable amplifier, the gain amplifier supporting the synchronous detection, the SC-type low-pass filter, the SC-type high-pass filter, and the general purpose amplifier but has only the instrumentation amplifier instead. The variable regulator 150, the temperature sensor 160, and the SPI interface 180 are the same as those of the first embodiment.

The instrumentation amplifier 190 is an amplifier circuit capable of supporting a sensor of the common measuring instrument and amplifying a weak differential signal. The instrumentation amplifier 190 is the same circuit as the instrumentation amplifier that can be formed by the configurable amplifier 110 of the first embodiment. In the instrumentation amplifier 190, its circuit configuration is fixed and only its characteristic is changeable.

Figure 45:
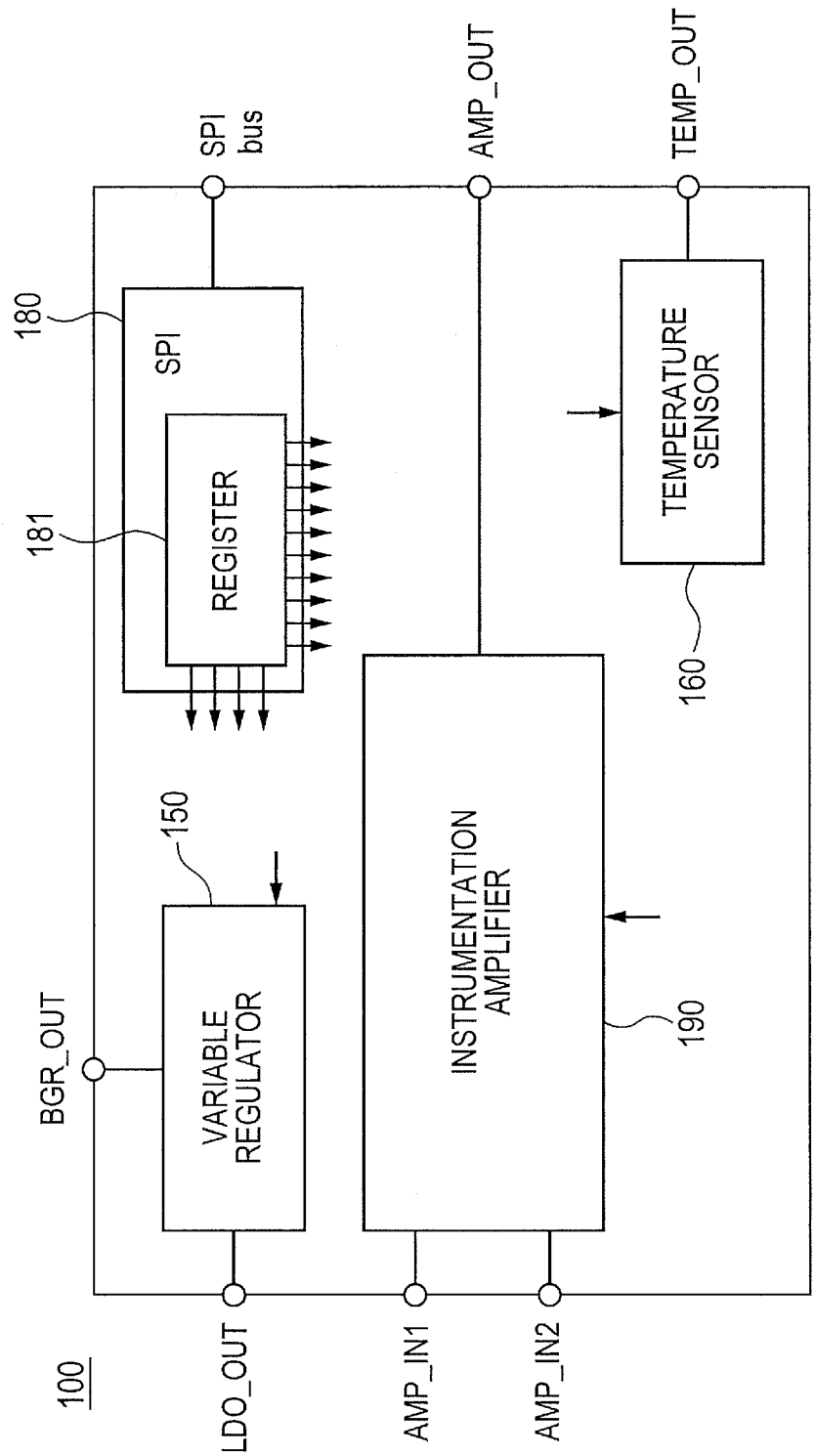
FIG. 45 is a diagram showing a coupling relationship of a circuit of the semiconductor device according to the second embodiment of the present invention.

FIG. 45 shows a coupling relationship of the circuits of the AFE unit 100 according to this embodiment. The variable regulator 150, the temperature sensor 160, and the SPI interface 180 are the same as those of FIG. 3 of the first embodiment.

Since the circuit configuration of the instrumentation amplifier 190 is fixed, it does not have a switch (multiplexer) for switching over the configuration. In the instrumentation amplifier 190, its one input terminal is coupled to AMP_IN1, its other input terminal is coupled to AMP_IN2, and its output terminal is coupled to AMP_OUT. Incidentally, the instrumentation amplifier 190 may have a switch for selecting coupling with multiple external terminals.

Since specific circuit configurations of the circuits in the AFE unit 100 of this embodiment are the same as those of the first embodiment, their explanations are omitted. That is, the circuit configuration of the instrumentation amplifier 190 is a configuration shown in FIG. 14, and the instrumentation amplifier 190 can set up its gain by changing resistance values, as shown in FIG. 14, and can change its operating point, its offset by changing the setting of the DAC.

Thus, the semiconductor device 1 of this embodiment futures that the circuit configuration of the AFE unit 100 is fixed and only its characteristic can be set to be variable. For this reason, a single semiconductor device can support specific sensors having different characteristics and can be used in specific application systems.

For example, as in the case where the instrumentation amplifier is formed in the first embodiment, the semiconductor device 1 is usable in an application system using a pressure sensor, a gyro sensor, a shock sensor, or the like, each of which is a sensor of a weak differential output.

Figure 46:
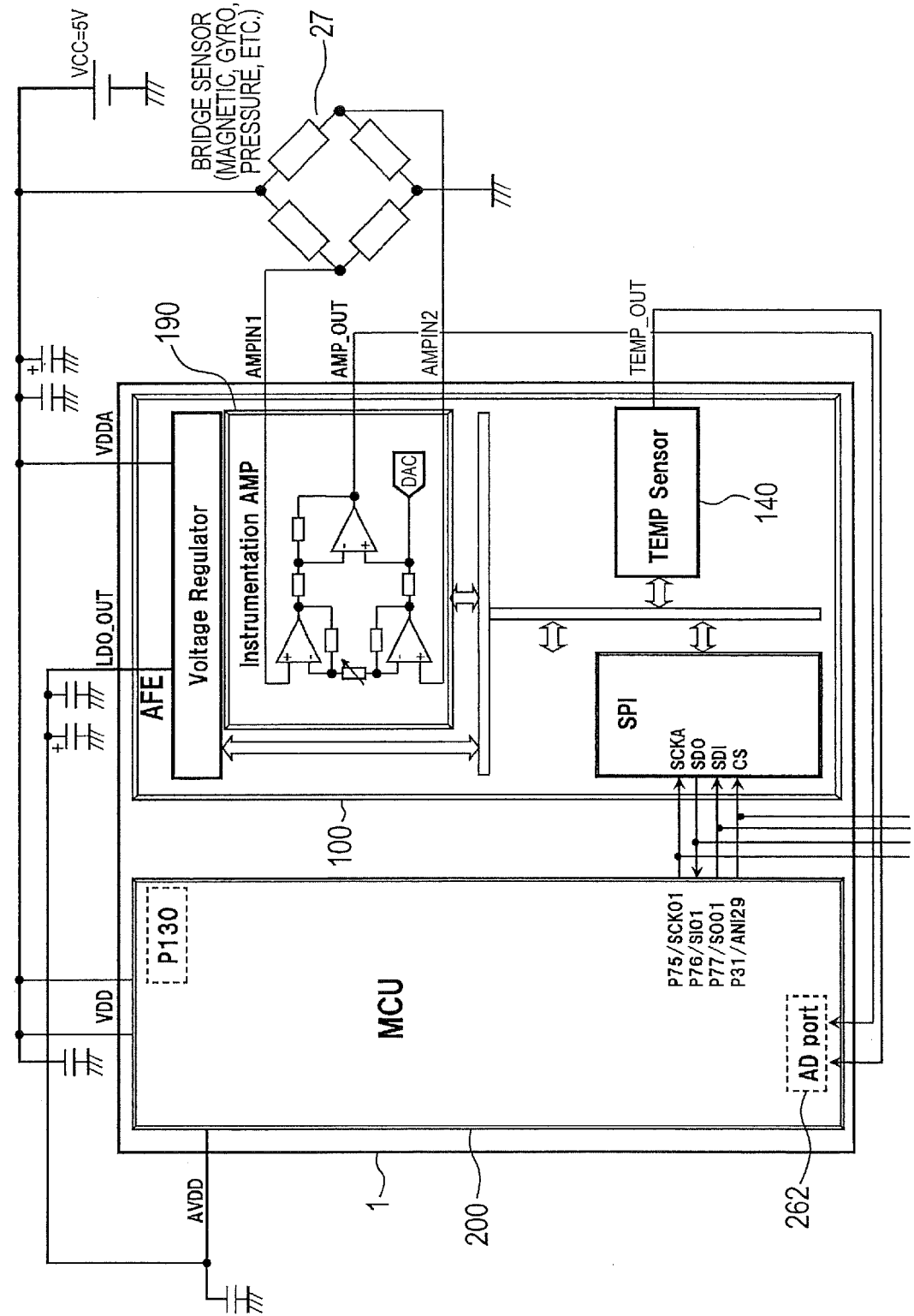
FIG. 46 is a system configuration diagram showing an application example of the semiconductor device according to the second embodiment of the present invention.

FIG. 46 is an example in which a bridge sensor 27, such as a magnetic sensor, a gyro sensor, and a pressure sensor, is coupled to the semiconductor device 1. For example, it is an example applicable to application systems such as a sphygmomanometer, a weighing machine, a smart phone, and a liquid crystal television each of which has the bridge sensor 27.

One output terminal of the bridge sensor 27 is coupled to one input terminal of the instrumentation amplifier 190, the other output terminal of the bridge sensor 27 is coupled to the other input terminal of the instrumentation amplifier 190, and an output terminal of the instrumentation amplifier 190 is coupled to the AD port 262 of the MCU unit 200. Then, it can be implemented to have a circuit characteristic optimal to the bridge sensor 27 by setting up a gain and an offset of the instrumentation amplifier 190 according to the characteristic of the bridge sensor 27.

Incidentally, the output of the temperature sensor 160 is coupled to the AD port 262 of the MCU unit 200, and the output of the variable regulator 150 is coupled to the power supply input of the A/D converter 260 of the MCU unit 200.

Moreover, although the configuration and operation of the setting evaluation system of the semiconductor device 1 according to this embodiment are fundamentally the same as those of the first embodiment, since the configuration of the semiconductor device 1 is different, only the GUI for setting up the AFE unit 100 of the semiconductor device 1 is different.

Figure 47:
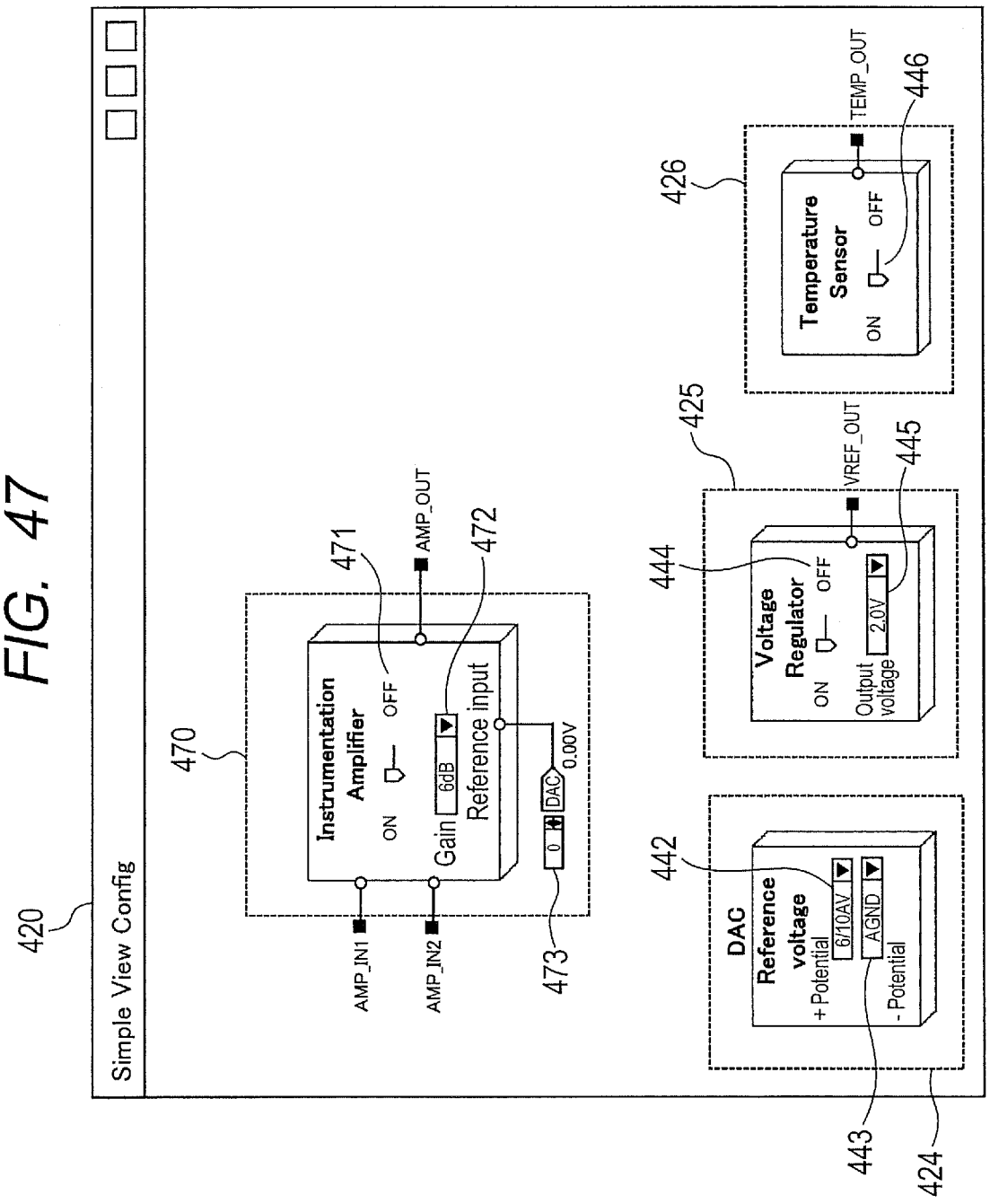
FIG. 47 is a display image diagram of a GUI used in the setting evaluation of the semiconductor device according to the second embodiment of the present invention.

FIG. 47 is a display example of the SimpleViewConfig window that is the GUI according to this embodiment. The SimpleViewConfig window 420 is a window for setting up the AFE unit 100 of the semiconductor device 1, and corresponds to the configuration of the AFE unit 100 like FIG. 33 of the first embodiment.

That is, the SimpleViewConfig window 420 has an instrumentation amplifier setting area 470 in which a setting of the instrumentation amplifier 190 is performed according to a configuration of the AFE unit 100, the DAC reference voltage setting area 424 in which a setting of the reference voltage of the DAC coupled to each operational amplifier is performed, the variable regulator setting area 425 in which the setting of the variable regulator 150 is performed, and the temperature sensor setting area 426 in which the setting of the temperature sensor 160 is performed. The DAC reference voltage setting area 424, the variable regulator setting area 425, and the temperature sensor setting area 426 are the same as those of FIG. 33.

The same setting as the case where the instrumentation amplifier is selected in the configurable amplifier of the first embodiment is possible in the instrumentation amplifier setting area 470. That is, power ON/OFF of the instrumentation amplifier is set with an "ON/OFF" slide switch 471, the gain of the instrumentation amplifier is set with a "Gain" pull-down menu 472, and an output voltage of the 8-bit DAC is set with a "DAC" input box 473.

Incidentally, also in this embodiment, it is possible to display an actual circuit configuration, as in FIG. 36 and FIG. 38, and to set it up in detail.

As was explained above, in this embodiment, first, it is possible to easily develop the semiconductor device and to shorten the development process like the first embodiment. Furthermore, in this embodiment, the semiconductor device is decided to be for a common measuring instrument, and to include only the instrumentation amplifier that become necessary for the common measuring instrument. For this reason, since the semiconductor device does not have unnecessary circuits, the circuit configuration becomes simple. In addition, the miniaturization of the semiconductor device can be attained, and the low power consumption is also possible.

Third Embodiment of Present Invention

Figure 48:
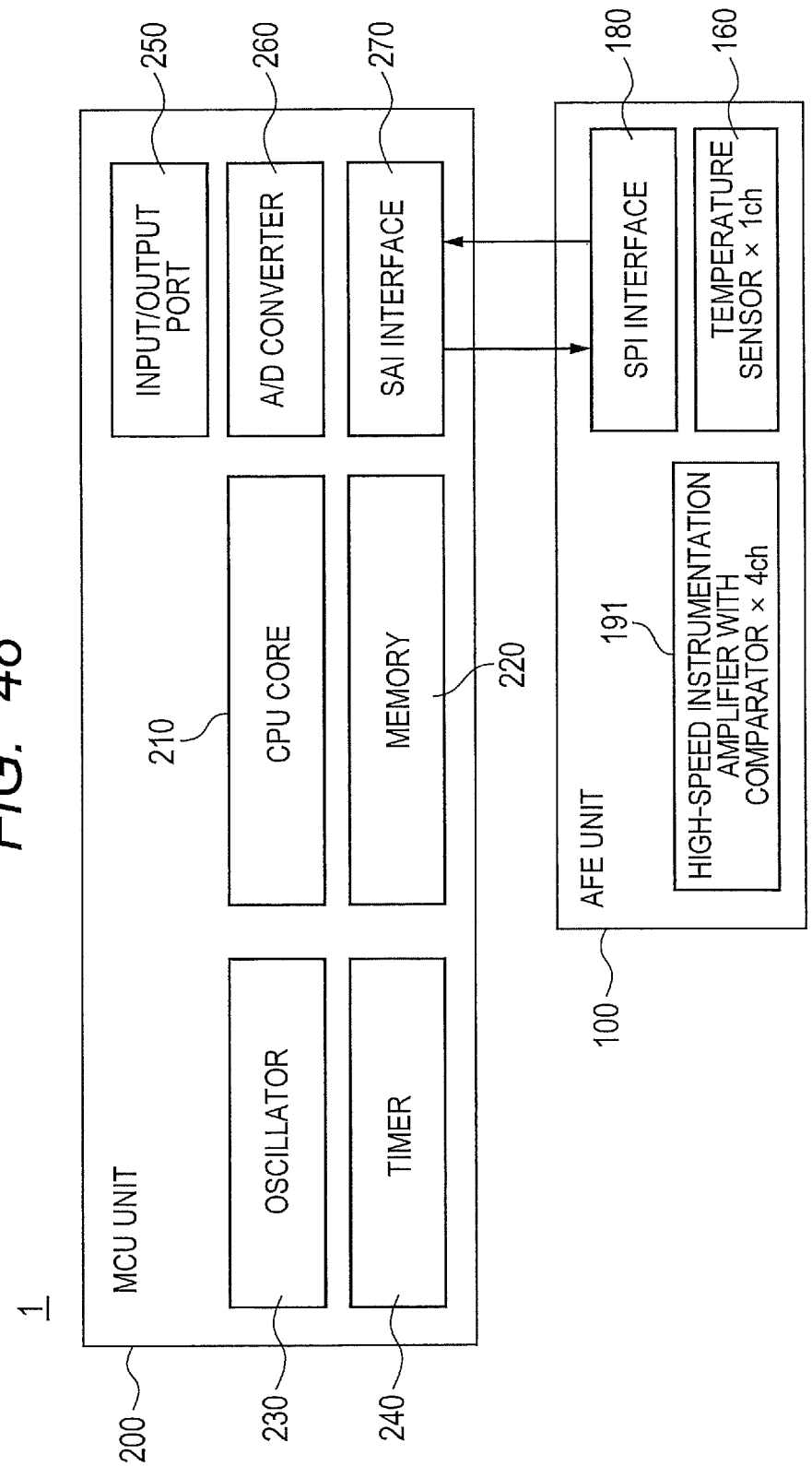
FIG. 48 is a circuit block diagram of a semiconductor device according to a third embodiment of the present invention.

Hereinafter, a third embodiment of the present invention will be described with reference to drawings. FIG. 48 shows a circuit block of the semiconductor device 1 according to this embodiment.

In the semiconductor device according to the first embodiment, it was configured to have a use for the general purpose system and to include all AFE circuits that become necessary for many sensors. On the other hand, in the semiconductor device according to this embodiment, it is configured to have a use for motor control and to include a limited AFE circuit that becomes necessary only in the motor control.

As shown in FIG. 48, the semiconductor device 1 of this embodiment is the same as the first embodiment of FIG. 2 in the configuration of the MCU unit 200, and its AFE unit 100 has a high-speed instrumentation amplifier 191 with a built-in comparator, the temperature sensor 160, and the SPI interface 180. As compared with the first embodiment, the semiconductor device 1 is configured to have none of the configurable amplifier, the gain amplifier supporting the synchronous detection, the SC-type low-pass filter, the SC-type high-pass filter, the general purpose amplifier, and the variable regulator, but to have only the high-speed instrumentation amplifier 191 with a built-in comparator instead. The temperature sensor 160 and the SPI interface 180 are the same as those of the first embodiment.

The high-speed instrumentation amplifier 191 with a built-in comparator (also called a high-speed instrumentation amplifier) is an amplifier capable of amplifying a weak differential signal at high speed corresponding to the motor control, and contains further a comparator for making comparison of the output voltage. In order to make possible a control of a polyphase motor, the AFE unit has two or more (multiple channels) high-speed instrumentation amplifiers 191. Here, it has four (four channels) instrumentation amplifiers. In the high-speed instrumentation amplifier 191, its circuit configuration is fixed and only its characteristic is changeable.

Figure 49:
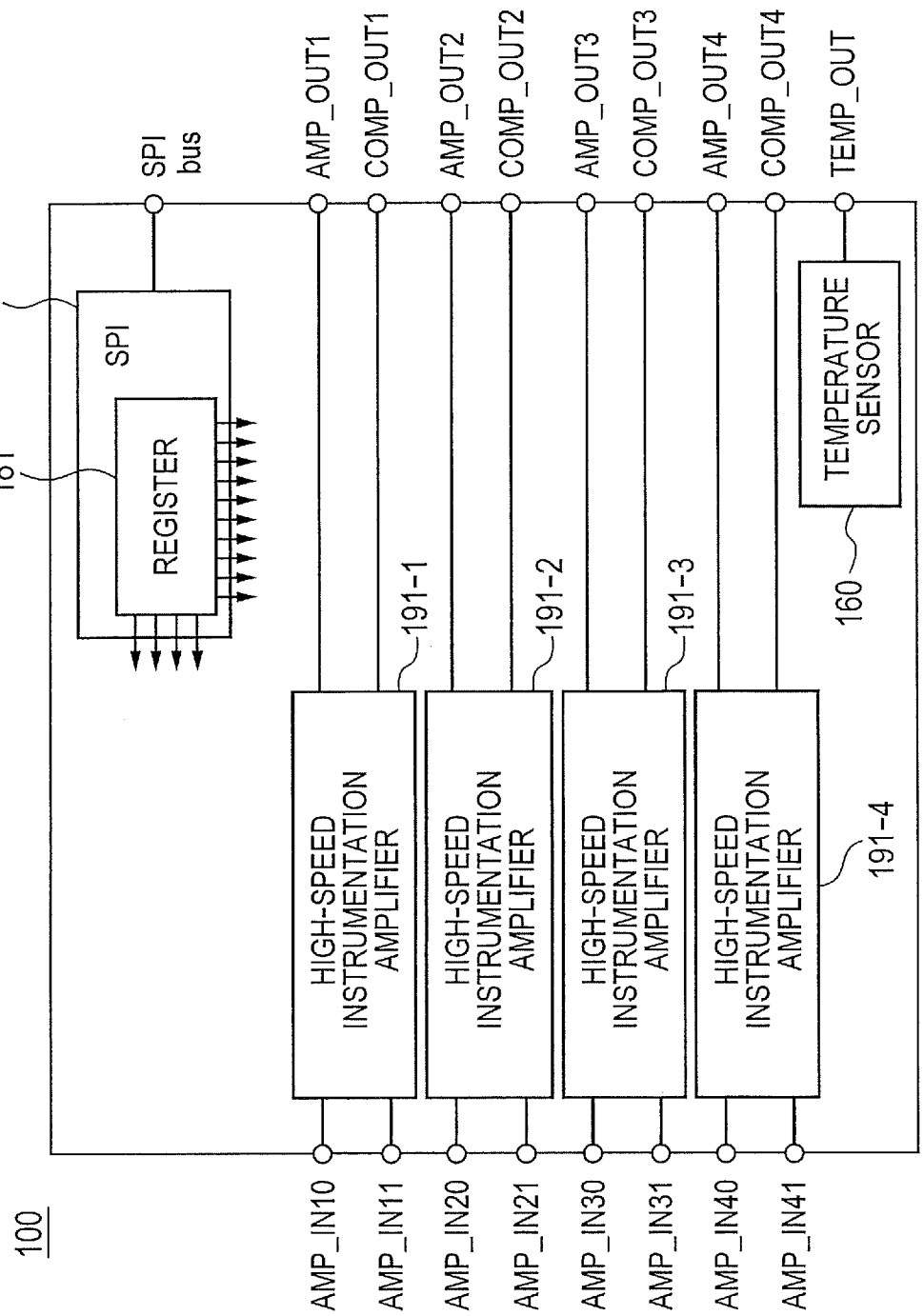
FIG. 49 is a diagram showing a coupling relationship of a circuit of the semiconductor device according to the third embodiment of the present invention.

FIG. 49 shows a coupling relationship of the circuits of the AFE unit 100 according to this embodiment. The temperature sensor 160 and the SPI interface 180 are the same as those of the first embodiment of FIG. 3.

Since the circuit configuration is fixed in the high-speed instrumentation amplifier 191, it does not have a switch (multiplexer) for switching over the configuration. The four high-speed instrumentation amplifiers 191-1 to 191-4 have different independent configurations.

That is, in the high-speed instrumentation amplifiers 191-1 to 191-4, respective one input terminals are coupled to AMPIN10, -20, -30, and -40, respectively, respective other input terminals are coupled to AMPIN11, -21, -31, and -41, respectively, output terminals of the amplifiers are coupled to AMP_OUT1 to 4, respectively, and output terminals of the comparators are coupled to COMP_OUT1 to 4, respectively. Incidentally, a switch for selecting couplings with multiple external terminals may be provided.

Figure 50:
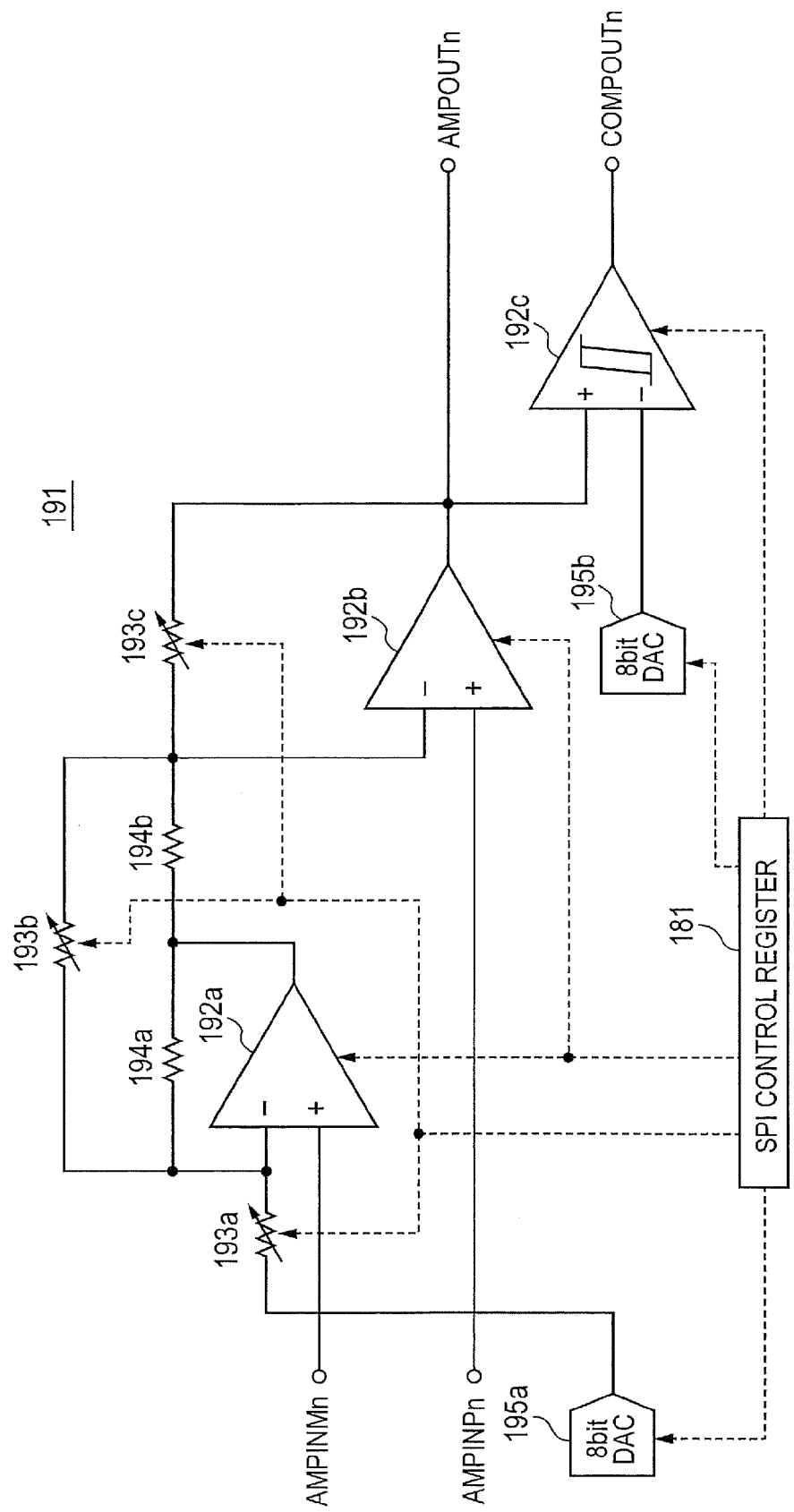
FIG. 50 is a circuit diagram showing a circuit configuration of the semiconductor device according to the third embodiment of the present invention.

FIG. 50 shows a specific circuit configuration of the high-speed instrumentation amplifier 191. The high-speed instrumentation amplifier 191 is a high-speed instrumentation amplifier for motor control with a built-in comparator, and performs amplification of an output of the sensor used for motor control and voltage comparison. As a change of the characteristic, the high-speed instrumentation amplifier 191 can set the gain to be variable. For example, the gain can be set up to 10 dB to 34 dB in increments of 2 dB. Moreover, the slew rate can also be set to be variable and ON/OFF of the power supply can be switched over by the power-off mode.

Moreover, the high-speed instrumentation amplifier 191 has a built-in comparator for comparison of an output of the high-speed instrumentation amplifier, and a hysteresis voltage and a reference voltage of this comparator are variable.

As shown in FIG. 50, the high-speed instrumentation amplifier 191 has operational amplifiers 192$a$, 192$b$ operating as instrumentation amplifiers, and an operational amplifier 192$c$ operating as a hysteresis comparator, and has variable resistances 193$a$ to 193$c$ coupled to the operational amplifiers 192$a$ to 192$c$, fixed resistances 194$a$ to 194$b$, and DACs 195$a$, 195$b$.

By changing resistance values of the variable resistances 193$a$ to 193$c$ and a setting of the DAC 195$a$ depending on the setting value of the register 181, a gain, an operating point, and an offset of the high-speed instrumentation amplifier 191 can be changed. Moreover, by a setting of the DAC 195$b$, the hysteresis voltage (reference voltage) of the comparator can be changed. Furthermore, depending on the setting value of the register 181, ON/OFF of a power supply of the operational amplifiers 192$a$ to 192$c$ is controllable.

In the high-speed instrumentation amplifier 191, when a differential signal is inputted from external input terminals AMPINMn and AMPINPn (corresponding to AMPIN10, -11 to AMPIN40, -41), the signal that is non-inverting amplified at high speed by a two-stage instrumentation amplifier comprised of the operational amplifiers 192$a$, 192$b$ is outputted to AMPOUTn (corresponding to AMPOUT1 to AMPOUT4). Furthermore, a comparison signal obtained by a comparison of an output signal of the AMPOUTn and the reference voltage that is performed by the hysteresis comparator comprised of the operational amplifier 192$c$ is outputted. Incidentally, the MCU unit 200 performs a motor control according to the signals of the AMPOUTn and COMPOUTn.

In this way, the semiconductor device 1 of this embodiment is such that the circuit configuration of the AFE unit 100 is fixed and only the characteristic can be set to be variable. For this reason, a single semiconductor device can support a specification of a specific sensor whose characteristic is different from other sensors and thereby can be used in a specific application system. In particular, it is couplable to a drive circuit of the polyphase motor.

Figure 51:
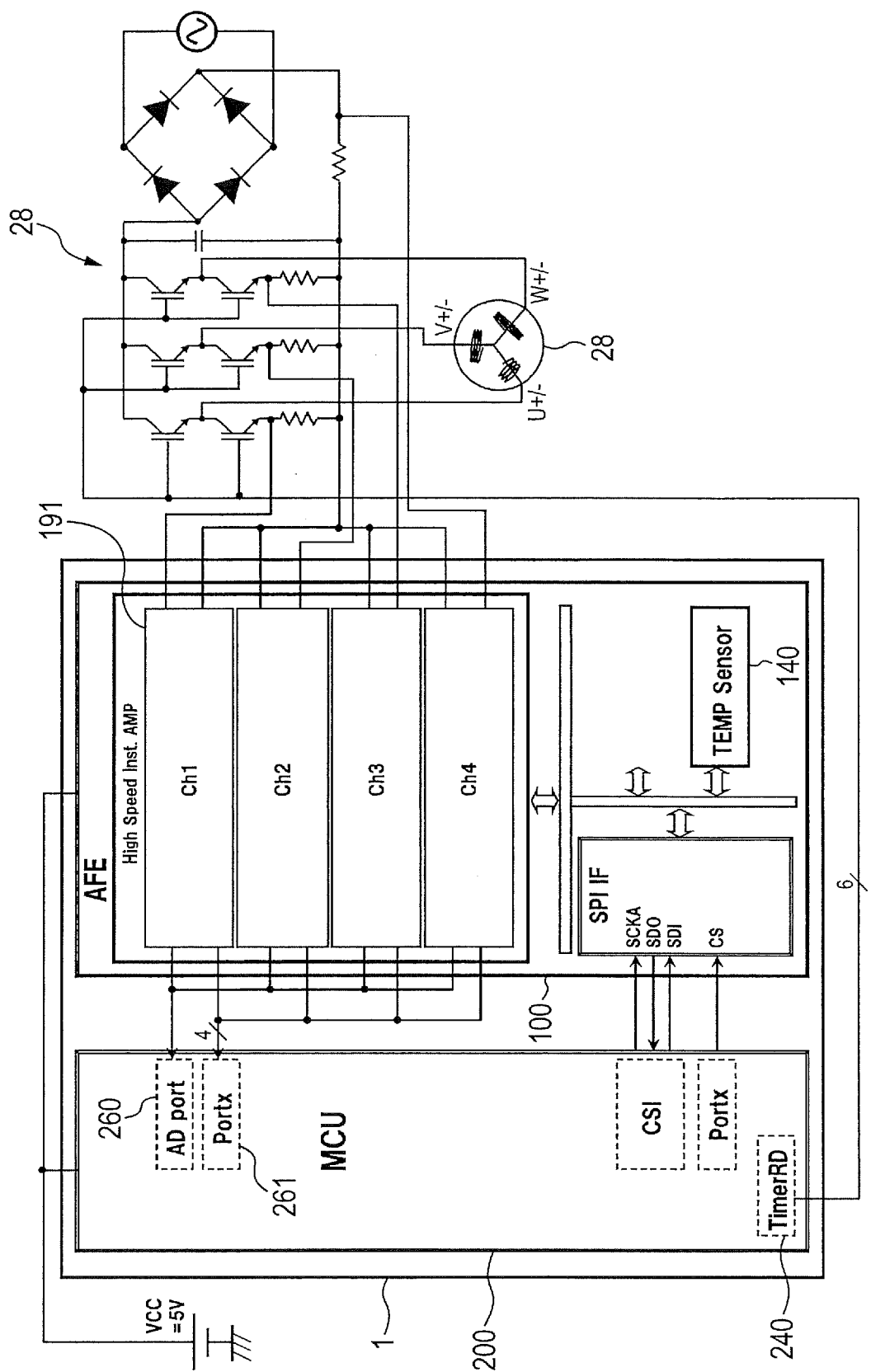
FIG. 51 is a system configuration diagram showing an application example of the semiconductor device according to the third embodiment of the present invention.

FIG. 51 shows an example in which a brushless motor 28 is coupled to the semiconductor device 1. It is an example in which the semiconductor device 1 is applicable to application systems, such as an air conditioner, a washing machine, a refrigerator, and a robot each of which has the brushless motor 28.

Each input terminal of each high-speed instrumentation amplifier 191 is coupled to a drive circuit 29 of the brushless motor 28, an output terminal of each amplifier of each high-speed instrumentation amplifier 191 is coupled to the AD port 262 of the MCU unit 200, and an output terminal of each comparator of each high-speed instrumentation amplifier 191 is coupled to a control port 261 of the MCU unit 200. Then, by setting the gain and offset of the high-speed instrumentation amplifier 191 and the reference voltage of the comparator according to characteristics of the brushless motor 28 and the drive circuit 29, the semiconductor device 1 can be made to have a circuit characteristic optimal to the brushless motor 28. In this example, the timer 240 of the MCU unit 200 is coupled to the drive circuit 29, and the brushless motor 28 is driven in response to a clock pulse of the timer 240. Then, each signal of the drive circuit 29 for driving the polyphase brushless motor 28 is amplified and compared by the high-speed instrumentation amplifier 191, and the MCU unit 200 performs a drive control of the brushless motor 28.

Moreover, although the configuration and the operation of the setting evaluation system of the semiconductor device 1 according to this embodiment are fundamentally the same as those of the first embodiment, since the configuration of the semiconductor device 1 is different, only the GUI for setting up the AFE unit 100 of the semiconductor device 1 is different.

Figure 52:
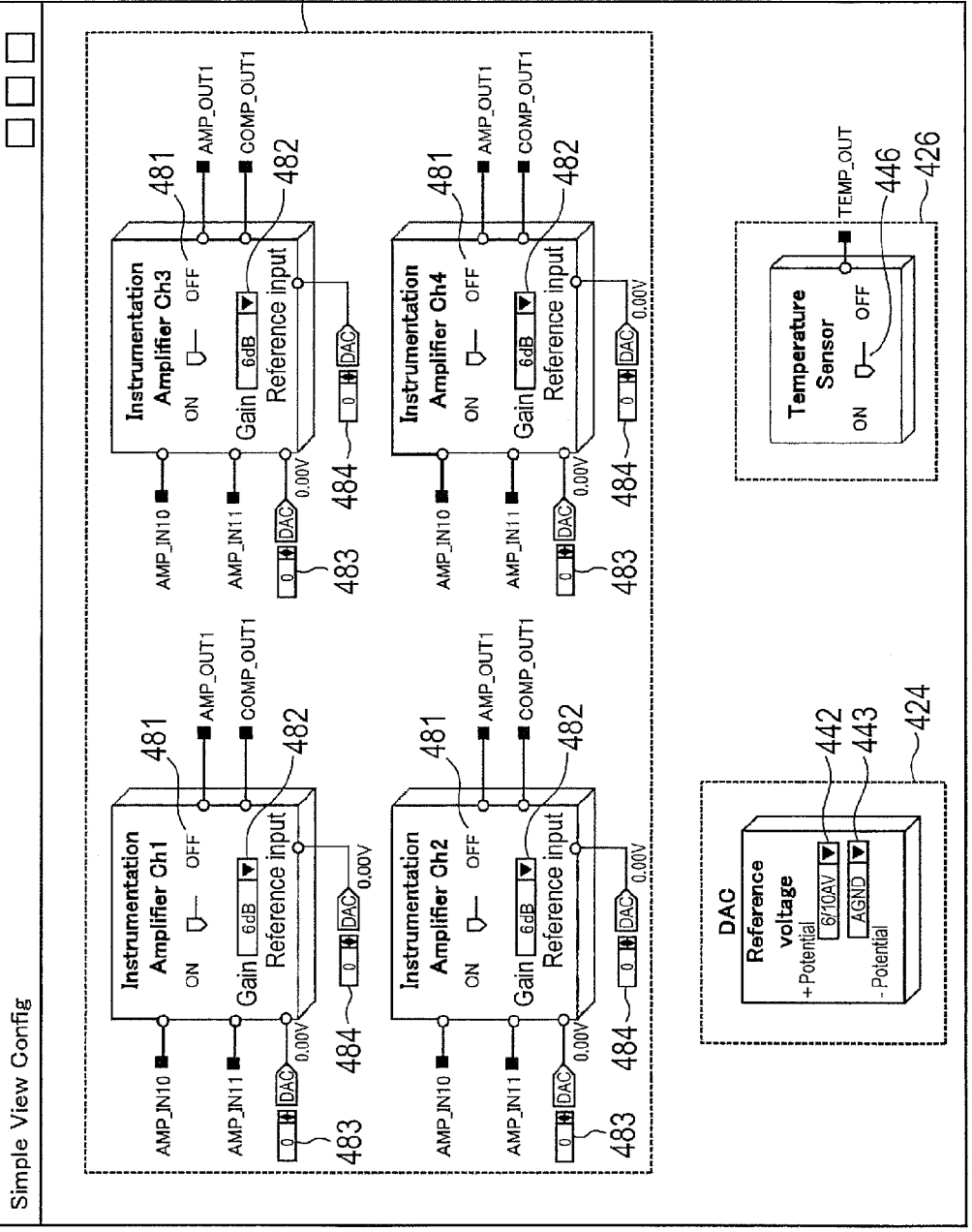
FIG. 52 is a display image diagram of a GUI used in the setting evaluation of the semiconductor device according to the third embodiment of the present invention.

FIG. 52 shows a display example of the SimpleViewConfig window that is a GUI according to this embodiment. The SimpleViewConfig window 420 is a window for setting up the AFE unit 100 of the semiconductor device 1, and corresponds to the configuration of the AFE unit 100 similarly with FIG. 33 of the first embodiment.

That is, the SimpleViewConfig window 420 has a high-speed instrumentation amplifier setting area 480 for setting up the high-speed instrumentation amplifier 191 according to the configuration of the AFE unit 100, the DAC reference voltage setting area 424 for setting the reference voltage of the DAC coupled to each operational amplifier, and the temperature sensor setting area 426 for setting up the temperature sensor 160. The DAC reference voltage setting area 424 and the temperature sensor setting area 426 are the same as those of FIG. 33.

In the high-speed instrumentation amplifier setting area 480, the high-speed instrumentation amplifier of four channels can be set up so as to be able to support the high-speed instrumentation amplifier 191. In setting up the high-speed instrumentation amplifier of each channel, like the configurable amplifier and the gain amplifier of the first embodiment, power ON/OFF of the high-speed instrumentation amplifier is set by an "ON/OFF" slide switch 481, a gain of the high-speed instrumentation amplifier is set with a "Gain" pull-down menu 482, and the output voltage of the 8-bit DAC is set with "DAC" input boxes 483, 484. Offset of the high-speed instrumentation amplifier can be set with the "DAC" input box 483, and the reference voltage of the comparator can be set with the "DAC" input box 484.

Incidentally, also in this embodiment, it is possible to display an actual circuit configuration, as in FIG. 36 and FIG. 38, and to set it up in detail.

As described above, in this embodiment, first, it is possible to easily develop the semiconductor device and to shorten the development process like the first embodiment. Furthermore, in this embodiment, the semiconductor device is decided to be for motor control and it shall have only a high-speed instrumentation amplifier that become necessary for the motor control. Because of this, it does not have an unnecessary circuit in the semiconductor device, therefore the circuit configuration becomes simple, in addition, the miniaturization of the semiconductor device can be attained, and the low power consumption is also possible.

Fourth Embodiment of Present Invention

Hereinafter, a fourth embodiment of the present invention will be described with reference to drawings. In the embodiments described above, the setting and evaluation of the AFE unit 100 of the semiconductor device 1 were mainly performed by the design evaluation apparatus 3. In this embodiment, in addition to the setting and evaluation of the AFE unit 100, a development and debugging of software (program) of the MCU unit 200 are performed.

Figure 53:
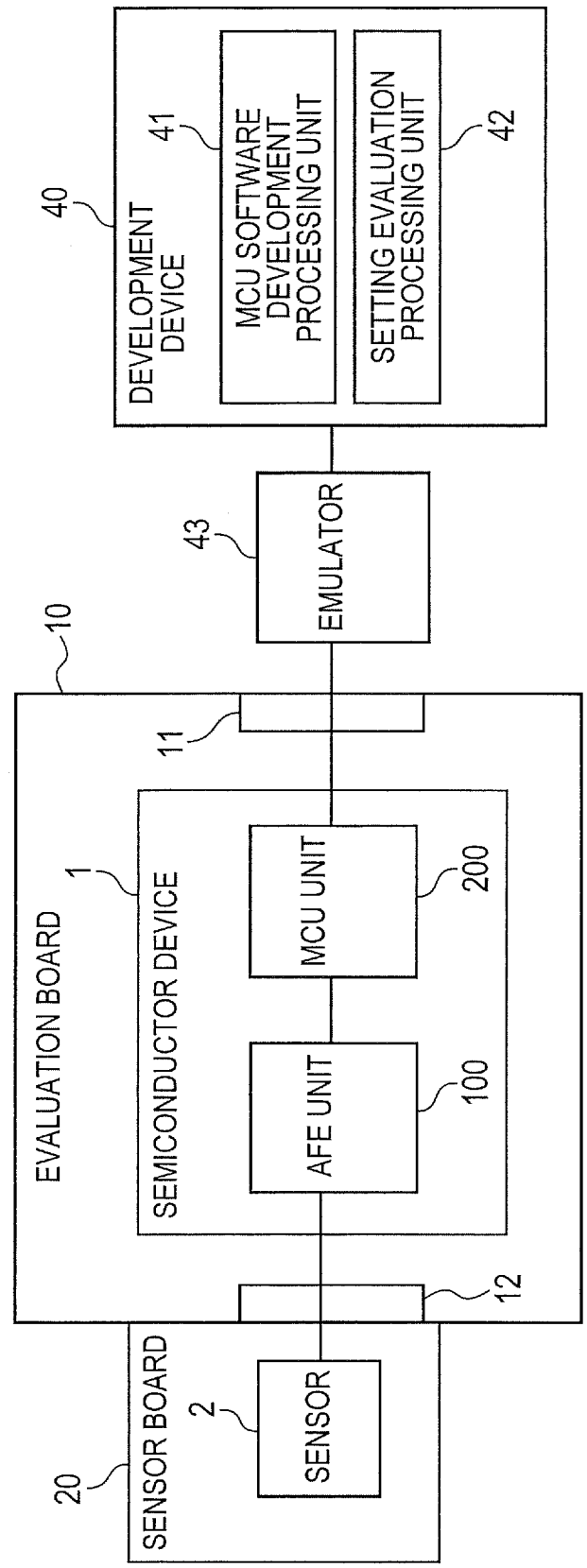
FIG. 53 is a block diagram of a development system containing a semiconductor device according to a fourth embodiment of the present invention.

FIG. 53 shows a configuration of a development system (development support system) of the semiconductor device according to this embodiment. This development system has the evaluation board 10 that carries the semiconductor device 1 of the present invention, and a sensor board that carries the sensor 2, like FIG. 27, and further includes a development device 40 and an emulator 43.

The development device (development support device) 40 is an integrated development device for developing both the AFE unit 100 and the MCU unit 200 of the semiconductor device 1, and has an MCU software development processing unit 41 and a setting evaluation processing unit 42. The development device 40 is a computer apparatus comprised of the same hardware as that of FIG. 28, and functions of the MCU software development processing unit 41 and the setting evaluation processing unit 42 are realized by the CPU executing a program of performing an MCU software development processing and the setting evaluation processing.

The setting evaluation processing unit 42 has the same function as the setting evaluation device of the first embodiment, and performs setting and evaluation of the AFE unit 100 of the semiconductor device 1. That is, the setting evaluation processing unit 42 has the same configuration and performs the same operation as those of FIG. 29 and FIG. 31 and enables the setting and evaluation of the AFE unit 100 through the GUI.

The MCU software development processing unit 41 performs a processing for development of the software performed by the CPU core of the MCU unit 200 of the semiconductor device 1. That is, the MCU software development processing unit 41 is a software development support tool for microcomputers such as the MCU unit 200, and has an environment and a device driver that perform coding and building corresponding to the MCU unit 200. In particular, in this embodiment, it cooperates with the setting evaluation processing unit 42 to generate a program containing the information of the register 181 of the AFE unit 100 that the setting evaluation processing unit 42 generates.

The emulator 43 is coupled to the MCU unit 200 of the semiconductor device 1, and emulates the MCU unit 200. By being coupled to the emulator 43, the MCU software development processing unit 41 can debug and make a writing of the program.

Figure 54:
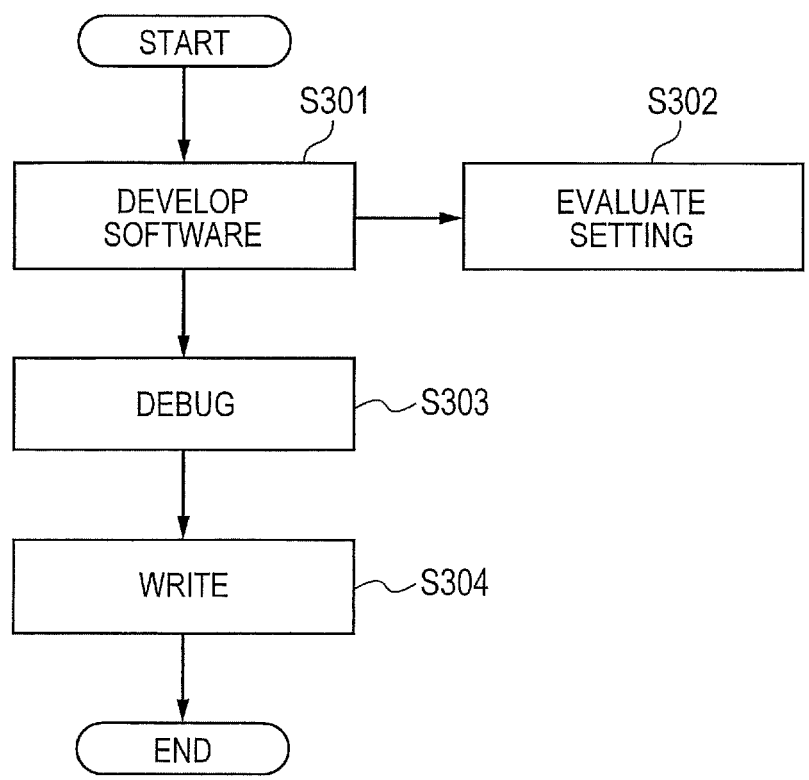
FIG. 54 is a flowchart showing a development method of the semiconductor device according to the fourth embodiment of the present invention.
Figure 55:
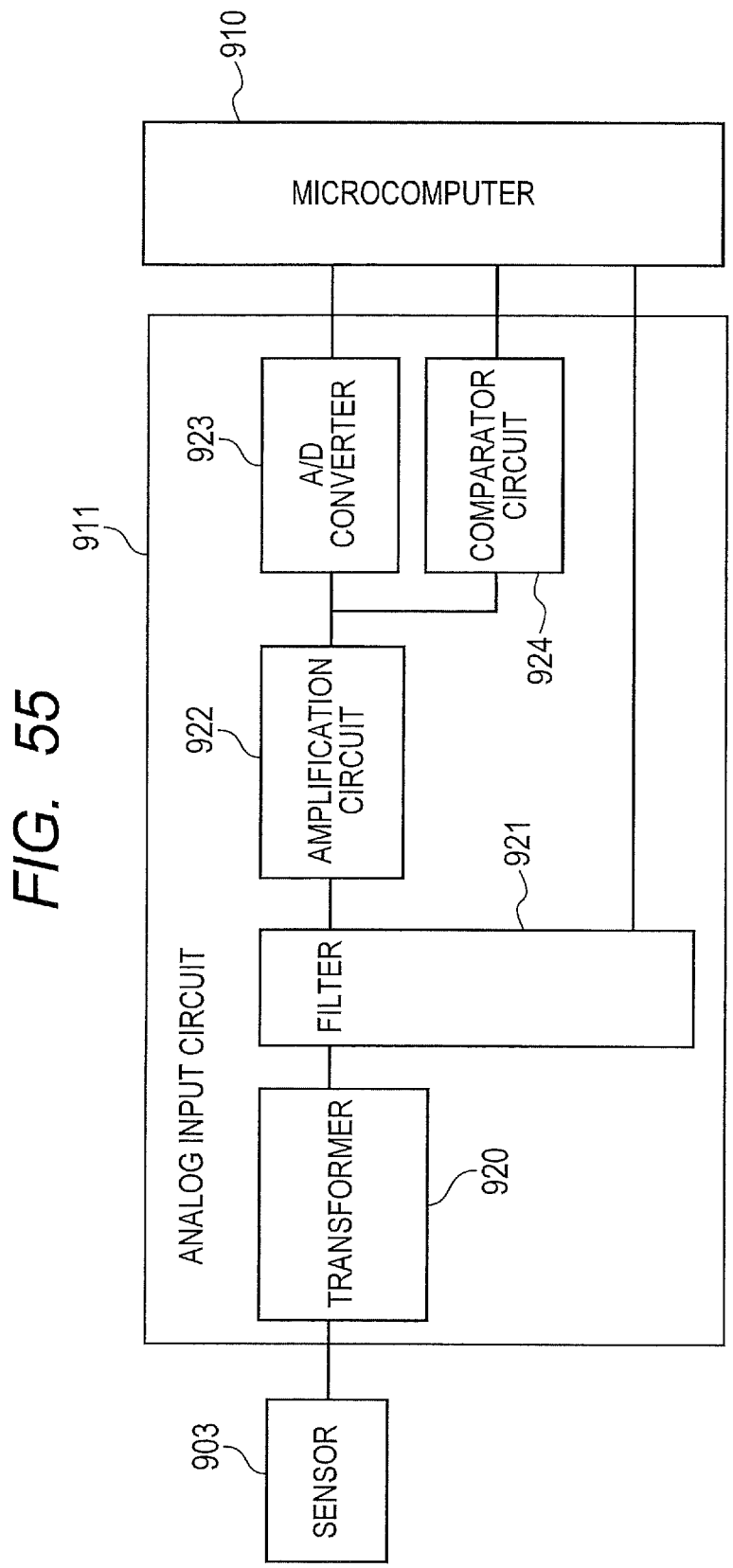
FIG. 55 is a block diagram showing a circuit configuration of a conventional technology.

FIG. 54 shows a development method of the semiconductor device 1 according to this embodiment. First, the development device 40 develops software of the MCU unit 200 of the semiconductor device 1 (S301) and performs setting evaluation of the AFE unit 100 of the semiconductor device 1 (S302).

That is, the MCU software development processing unit 41 generates a program to be run in the MCU unit 200 according to an input from the user, and simultaneously the setting evaluation processing unit 42 generates the information of the register 181 of the AFE unit 100 by an operation of the user through the GUI. Then, the MCU software development processing unit 41 generates a source code that is coded by the user and a source code including information that is generated by the setting evaluation processing unit 42 and is to be set up in the register 181 of the AFE unit 100. For example, in a program in which the MCU unit 200 performs a processing of dynamically rewriting the register 181, the source code includes information that is directly written in the register 181.

Next, the development device 40 debugs the generated program (S303). That is, the MCU software development processing unit 41 debugs the source code including the information of the register 181 by using the emulator 43. For example, it debugs including a writing processing in the register 181 by the MCU unit 200

Next, the development device 40 writes the debugged program in the semiconductor device 1 (S304). That is, the MCU software development processing unit 41 writes the program that was generated and has been completed in debugging in memory of the MCU unit of the semiconductor device 1 by using the emulator 43. Thereby, a development (manufacture)

of the semiconductor device 1 including the MCU unit 200 and the AFE unit 100 is completed.

After that, when the semiconductor device 1 is activated, while the CPU core of the MCU unit 200 executes the program written in the memory and also writes in the register 181 the information of the register 181 written in the memory. Then, the register 181 sets up the configuration and the characteristic of the AFE unit 100, and the AFE unit 100 starts its operation.

Thus, in this embodiment, it is decided that in addition to a setting evaluation tool of the AFE unit of the semiconductor device, a development of the MCU unit shall be done in cooperation with an environment of software development of the MCU unit. Thereby, it is possible to perform coding and debugging of the MCU unit and the setting and evaluation of the AFE unit in a single environment, and therefore, it is possible to improve development efficiency and further to shorten the development period.

Incidentally, the present invention is not limited in the above-mentioned embodiments and can be varied appropriately within a range that does not deviate from the gist of the invention. Although what was provided by the invention was the semiconductor device for the common measuring instrument in the second embodiment and was the semiconductor device for motor control in the third embodiment, the semiconductor device may be formed only with necessary circuits as a semiconductor device for an other use. For example, as a semiconductor device for a high-precision measuring instrument, the semiconductor device is configured to contain only a non-inverting amplifier of a low offset and a temperature sensor.

Moreover, the semiconductor device may be configured so that when setting is performed using the GUI, a circuit configuration contained in the AFE unit of the semiconductor device can be recognized automatically and the GUI can be displayed according to the recognized circuit configuration, which may enable the user to perform the setting.

What is claimed is:

1. A development support apparatus for a semiconductor device, said semiconductor device comprising:
   an analog front-end unit for inputting a measurement signal of a sensor; and
   a control unit which performs a control processing according to the measurement signal through the analog front-end unit,
said development support apparatus comprising:
   a GUI display unit that displays a menu to change a circuit configuration and a circuit characteristic of the analog front-end unit;
   a setting information generation unit that generates a setting information to change the circuit configuration and the circuit characteristic of the analog front-end unit based on an operation of the GUI by a user;
   a communication interface configured to communicate with the semiconductor device; and
   a setting unit that sets up the generated setting information in the analog front-end unit through the communication interface.

2. The development support apparatus for a semiconductor device according to claim 1,
   wherein the analog front-end unit comprises a configurable amplifier whose circuit configuration and circuit characteristic are changeable, and
   wherein the GUI display unit displays a configurable amplifier setting area in which the circuit configuration and the circuit characteristic of the configurable amplifier are set up.

3. The development support apparatus for a semiconductor device according to claim 2, wherein the configurable amplifier setting area comprises a plurality of individual amplifier setting units for setting up a plurality of individual amplifiers contained in the configurable amplifier, respectively.

4. The development support apparatus for a semiconductor device according to claim 3,
   wherein the configurable amplifier setting area comprises an entire configuration setting unit for setting up a circuit configuration of a whole of the configurable amplifier by displaying it with a settable range and an entire characteristic setting unit for setting up a circuit characteristic of the whole of the configurable amplifier by displaying it with a settable range, and
   wherein the individual amplifier setting unit comprises an individual configuration setting unit for setting up a circuit configuration of the individual amplifier by displaying it with a settable range and an individual characteristic setting unit for setting up a circuit characteristic of the individual amplifier by displaying it with a settable range.

5. The development support apparatus for a semiconductor device according to claim 4, wherein a coupling relationship of the individual amplifier setting unit is changed and displayed according to a circuit configuration that the user selects in the entire configuration setting unit.

6. The development support apparatus for a semiconductor device according to claim 4, wherein, when an instrumentation amplifier such that one circuit includes all the individual amplifiers is selected, the entire characteristic setting unit is displayed as being settable and both the individual configuration setting unit and the individual characteristic setting unit are displayed as being not settable.

7. The development support apparatus for a semiconductor device according to claim 4, wherein when a circuit configuration of the individual amplifier is selected by the user in the individual configuration setting unit, the setting information generation unit generates the setting information by specifying a coupling configuration of terminals of an operational amplifier contained in the individual amplifier according to the selected circuit configuration.

8. The development support apparatus for a semiconductor device according to claim 4,
   wherein the entire characteristic setting unit sets a gain of the whole of the configurable amplifier, and
   wherein the individual characteristic setting unit sets a gain of the individual amplifier and a reference voltage supplied to the individual amplifier.

9. The development support apparatus for a semiconductor device according to claim 3, wherein the individual amplifier setting unit comprises a power supply setting unit for setting ON/OFF of a power supply of the individual amplifier.

10. The development support apparatus for a semiconductor device according to claim 1,
    wherein the analog front-end unit comprises a gain amplifier whose gain is changeable, and
    wherein the GUI display unit displays a gain amplifier setting area in which a gain of the gain amplifier is set.

11. The development support apparatus for a semiconductor device according to claim 2,
    wherein the analog front-end unit comprises a gain amplifier whose gain is changeable, and
    wherein the GUI display unit displays a gain amplifier setting area in which the gain of the gain amplifier is set, and displays a coupling between the configurable amplifier setting area and the gain amplifier setting area in a switchable manner.

12. The development support apparatus for a semiconductor device according to claim 10, wherein the gain amplifier setting area comprises a power supply setting unit for setting ON/OFF of a power supply of the gain amplifier.

13. The development support apparatus for a semiconductor device according to claim 1,
wherein the analog front-end unit comprises a filter whose cut-off frequency is changeable, and
wherein the GUI display unit displays a filter setting area in which a cut-off frequency of the filter is set.

14. The development support apparatus for a semiconductor device according to claim 11,
wherein the analog front-end unit comprises a filter whose cut-off frequency is changeable, and wherein the GUI display unit displays the configurable amplifier setting area, the gain amplifier setting area, and a coupling of the filter in a switchable manner.

15. The development support apparatus for a semiconductor device according to claim 13,
wherein the filter comprises a low-pass filter and a high-pass filter, and
wherein the filter setting area displays a coupling order of the low-pass filter and the high-pass filter in a settable manner.

16. The development support apparatus for a semiconductor device according to claim 1,
wherein the analog front-end unit comprises a variable regulator that can change its output voltage, and
wherein the GUI display unit displays a variable regulator setting area in which the output voltage of the variable regulator is set.

17. The development support apparatus for a semiconductor device according to claim 16, wherein the variable regulator setting area comprises a power supply setting unit for setting ON/OFF of a power supply of the variable regulator.

18. The development support apparatus for a semiconductor device according to claim 1, wherein the analog front-end unit comprises a temperature sensor whose power supply can be switched over between ON and OFF, and
wherein the GUI display unit displays a temperature sensor setting area in which ON/OFF of the power supply of the temperature sensor is set.

19. The development support apparatus for a semiconductor device according to claim 1,
wherein the analog front-end unit comprises a register in which the setting information is written, and
wherein the GUI display unit acquires setting information written in the register through the communication interface, and displays a register list window for listing the acquired setting information.

20. The development support apparatus for a semiconductor device according to claim 1, wherein the GUI display unit acquires monitor information of an interface between the control unit and the analog front-end unit and displays a monitor information display window for displaying the acquired monitor information.

21. The development support apparatus for a semiconductor device according to claim 1,
wherein the control unit comprises an A/D conversion unit for A/D converting an output signal of the analog front-end unit, and
wherein the GUI display unit acquires result information of A/D conversion from the control unit through the communication interface and displays an A/D conversion information display window for displaying the acquired result information.

22. The development support apparatus for a semiconductor device according to claim 21, wherein in the A/D conversion information display window, the result information is displayed in numerical values or in a graphic form.

23. A development support apparatus of a semiconductor device that has an analog front-end unit for inputting a measurement signal of a sensor and a control unit for performing a control processing according to the measurement signal through the analog front-end unit, the apparatus comprising:
a GUI display unit that displays a menu to change a circuit configuration and a circuit characteristic of the analog front-end unit;
a setting information generation unit that generates a setting information to change the circuit configuration and the circuit characteristic of the analog front-end unit based on an operation of the GUI by a user;
a communication interface configured to communicate with the semiconductor device; and
a setting unit that sets up the generated setting information in the analog front-end unit through the communication interface.

* * * * *